United States Patent
Hasegawa et al.

(10) Patent No.: US 6,831,817 B2
(45) Date of Patent: Dec. 14, 2004

(54) MAGNETIC SENSOR HAVING ADJUSTED SPECIFIC RESISTANCE DISTRIBUTION OF FIRST MAGNETIC LAYER OF FREE MAGNETIC LAYER OF MULTI-LAYERED FERRI-STRUCTURE

(75) Inventors: Naoya Hasegawa, Niigata-ken (JP); Eiji Umetsu, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 117 days.

(21) Appl. No.: 10/267,201

(22) Filed: Oct. 9, 2002

(65) Prior Publication Data

US 2003/0072111 A1 Apr. 17, 2003

(30) Foreign Application Priority Data

Oct. 9, 2001 (JP) .......................................... 2001-311574
Feb. 14, 2002 (JP) .......................................... 2002-036396

(51) Int. Cl.[7] .................................................. G11B 5/39
(52) U.S. Cl. .................................................. 360/324.12
(58) Field of Search .................................... 360/324.12

(56) References Cited

U.S. PATENT DOCUMENTS

| | | | |
|---|---|---|---|
| 5,408,377 A | 4/1995 | Gurney et al. | |
| 5,751,521 A | 5/1998 | Gill | |
| 6,201,673 B1 | 3/2001 | Rottmayer et al. | |
| 6,271,997 B1 * | 8/2001 | Gill | ............................ 360/314 |
| 6,449,134 B1 * | 9/2002 | Beach et al. | ........... 360/324.12 |
| 6,636,398 B2 * | 10/2003 | Sasaki et al. | ........... 360/324.12 |
| 6,693,776 B2 * | 2/2004 | Gill | ....................... 360/324.12 |
| 6,700,757 B2 * | 3/2004 | Pinarbasi | ............... 360/324.12 |

* cited by examiner

*Primary Examiner*—A. J. Heinz
(74) *Attorney, Agent, or Firm*—Brinks Hofer Gilson & Lione

(57) ABSTRACT

A first magnetic layer includes an area which contains an element X (e.g., Cr) and is present in position toward the side of a nonmagnetic intermediate layer from the side near an opposite surface of the first magnetic layer away from an interface between the first magnetic layer and the nonmagnetic intermediate layer, and an area which is partly located in a region from the interface between the first magnetic layer and the nonmagnetic intermediate layer toward the opposite surface of the first magnetic layer and which does not contain the element X. Such an arrangement is able to improve a resistance change rate, to increase a coupling magnetic field based on the RKKY interaction, and to realize satisfactory control of magnetization of a free magnetic layer.

62 Claims, 24 Drawing Sheets

MAGNETIC SENSOR HAVING ADJUSTED SPECIFIC RESISTANCE DISTRIBUTION OF FIRST MAGNETIC LAYER OF FREE MAGNETIC LAYER OF MULTI-LAYERED FERRI-STRUCTURE

BACKGROUND OF THE INVENTION

1. Field of the Invention

The present invention relates to a magnetic sensor mounted in a hard disk drive or the like for reproduction, and more particularly to a magnetic sensor in which a resistance change rate (ΔR/R) can be improved and magnetization control of a free magnetic layer can be satisfactorily performed.

2. Description of the Related Art

FIG. 26 is a partial sectional view of a structure of a conventional magnetic sensor, looking from a side facing a recording medium.

Numeral 14 shown in FIG. 26 denotes a barrier layer made of, e.g., Ta. An antiferromagnetic layer 30 made of, e.g., PtMn is formed on the barrier 14.

A pinned magnetic layer 31 of a magnetic material is formed on the antiferromagnetic layer 30. A nonmagnetic material layer 32 made of, e.g., Cu is formed on the pinned magnetic layer 31, and a free magnetic layer 33 is formed on the nonmagnetic material layer 32. The free magnetic layer 33 is of a multi-layered ferri-structure made up three layers, i.e., magnetic layers 37, 39 and a nonmagnetic intermediate layer 38. Note that, in the following description, the magnetic layer 37 on the side contacting the nonmagnetic material layer 32 is called a second magnetic layer and the magnetic layer 39 in an opposing relation to the second magnetic layer 37 with the nonmagnetic intermediate layer 38 interposed therebetween is called a first magnetic layer.

Further, as shown in FIG. 26, a barrier layer 7 made of, e.g., Ta is formed on the free magnetic layer 33.

A hard bias layer 5 is formed on each of both sides of multilayered films from the buffer layer 14 to the barrier layer 7 in the track-width direction (X-direction (positive and negative) shown in FIG. 26). An electrode layer 8 is formed on the hard bias layer 5.

In the magnetic sensor having such a structure, magnetization of the pinned magnetic layer 31 is fixed in the height direction (Y-direction shown in FIG. 26) by an exchange coupling magnetic field generated between the pinned magnetic layer 31 and the antiferromagnetic layer 30.

On the other hand, the second magnetic layer 37 and the first magnetic layer 39 both constituting the free magnetic layer 33 are magnetized antiparallel to each other in the track-width direction by a longitudinal bias magnetic field applied from the hard bias layer 5 and the RKKY interaction generated between the second magnetic layer 37 and the first magnetic layer 39. For example, when the second magnetic layer 37 is magnetized to the right in FIG. 26 (positive X-direction) in the track-width direction, the first magnetic layer 39 is magnetized to the left in FIG. 26 (opposed to the positive X-direction) in the track-width direction.

The second magnetic layer 37 and the first magnetic layer 39 both constituting the free magnetic layer 33 are, unlike the pinned magnetic layer 31, put into a weak single domain state in which magnetization is reversible in response to an external magnetic field. The electrical resistance of the free magnetic layer 33 is changed depending on the relationship between the direction of fixed magnetization of the pinned magnetic layer 31 and the direction of magnetization of the free material layer 33 affected by the external magnetic field. An external signal from a recording medium is reproduced in accordance with a voltage change caused upon a change of the electrical resistance.

When the free magnetic layer 33 is of the multilayered ferri-structure as shown in FIG. 26, the layer that actually contributes to the magnetoresistive effect is the second magnetic layer 37.

Accordingly, when a sensing current flows from the electrode layer 8 primarily to the nonmagnetic material layer 32, there occurs a shunt loss if the sensing current is shunted to the first magnetic layer 39, thus resulting in a reduction of the resistance change rate (ΔR/R).

To reduce such a shunt loss, it has been proposed to increase the specific resistance of the first magnetic layer 39, for example, by adding Cr to the first magnetic layer 39 which has been so far formed of a CoFe alloy or the like. That proposal has, however, invited deterioration of reproduction characteristics, such as lowering of a reproduction output and the occurrence of noises, because the increased specific resistance of the first magnetic layer 39 reduces the coupling magnetic field based on the RKKY interaction generated between the second magnetic layer 37 and the first magnetic layer 39 to such an extent that the second magnetic layer 37 and the first magnetic layer 39 both constituting the free magnetic layer 33 cannot be satisfactorily magnetized in the antiparallel state.

FIG. 27 is a partial sectional view of another conventional magnetic sensor having a different structure, looking from a side facing a recording medium. In FIG. 27, the same numerals as those in FIG. 26 represent the same layers as those in FIG. 26.

In the magnetic sensor of FIG. 27, as with that of FIG. 26, a free magnetic layer 33 is of a multi-layered ferri-structure in which a nonmagnetic intermediate layer 38 is interposed between two magnetic layers 37 and 39. In the structure of FIG. 27, however, antiferromagnetic layers 40 are formed on the first magnetic layer 39 of the free magnetic layer 33 with a predetermined spacing left between the antiferromagnetic layers 40 in the track-width direction (X-direction). The method of controlling magnetization of the free magnetic layer 33 using the antiferromagnetic layers 40, as shown in FIG. 27, is called an exchange biasing method.

In the structure of FIG. 27, when an exchange coupling magnetic field is generated between the antiferromagnetic layers 40 and both end portions A of the first magnetic layer 39 and magnetization in both the end portions A of the first magnetic layer 39 is fixed, e.g., to the right in FIG. 27 (positive X-direction) in the track-width direction, magnetization in both end portions A of the second magnetic layer 37 formed in an opposing relation to the first magnetic layer 39 with the nonmagnetic intermediate layer 38 interposed therebetween is fixed to the left in FIG. 26 (opposed to the positive X-direction) in the track-width direction by a coupling magnetic field based on the RKKY interaction generated between the second magnetic layer 37 and the first magnetic layer 39.

In a central portion B of the free magnetic layer 33, the second magnetic layer 37 and the first magnetic layer 39 are also magnetized in the antiparallel state, but they are put into a weak single domain state in which magnetization is reversible in response to an external magnetic field.

That magnetic sensor employing the exchange biasing method also has the problems as with the magnetic sensor of FIG. 26. Specifically, when the first magnetic layer 39 constituting the free magnetic layer 33 is formed of a CoFe alloy, the resistance change rate ($\Delta R/R$) is reduced with shunting of the sensing current. Further, when the first magnetic layer 39 is formed of a CoFeCr alloy, lowering of the unidirectional exchange bias magnetic field (Hex*) becomes noticeable.

Herein, the term "unidirectional exchange bias magnetic field (Hex*)" represents a resultant magnetic field of an exchange coupling magnetic field (Hex) primarily generated between the antiferromagnetic layers 40 and the first magnetic layer 39 and a coupling magnetic field based on the RKKY interaction generated between the first magnetic layer 39 and the second magnetic layer 37.

FIG. 28 is a graph showing the relationship between a film thickness of the first magnetic layer 39 and a unidirectional exchange bias magnetic field (Hex*) resulting when the first magnetic layer 39 is formed of CoFe or $CoFeCr_{5\ at\ \%}$ in a magnetic sensor having the same multilayered structure as that shown in FIG. 27.

As seen from FIG. 28, when the first magnetic layer 39 is formed of a CoFe alloy, the unidirectional exchange bias magnetic field (Hex*) has a very high value. However, when the first magnetic layer 39 is formed of a CoFeCr alloy, the unidirectional exchange bias magnetic field is sharply reduced.

Also, as seen from FIG. 28, there is a tendency that as the film thickness of the first magnetic layer 39 made of CoFeCr increases, the unidirectional exchange bias magnetic field (Hex*) is also increased. However, a greater thickness of the first magnetic layer 39 increases the amount of the sensing current shunted to the first magnetic layer 39. Eventually, it has been impossible in the past to improve both the unidirectional exchange bias magnetic field (Hex*) and the resistance change rate ($\Delta R/R$) in the free magnetic layer 33 at the same time.

SUMMARY OF THE INVENTION

With the view of solving the above-stated problems in the related art, it is an object of the present invention to provide a magnetic sensor, which has an improved film makeup of a first magnetic layer of a free magnetic layer having a multilayered ferri-structure, and which can improve the resistance change rate ($\Delta R/R$), increase the unidirectional exchange bias magnetic field (Hex*), and satisfactorily control magnetization of the free magnetic layer.

To achieve the above object, according to a first aspect of the present invention, there is provided a magnetic sensor including a laminate comprising an antiferromagnetic layer, a pinned magnetic layer formed in contact with the antiferromagnetic layer, and a free magnetic layer formed in an opposing relation to the pinned magnetic layer with a nonmagnetic material layer interposed between the free magnetic layer and the pinned magnetic layer, wherein the free magnetic layer is of a multilayered ferri-structure comprising a second magnetic layer formed in contact with an interface between the free magnetic layer and the nonmagnetic material layer, and a first magnetic layer formed in an opposing relation to the second magnetic layer with a nonmagnetic intermediate layer interposed therebetween, and wherein the first magnetic layer includes an area which contains an element X (X represents at least one element selected from among Cr, Ti, V, Zr, Nb, Mo, Hf, Ta and W) and which is present in position toward a side of the nonmagnetic intermediate layer from a side near an opposite surface of the first magnetic layer away from an interface between the first magnetic layer and the nonmagnetic intermediate layer, and an area which is partly located in a region from the interface between the first magnetic layer and the nonmagnetic intermediate layer toward the opposite surface of the first magnetic layer and which does not contain the element X.

In the above magnetic sensor, preferably, the first magnetic layer is formed primarily of a CoFe alloy, the area containing the element X is formed of a CoFeX alloy, and the area not containing the element X is formed of a CoFe alloy.

As an alternative, preferably, the first magnetic layer is formed primarily of a CoFeNi alloy, the area containing the element X is formed of a CoFeNiX alloy, and the area not containing the element X is formed of a CoFeNi alloy.

Thus, according to the first aspect of the present invention, the area containing the element X is present on the side nearer to the opposite surface of the first magnetic layer of the free magnetic layer having the multilayered ferri-structure, which is positioned away from the interface between the first magnetic layer and the nonmagnetic intermediate layer, and the area not containing the element X is present on the side nearer to the nonmagnetic intermediate layer.

The magnetic area containing the element X has a higher specific resistance than the magnetic area not containing the element X.

Hence, since the area containing the element X and having a high specific resistance is present in the first magnetic layer, the loss of a sensing current shunted to the first magnetic layer can be reduced in comparison with the case forming the first magnetic layer of only a magnetic material not containing the element X.

Further, according to the first aspect of the present invention, the element X is contained not over the entire area of the first magnetic layer and the area not containing the element X is present on the side nearer to the interface between the first magnetic layer and the nonmagnetic intermediate layer. From experiments described later, it was confirmed that the presence of the area not containing the element X on the side nearer to the interface between the first magnetic layer and the nonmagnetic intermediate layer increases a coupling magnetic field based on the RKKY interaction generated between the first magnetic layer and the second magnetic layer.

Consequently, according to the first aspect of the present invention, the resistance change rate ($\Delta R/R$) of the magnetic sensor can be increased in comparison with that obtained with the related art. In addition, it is possible to increase the coupling magnetic field based on the RKKY interaction generated between the first magnetic layer and the second magnetic layer both constituting the first magnetic layer, to satisfactorily control magnetization of the free magnetic layer, and to manufacture a magnetic sensor having superior reproduction characteristics.

According to a second aspect of the present invention, there is provided a magnetic sensor including a laminate comprising an antiferromagnetic layer, a pinned magnetic layer formed in contact with the antiferromagnetic layer, and a free magnetic layer formed in an opposing relation to the pinned magnetic layer with a nonmagnetic material layer interposed between the free magnetic layer and the pinned magnetic layer, wherein the free magnetic layer is of a multilayered ferri-structure comprising a second magnetic layer formed in contact with an interface between the free magnetic layer and the nonmagnetic material layer, and a first magnetic layer formed in an opposing relation to the second magnetic layer with a nonmagnetic intermediate layer interposed therebetween, wherein the first magnetic layer contains an element X (X represents at least one element selected from among Cr, Ti, V, Zr, Nb, Mo, Hf, Ta and W) when formed, and wherein the element X has a larger content on a side near an opposite surface of the first magnetic layer away from an interface between the first magnetic layer and the nonmagnetic intermediate layer than at the interface between the first magnetic layer and the nonmagnetic intermediate layer.

In the above magnetic sensor, preferably, the first magnetic layer is formed of a magnetic material made of a CoFe alloy and containing the element X.

As an alternative, preferably, the first magnetic layer is formed of a magnetic material made of a CoFeNi alloy and containing the element X.

Further, preferably, the content of the element X on the side near the opposite surface of the first magnetic layer away from the interface between the first magnetic layer and the nonmagnetic intermediate layer is not smaller than 3 at % but not larger than 15 at %.

According to the second aspect of the present invention, the element X is contained on the side near the interface between the first magnetic layer and the nonmagnetic intermediate layer as well, but its content is very small. Then, the content of the element X is adjusted such that it takes a higher value on the side nearer to the opposite surface of the first magnetic layer away from the interface between the first magnetic layer and the nonmagnetic intermediate layer.

As with the first aspect, according to the second aspect of the present invention, the specific resistance value of the first magnetic layer can be increased and the shunt loss of a sensing current can be reduced. Further, the coupling magnetic field based on the RKKY interaction generated between the first magnetic layer and the second magnetic layer can be increased.

Hence, according to the second aspect of the present invention, the resistance change rate ($\Delta R/R$) of the magnetic sensor can be increased in comparison with that obtained with the related art. In addition, it is possible to increase the coupling magnetic field based on the RKKY interaction generated between the first magnetic layer and the second magnetic layer both constituting the first magnetic layer, to satisfactorily control magnetization of the free magnetic layer, and to manufacture a magnetic sensor having superior reproduction characteristics.

In the above magnetic sensor, preferably, the first magnetic layer includes an area in which the content of the element X gradually decreases toward the interface between the first magnetic layer and the nonmagnetic intermediate layer from the side near the opposite surface of the first magnetic layer away from the interface between the first magnetic layer and the nonmagnetic intermediate layer.

The presence of such an area means that the so-called composition modulation occurs in the first magnetic layer. The occurrence of the composition modulation is attributable to a manufacturing method described later.

According to a third aspect of the present invention, there is provided a magnetic sensor including a laminate comprising an antiferromagnetic layer, a pinned magnetic layer formed in contact with the antiferromagnetic layer, and a free magnetic layer formed in an opposing relation to the pinned magnetic layer with a nonmagnetic material layer interposed between the free magnetic layer and the pinned magnetic layer, wherein the free magnetic layer is of a multilayered ferri-structure comprising a second magnetic layer formed in contact with an interface between the free magnetic layer and the nonmagnetic material layer, and a first magnetic layer formed in an opposing relation to the second magnetic layer with a nonmagnetic intermediate layer interposed therebetween, and wherein the first magnetic layer is made up of at least two magnetic layers, one of the two magnetic layers, which is positioned on a side near an opposite surface of the first magnetic layer away from an interface between the first magnetic layer and the nonmagnetic intermediate layer, being formed of a magnetic material containing an element X (X represents at least one element selected from among Cr, Ti, V, Zr, Nb, Mo, Hf, Ta and W), the other of the two magnetic layers, which is positioned on a side contacting the interface between the first magnetic layer and the nonmagnetic intermediate layer, being formed of a magnetic material not containing the element X.

In the above magnetic sensor, preferably, of the two magnetic layers, the one positioned on the side near the opposite surface of the first magnetic layer away from the interface between the first magnetic layer and the nonmagnetic intermediate layer is formed of a CoFeX alloy, and the other positioned on the side contacting the interface between the first magnetic layer and the nonmagnetic intermediate layer is formed of a CoFe alloy.

As an alternative, preferably, of the two magnetic layers, the one positioned on the side near the opposite surface of the first magnetic layer away from the interface between the first magnetic layer and the nonmagnetic intermediate layer is formed of a CoFeNiX alloy, and the other positioned on the side contacting the interface between the first magnetic layer and the nonmagnetic intermediate layer is formed of a CoFeNi alloy.

According to the third aspect of the present invention, the first magnetic layer of the free magnetic layer having the multilayered ferri-structure is made up of at least two magnetic layers. Of the at least two magnetic layers, one positioned on the side near the opposite surface of the first magnetic layer away from the interface between the first magnetic layer and the nonmagnetic intermediate layer is formed of a magnetic material containing the element X and having a high specific resistance value. Thus, since the magnetic area having a high specific resistance value is present in the first magnetic layer, the loss of a sensing current shunted to the first magnetic layer can be reduced and the resistance change rate ($\Delta R/R$) can be improved.

On the other hand, the magnetic layer on the side contacting the nonmagnetic intermediate layer is formed of a magnetic material not containing the element X. This increases a coupling magnetic field based on the RKKY interaction generated between the magnetic layer on the side contacting the nonmagnetic intermediate layer and the second magnetic layer.

Consequently, according to the third aspect of the present invention, the resistance change rate ($\Delta R/R$) of the magnetic sensor can be increased in comparison with that obtained with the related art. In addition, it is possible to increase the coupling magnetic field based on the RKKY interaction generated between the first magnetic layer and the second magnetic layer both constituting the first magnetic layer, to satisfactorily control magnetization of the free magnetic layer, and to manufacture a magnetic sensor having superior reproduction characteristics.

In the present invention, preferably, when the area containing the element X is formed of a CoFeX alloy or a CoFeNiX alloy and the area not containing the element X is formed of a CoFe alloy or a CoFeNi alloy, a film thickness ratio of (film thickness of the CoFeX alloy/film thickness of the first magnetic layer) or of (film thickness of the CoFeNiX alloy/film thickness of the first magnetic layer) is larger than 0 but not larger than 0.61.

As an alternative, preferably, when the area containing the element X is formed of a CoFeX alloy or a CoFeNiX alloy and the area not containing the element X is formed of a CoFe alloy or a CoFeNi alloy, a film thickness ratio of (film thickness of the CoFeX alloy/film thickness of the first magnetic layer) or of (film thickness of the CoFeNiX alloy/film thickness of the first magnetic layer) is larger than 0 but not larger than 0.36.

As an alternative, preferably, when the area containing the element X is formed of a CoFeX alloy or a CoFeNiX alloy and the area not containing the element X is formed of a CoFe alloy or a CoFeNi alloy, a film thickness ratio of (film thickness of the CoFeX alloy/film thickness of the first magnetic layer) or of (film thickness of the CoFeNiX alloy/film thickness of the first magnetic layer) is not smaller than 0.26 but not larger than 0.82.

As an alternative, preferably, when the area containing the element X is formed of a CoFeX alloy or a CoFeNiX alloy and the area not containing the element X is formed of a CoFe alloy or a CoFeNi alloy, a film thickness ratio of (film thickness of the CoFeX alloy/film thickness of the first magnetic layer) or of (film thickness of the CoFeNiX alloy/film thickness of the first magnetic layer) is not smaller than 0.12 but not larger than 0.61.

As an alternative, preferably, when the area containing the element X is formed of a CoFeX alloy or a CoFeNiX alloy and the area not containing the element X is formed of a CoFe alloy or a CoFeNi alloy, a film thickness ratio of (film thickness of the CoFeX alloy/film thickness of the first magnetic layer) or of (film thickness of the CoFeNiX alloy/film thickness of the first magnetic layer) is not smaller than 0.26 but not larger than 0.61.

As an alternative, preferably, when the area containing the element X is formed of a CoFeX alloy or a CoFeNiX alloy and the area not containing the element X is formed of a CoFe alloy or a CoFeNi alloy, a film thickness ratio of (film thickness of the CoFeX alloy/film thickness of the first magnetic layer) or of (film thickness of the CoFeNiX alloy/film thickness of the first magnetic layer) is not smaller than 0.26 but not larger than 0.36.

Further, in the present invention, a composition ratio of the element X is preferably not smaller than 3 at % but not larger than 15 at %.

Still further, in the present invention, when the magnetic layer is formed of CoFe, CoFeX, CoFeNi or CoFeNiX, an atomic percentage Y of $Co_Y$ and $Fe_{100-Y}$ is preferably not smaller than 85% but not larger than 96%.

Still further, in the present invention, when the magnetic layer is formed of CoFeNi or CoFeNiX, a composition ratio of Ni is preferably not smaller than 0.5 at % but not larger than 5 at %.

Moreover, in the present invention, it is preferable that second antiferromagnetic layers are disposed on the side near the opposite surface of the first magnetic layer away from the interface between the first magnetic layer and the nonmagnetic intermediate layer with a predetermined spacing left between the second antiferromagnetic layers in a track-width direction. This feature represents a structure for controlling magnetization of the free magnetic layer by the so-called exchange biasing method.

From experiments described later, it was confirmed that with the presence of the magnetic area containing the element X in the first magnetic layer on the side nearer to an interface between the first magnetic layer and the second antiferromagnetic layer, an exchange coupling magnetic field (Hex) generated between the magnetic layer containing the element X and the second antiferromagnetic layer is increased from that obtained in the case forming the magnetic area not containing the element X on the side nearer to the interface between the first magnetic layer and the second antiferromagnetic layer.

Also, as stated above, the coupling magnetic field based on the RKKY interaction generated between the upper (first) and lower (second) magnetic layers with the nonmagnetic intermediate layer interposed therebetween is increased with the presence of the magnetic area not containing the element X on the side nearer to the interface between the first magnetic layer and the second magnetic layer in comparison with that obtained in the case forming the magnetic area containing the element X on the side nearer to the interface between the first magnetic layer and the second magnetic layer.

Consequently, in the present invention, by forming, in the first magnetic layer, the magnetic area containing the element X on the side nearer to the interface between the first magnetic layer and the second antiferromagnetic layer and the magnetic area not containing the element X on the side nearer to the interface between the first magnetic layer and the second magnetic layer, the shunt loss of a sensing current can be suppressed and the resistance change rate can be increased. In addition, it is possible to increase both the exchange coupling magnetic field (Hex) generated between the first magnetic layer and the second antiferromagnetic layer and the coupling magnetic field based on the RKKY interaction. Hence, a unidirectional exchange bias magnetic field (Hex*) in the first magnetic layer can be satisfactorily increased from that obtained with the related art.

Thus, in the structure in which magnetization of the free magnetic layer is controlled by the exchange biasing method, the resistance change rate can be increased from that obtained with the related art. In addition, it is possible to satisfactorily control magnetization of the free magnetic layer, and to manufacture a magnetic sensor having superior reproduction characteristics.

In the present invention, bias layers may be disposed on both sides of the free magnetic layer in a track-width direction.

Also, the present invention may be implemented such that an electrode layer is disposed on a side near an opposite surface of each of the second antiferromagnetic layers away from an interface between the second antiferromagnetic layer and the first magnetic layer, and an electrical current flows in a direction parallel to a film surface of each layer of the laminate. As another embodiment, electrode layers may be disposed on the bias layers and an electrical current may flow in a direction parallel to a film surface of each layer of the laminate.

A magnetic sensor in which an electrical current flows in the direction parallel to the film surface of each layer of the magnetic sensor is called a CIP (current in the plane) type magnetic sensor.

Alternatively, the present invention may be implemented such that electrode layers are disposed on and under the magnetic sensor, and an electrical current flows in a direction perpendicular to a film surface of each layer of the laminate. Such a magnetic sensor is called a CPP (current perpendicular to the plane) type magnetic sensor.

In the case of the CPP type magnetic sensor, preferably, the upper electrode layer disposed on the laminate is an upper shield layer formed of a magnetic material. It is therefore possible to facilitate manufacture of the magnetic sensor, to shorten the gap length G1, and to manufacture a magnetic sensor satisfactorily adaptable for a higher recording density.

In that magnetic sensor, preferably, the free magnetic layer is formed on an upper side of the antiferromagnetic layer and second antiferromagnetic layers are disposed on the first magnetic layer constituting the free magnetic layer with a predetermined spacing left between the second antiferromagnetic layers in a track-width direction; first insulating layers are disposed on the second antiferromagnetic layers and second insulating layers are disposed on inner end surfaces of both the second antiferromagnetic layers and the first insulating layers; and the upper electrode layer is formed to cover the first insulating layers and the second insulating layers and to fill the spacing left between the second antiferromagnetic layers. With that feature, the current flowing from the upper electrode layer into the laminate is satisfactorily avoided from being shunted to the second antiferromagnetic layer, and a magnetic sensor can be manufactured which can provide a greater reproduction output, has a narrower effective reproduction track width, and is suitable for a higher recording density.

In the present invention, preferably, the first insulating layers and the second insulating layers are formed separately from each other.

Further, in the case of the CPP type magnetic sensor, the lower electrode layer disposed under the laminate is preferably a lower shield layer formed of a magnetic material. With that feature, it is possible to facilitate manufacture of the magnetic sensor, to shorten the gap length G1, and to manufacture a magnetic sensor satisfactorily adaptable for a higher recording density.

In the above magnetic sensor, preferably, the free magnetic layer is formed on an upper side of the antiferromagnetic layer and second antiferromagnetic layers are disposed on the first magnetic layer constituting the free magnetic layer with a predetermined spacing left between the second antiferromagnetic layers in a track-width direction; and a projection projecting in a multilayered direction of the laminate is formed at a center of the lower electrode layer in the track-width direction, the projection having an upper surface contacting a lower surface of the laminate, and insulating layers are disposed between both end portions of the lower electrode layer in the track-width direction and the laminate. With those features, the current flowing from the lower electrode layer into the laminate is hard to spread beyond the track width and the shunt loss of that current can be suppressed. Hence, it is possible to manufacture a magnetic sensor that can provide a greater reproduction output and has a narrower effective reproduction track width.

In the present invention, preferably, the upper surface of the projection and upper surfaces of the insulating layers disposed on both the end portions of the lower electrode layer are flush with each other.

Moreover, in the present invention, the nonmagnetic material layer is preferably formed of a nonmagnetic electrically conductive material. Such a magnetic sensor in which the nonmagnetic material layer is formed of a nonmagnetic electrically conductive material is called a spin-valve GMR type magnetoresistive sensor (CIP-GMR or CPP-GMR).

Additionally, the nonmagnetic material layer may be formed of an insulating material. Such a magnetic sensor is called a spin-valve tunneling type magnetoresistive sensor (CPP-TMR).

DESCRIPTION OF THE PREFERRED EMBODIMENTS

Figure 1:
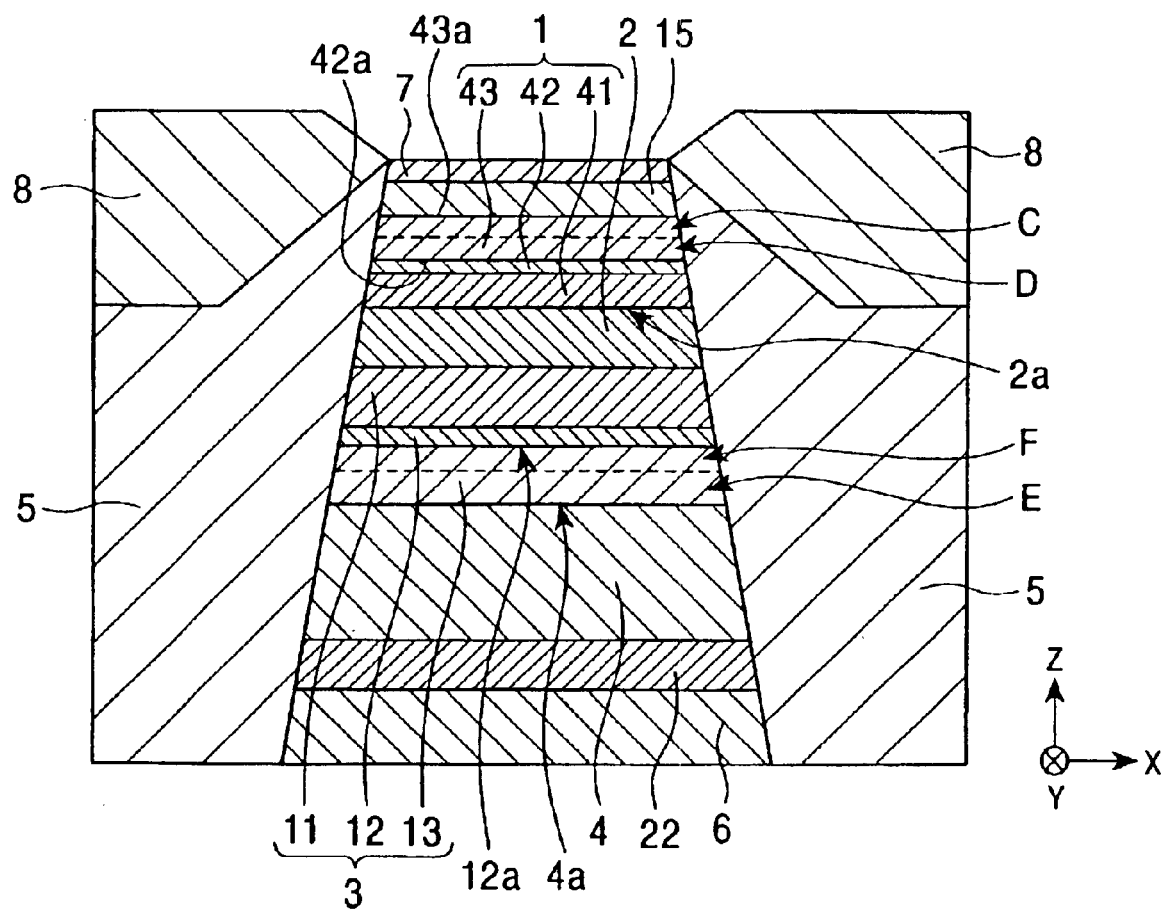
FIG. 1 is a partial sectional view of a structure of a magnetic sensor according to a first embodiment of the present invention, looking from a side facing a recording medium.

FIG. 1 is a partial sectional view of an overall structure of a magnetic sensor (single spin-valve type magnetoresistive sensor) according to a first embodiment of the present invention, looking from a side facing a recording medium. Note that FIG. 1 shows, in the sectioned form, only a central portion of the sensor extending in the X-direction.

The single spin-valve type magnetoresistive sensor of this embodiment is disposed, e.g., at a trailing-side end of a floating slider provided in a hard disk drive, and detects a recording magnetic field leaked from, e.g., a disk of the hard disk drive. A magnetic recording medium, such as a hard disk, is moved in the Z-direction and a magnetic field is leaked from the magnetic recording medium in the Y-direction.

A buffer layer 6 made of a nonmagnetic material, e.g., one or more elements selected from among Ta, Hf, Nb, Zr, Ti, Mo and W, is formed at the bottom of the structure shown in FIG. 1. The buffer layer 6 is formed in a film thickness of, e.g., about 50 Å.

A seed layer 22 is formed on the buffer layer 6. Forming the seed layer 22 increases the crystal grain size in a direction parallel to a film surface of each layer formed on the seed layer 22, and makes it possible to more satisfactorily realize an improvement of the reliability in energization, which is represented by an improvement of resistance against electro-migration, and an improvement of the resistance change rate ($\Delta R/R$).

The seed layer 22 is formed of, e.g., a NiFeCr alloy or Cr. When the seed layer 22 is formed of a NiFeCr alloy, the alloy has a composition of, e.g., $(Ni_{0.8}Fe_{0.2})_{60\ at\ \%}Cr_{40\ at\ \%}$.

An antiferromagnetic layer 4 formed on the seed layer 22 is preferably made of an antiferromagnetic material containing an element X (X represents one or more elements selected from among Pt, Pd, Ir, Rh, Ru and Os) and Mn.

An X—Mn alloy using those platinum group elements has superior characteristics as an antiferromagnetic material in points of, for example, providing superior corrosion resistance, a higher blocking temperature, and a greater exchange coupling magnetic field (Hex). Of the platinum group elements, it is especially preferable to use Pt. In this case, a two-element PtMn alloy, for example, can be employed.

In the present invention, the antiferromagnetic layer 4 may be made of an antiferromagnetic material containing an element X, an element X' (X' represents one or more elements selected from among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements) and Mn.

The element X' is preferably an element that intrudes gaps between space lattices constituted by the elements X and Mn or is substituted for a part of lattice points of crystal lattices constituted by the elements X and Mn. Herein, the term "solid solution" means a solid in which components are evenly mixed over a wide region.

By forming an interstitial solid solution or a substitutive solid solution, the lattice constant of the X—Mn—X' alloy film can be increased in comparison with that of the X—Mn alloy film. This increases the difference in the lattice constant between the antiferromagnetic layer 4 and a pinned magnetic layer 3 (described later), and hence contributes to brining an interface structure between the antiferromagnetic layer 4 and the pinned magnetic layer 3 into a non-aligned state with more ease. Herein, the term "non-aligned state" means a state that atoms constituting the antiferromagnetic layer 4 and atoms constituting the pinned magnetic layer 3 are not one-to-one aligned with each other at the interface between the antiferromagnetic layer 4 and the pinned magnetic layer 3.

Particularly, in the case using the element X' that forms a substitutive solid solution, if the composition ratio of the element X' is too large, the antiferromagnetic characteristics would be deteriorated and the exchange coupling magnetic field (Hex) generated at the interface between the antiferromagnetic layer 4 and the pinned magnetic layer 3 would be reduced. In the present invention, therefore, it is especially preferable to use, as the element X', a rare gas element (one or more selected from among Ne, Ar, Kr and Xe), which is an inert gas and forms an interstitial solid solution. The rare gas element is an inert gas and hence does not significantly affect the antiferromagnetic characteristics even when it is contained in the film of the antiferromagnetic layer 4. Also, Ar is a gas conventionally introduced, as a sputtering gas, to a sputtering apparatus and can be easily intruded into the film just by properly adjusting the gas pressure.

When a gaseous element is used as the element X', a difficulty arises in containing a large amount of the element X' in the film. In the case using a rare gas, however, just by introducing a trace amount of the rare gas into the film, the exchange coupling magnetic field (Hex) generated with heat treatment can be drastically increased.

In the present invention, a preferable composition range of the element X' is from 0.2 to 10 at % (atomic %) and more preferably from 0.5 to 5 at %. Also, in the present invention, since the element X is preferably Pt, it is preferable to use a Pt—Mn—X' alloy.

Moreover, in the present invention, a preferable composition range (at %) of the element X or the elements X+X' is from 45 to 60 at % and more preferably from 49 to 56.5 at %. Under such conditions, it is ensured in the film forming stage that the non-aligned state is held at the interface between the antiferromagnetic layer 4 and the pinned magnetic layer 3, and the antiferromagnetic layer 4 develops appropriate regular transformation with heat treatment.

The pinned magnetic layer 3 formed on the antiferromagnetic layer 4 is of a three-layered structure.

The pinned magnetic layer 3 is made up of a first magnetic layer 13 contacting an interface 4a between the pinned magnetic layer 3 and the antiferromagnetic layer 4, and a second magnetic layer 11 formed over the first magnetic layer 13 with a nonmagnetic intermediate layer 12 interposed therebetween.

A nonmagnetic material layer 2 is formed on the pinned magnetic layer 3. The nonmagnetic material layer 2 is made of a nonmagnetic electrically conductive material such as Cu, for example.

A free magnetic layer 1 is formed on the nonmagnetic material layer 2. In the present invention, the free magnetic layer 1 is of a multilayered ferri-structure made up of a second magnetic layer 41 formed in contact with an interface 2a between the free magnetic layer 1 and the nonmagnetic material layer 2, and a first magnetic layer 43 formed in an opposing relation to the second magnetic layer 41 with a nonmagnetic intermediate layer 42 interposed therebetween.

A backed layer 15 made of a metallic material or a nonmagnetic metal, e.g., Cu, Au or Ag is formed on the free magnetic layer 1. The backed layer 15 is formed in film thickness of, e.g., about 5 to 20 Å.

A barrier layer 7 is formed on the backed layer 15. Preferably, the barrier layer 7 is made of, e.g., Ta and an oxidized layer (mirror reflecting layer) is formed on the surface of the barrier layer 7.

Forming the backed layer 15 is advantageous in increasing the mean free path of up-spin electrons which contributes to the magnetoresistive effect, and in developing the spin filter effect to realize a spin-valve type magnetic sensor which has a greater resistance change rate and is adaptable for a higher recording density. The backed layer 15, however, may be not formed. The reason is that conduction electrons reaching the first magnetic layer 43 of the ferri-structure are already scattered by the nonmagnetic intermediate layer 42, and hence the spin filter effect is not so significantly developed even with the formation of the backed layer 15.

In the first embodiment shown in FIG. 1, a hard bias layer 5 and an electrode layer 8 are formed on each of both sides of multiple layers from the buffer layer 6 to the barrier layer 7 in the track-width direction. For example, when the first magnetic layer 43 constituting the free magnetic layer 1 is magnetized to the right in FIG. 1 (positive X-direction) in the track-width direction by a longitudinal bias magnetic field applied from the hard bias layer 5, the second magnetic layer 41 is magnetized antiparallel to the direction of magnetization of the first magnetic layer 43, i.e., to the left in FIG. 1 (opposed to the positive X-direction) in the track-width direction, by a coupling magnetic field based on the RKKY interaction generated between the second magnetic layer 41 and the first magnetic layer 43.

The hard bias layer 5 is formed of, e.g., a Co—Pt (cobalt-platinum) alloy or a Co—Cr—Pt— (cobalt-chromium-platinum) alloy, and the electrode layer 8 is made of, e.g., α-Ta, Au, Ru, Rh, Cr, Cu (copper), or W (tungsten).

In the present invention, as described above, the free magnetic layer 1 is of a multilayered ferri-structure.

The film composition of the first magnetic layer 43 constituting the free magnetic layer 1 has the following feature.

In the present invention, the first magnetic layer 43 includes a magnetic area which is extended from its opposite surface 43a away from an interface 42a between the first magnetic layer 43 and the nonmagnetic intermediate layer 42 toward the nonmagnetic intermediate layer 42 (in a direction opposed to the Z-direction in FIG. 1) and which contains an element X (X represents at least one element selected from among Cr, Ti, V, Zr, Nb, Mo, Hf, Ta and W), and a magnetic area which is extended from the interface 42a between the first magnetic layer 43 and the nonmagnetic intermediate layer 42 toward the opposite surface 43a (in the Z-direction in FIG. 1) and which does not contain the element X.

As schematically shown in FIG. 1, by way of example, an area C located nearer to the opposite surface 43a of the first magnetic layer 43 and demarcated by a dotted line is made of a magnetic material containing the element X, while an area D located nearer to the nonmagnetic intermediate layer 42 and demarcated by the dotted line is made of a magnetic material not containing the element X.

Note that the boundary between the areas C and D is illustrated for convenience of explanation. In other words, as described later, there actually occurs, e.g., modulation in composition ratio of the element X in the first magnetic layer 43 and the presence or absence of the element X is not clearly separated at the boundary between the areas C and D.

According to that feature of the present invention, the area C containing the element X is present on the side near the opposite surface 43a of the first magnetic layer 43 away from the interface 42a between the first magnetic layer 43 and the nonmagnetic intermediate layer 42, and the area C has a greater value of specific resistance than that of the area D not containing the element X. As compared with the case in which the first magnetic layer 43 is entirely formed as a magnetic area not containing the element X, therefore, the amount of the sensing current flowing from the electrode layer 8 and shunted to the first magnetic layer 43, i.e., the so-called shunt loss, can be reduced and the resistance change rate (ΔR/R) can be increased from that in the related art.

Also, in the present invention, the first magnetic layer 43 includes the magnetic area D not containing the element X on the side nearer to the nonmagnetic intermediate layer 42.

Since the magnetic area D not containing the element X is opposed to the second magnetic layer 41 with the nonmagnetic intermediate layer 42 interposed therebetween, the coupling magnetic field based on the RKKY interaction generated between the magnetic area D and the second magnetic layer 41 can be increased.

According to the present invention, therefore, it is possible, as compared with the related art, to suppress the sensing current from being shunted to the first magnetic layer 43, to improve the resistance change rate (ΔR/R), and to increase the RKKY interaction generated between the first magnetic layer 43 and the second magnetic layer 41. Hence, the first magnetic layer 43 and the second magnetic layer 41 can be more satisfactorily magnetized in the antiparallel state, and a magnetic sensor superior in reproduction characteristics can be manufactured.

Materials of the first magnetic layer 43 will now be described. In the present invention, preferably, the area C containing the element X is formed of a CoFeX alloy and the area D not containing the element X is formed of a CoFe alloy. The reason is in that, by forming the first magnetic layer 43 of a magnetic material primarily made of a CoFe alloy, the coupling magnetic field based on the RKKY interaction can be increased so that magnetization of the first magnetic layer 43 and magnetization of the second magnetic layer 41 can be more satisfactorily held in the antiparallel state.

As an alternative, it is also preferable in the present invention that the area C containing the element X is formed of a CoFeNiX alloy and the area D not containing the element X is formed of a CoFeNi alloy. By using those materials, the coupling magnetic field based on the RKKY interaction generated between the first magnetic layer 43 and the second magnetic layer 41 can be increased and soft magnetic characteristics of the first magnetic layer 43 can be improved.

However, the present invention is not limited to the case in which the first magnetic layer 43 is formed of a magnetic material primarily made of a CoFe alloy or a CoFeNi alloy. For example, the first magnetic layer 43 may be formed of a magnetic material primarily made of a NiFe alloy. In that case, the area C containing the element X is formed of a NiFeX alloy and the area D not containing the element X is formed of a NiFe alloy. Alternatively, the first magnetic layer 43 may be formed of a magnetic material primarily made of Co. In that case, the area C containing the element X is formed of a CoX alloy and the area D not containing the element X is formed of Co.

As the element X, Cr is preferably selected. By selecting Cr, the value of specific resistance of the area C in the first magnetic layer 43 can be satisfactorily increased. When the magnetic layer is formed of a CoFeCr alloy, the value of specific resistance can be increased to about 50 μΩ·cm. Also, when the magnetic layer is formed of a CoFeNiCr alloy, the value of specific resistance can be increased to about 55 μΩ·cm.

A description is now made of the composition ratio of elements constituting the first magnetic layer 43. In the present invention, the composition ratio of the element X is preferably in the range of 3 at % to 15 at %. If the composition ratio of the element X is smaller than 3 at %, an undesired result would be caused in that the specific resistance of the area C containing the element X cannot be increased to a satisfactory level and the effect of improving the resistance change rate (ΔR/R) cannot be obtained.

On the other hand, if the composition ratio of the element X exceeds 15 at %, an undesired result would be caused in deterioration of soft magnetic characteristics.

When the first magnetic layer 43 is formed of a magnetic material primarily made of CoFe or CoFeNi, an atomic percentage Y of $Co_Y$ and $Fe_{100\%-Y}$ is preferably in the range of 85% to 96%. By satisfying that range, it is possible to stabilize the face centered cubic crystal structure of the first magnetic layer 43, and hence to prevent adverse effects upon crystal orientation of the layers located above the first magnetic layer 43.

Also, when the first magnetic layer 43 is formed of a magnetic material primarily made of CoFeNi, the composition ratio of Ni is preferably in the range of 0.5 at % to 5 at %. Satisfying that range contributes to more satisfactorily increasing the exchange coupling magnetic field based on the RKKY interaction generated between the first magnetic layer 43 and the second magnetic layer 41. By properly adjusting the composition ratios of Co, Fe, the element X, and Ni to be kept within the above-mentioned ranges, soft magnetic characteristics of the first magnetic layer 43 can be more satisfactorily improved. For example, the spin flop magnetic field (Hsf) can be increased up to about 293 (kA/m) in practice. Further, the magnetostriction of the first magnetic layer 43 can be held within the range of $-3 \times 10^{-6}$ to $3 \times 10^{-6}$, and the coercive force can be reduced to 790 (A/m) or below.

The second magnetic layer 41 is preferably formed of a CoFe alloy or a CoFeNi alloy. When the first magnetic layer 43 is formed of a magnetic material primarily made of a CoFe alloy, the second magnetic layer 41 is more preferably formed of the CoFe alloy. When the first magnetic layer 43 is formed of a magnetic material primarily made of a CoFeNi alloy, the second magnetic layer 41 is more preferably formed of the CoFeNi alloy. The composition ratios of the CoFe alloy and the CoFeNi alloy are preferably in the same ranges as those described above in connection with the first magnetic layer 43.

By forming the second magnetic layer 41 of a CoFe alloy or a CoFeNi alloy as described above, the coupling magnetic field based on the RKKY interaction generated between the second magnetic layer 41 and the first magnetic layer 43 can be increased so that magnetization of the first magnetic layer 43 and magnetization of the second magnetic layer 41 can be more satisfactorily held in the antiparallel state. Also, a diffusion preventive layer made of Co or a CoFe alloy may be interposed between the second magnetic layer 41 and the nonmagnetic material layer 2. In that case, for example, the second magnetic layer 41 is formed of a CoFeNi alloy and a diffusion preventive layer made of, e.g., CoFe is interposed between the second magnetic layer 41 and the nonmagnetic material layer 2. This arrangement contributes to further improving the resistance change rate (ΔR/R).

The present invention is not limited to the case in which the second magnetic layer 41 is formed of a CoFe alloy or a CoFeNi alloy. As a modification, the second magnetic layer 41 may be formed of a magnetic material such as Co or a NiFe alloy.

Film thickness and other properties of the first magnetic layer 43 and the second magnetic layer 41 in the present invention will be described below.

The film thickness of each of the first magnetic layer 43 and the second magnetic layer 41 is preferably in the range of 10 Å to 50 Å. To provide the satisfactory multilayered ferri-structure of the free magnetic layer 1, however, it is required that the magnetic moment (saturation magnetization Ms×film thickness t) of the first magnetic layer 43 per unit area differs from the magnetic moment of the second magnetic layer 41 per unit area.

The difference in Ms·t between the first magnetic layer 43 and the second magnetic layer 41 provides effective Ms·t of the free magnetic layer 1. If the difference in Ms·t is zero, the effective film thickness of the free magnetic layer 1 becomes zero and magnetization of the free magnetic layer 1 cannot rotate in response to a magnetic field from a recording medium. In addition, the spin flop magnetic field is significantly reduced and the free magnetic layer 1 cannot be held in the antiparallel state with stability.

In the present invention, therefore, the first magnetic layer 43 and the second magnetic layer 41 are formed to be different in film thickness so that the magnetic moment of the first magnetic layer 43 per unit area and the magnetic moment of the second magnetic layer 41 per unit area can be made effectively different from each other. As a result, the satisfactory multilayered ferri-structure can be obtained.

Forming the free magnetic layer 1 of the multilayered ferri-structure, as shown in FIG. 1, has the advantage in that the magnetic effective film thickness of the free magnetic layer 1 can be reduced and sensitivity to an external magnetic field can be improved without extremely reducing the physical thickness of the free magnetic layer 1. The term "physical thickness" means the total film thickness of the first magnetic layer 43 and the second magnetic layer 41. Stated otherwise, in the present invention, by not only forming each of the first magnetic layer 43 and the second magnetic layer 41 in a film thickness within the above-described predetermined range, but also reducing the "magnetic effective film thickness of the free magnetic layer 1", i.e., the difference in magnetic moment per unit area between the first magnetic layer 43 and the second magnetic layer 41, the free magnetic layer 1 adaptable for a narrower track and having superior sensitivity can be formed without weakening the exchange coupling magnetic field based on the RKKY interaction generated between the first magnetic layer 43 and the second magnetic layer 41.

In the present invention, as described above, the first magnetic layer 43 includes the area C containing the element X and having a high specific resistance. However, since the area C is also a magnetic area similarly to the area D not containing the element X, the physical film thickness of the first magnetic layer 43 is given by the sum of the film thickness of the area C and the film thickness of the area D as shown in FIG. 1. Accordingly, in the present invention, the physical film thickness of the first magnetic layer 43 is not reduced in spite of the first magnetic layer 43 including the area C having a high specific resistance.

If it is merely intended just to reduce the amount of the sensing current shunted to the first magnetic layer 43, that intent can be realized, for example, by extremely reducing the film thickness of the first magnetic layer 43 or providing a nonmagnetic area in the first magnetic layer 43. In such a case, however, the "physical film thickness" of the first magnetic layer 43 is reduced and the physical film thickness of the second magnetic layer 41 must be reduced correspondingly. If the physical film thickness of the second magnetic layer 41 is not reduced, the difference in magnetic moment per unit area between the first magnetic layer 43 and the second magnetic layer 41 would be enlarged and the "magnetic effective film thickness of the free magnetic layer 1" would be increased, thus resulting in sensitivity deterioration of the magnetic sensor.

Thus, the present invention has succeeded in manufacturing a magnetic sensor wherein, by forming, in the first magnetic layer 43, the area C which contains the element X and has a high specific resistance, but which is a magnetic area, the advantages of the multilayered ferri-structure are obtained without reducing the "physical film thickness" of the first magnetic layer 43 and without increasing the "magnetic effective film thickness of the free magnetic layer 1", whereby the shunt loss of the sensing current can be reduced and the resistance change rate ($\Delta R/R$) can be increased.

The nonmagnetic intermediate layer 42 interposed between the first magnetic layer 43 and the second magnetic layer 41 is preferably made of one or more (alloy) selected from among Ru, Rh, Ir, Os, Cr, Re and Cu. In the present invention, the nonmagnetic intermediate layer 42 is more preferably made of Ru among those elements. The use of Ru can increase the coupling magnetic field based on the RKKY interaction generated between the first magnetic layer 43 and the second magnetic layer 41, thus enabling the first magnetic layer 43 and the second magnetic layer 41 to be more satisfactorily magnetized in the antiparallel state.

The modulation in composition ratio occurred in the first magnetic layer 43 will be described below. In the present invention, as described later in connection with the manufacturing method, the first magnetic layer 43 of the free magnetic layer 1 is provided, for example, by forming the area D, which does not contain the element X and is preferably formed of a CoFe alloy or a CoFeNi alloy, on the nonmagnetic intermediate layer 42 with sputtering, and then forming the area C, which contains the element X and is preferably formed of a CoFeX alloy or a CoFeNiX alloy, on the area D with sputtering.

Thereafter, heat treatment is carried out to generate an exchange coupling magnetic field (Hex) between the antiferromagnetic layer 4 and the pinned magnetic layer 3. On that occasion, thermal diffusion of the element X occurs at the boundary between the area C and the area D, whereupon the element X enters the area D as well and the density of the element X near the boundary between the area C and the area D lowers. Thus, the heat treatment produces, in the first magnetic layer 43, an area in which the composition ratio of the element X is modulated.

In the present invention, therefore, it is confirmed that the first magnetic layer 43 includes an area in which the content of the element X gradually reduces from the side of the aforementioned opposite surface 43a toward the side of the interface 42a between the first magnetic layer 43 and the nonmagnetic intermediate layer 42.

Stated otherwise, it is difficult to clearly discern the boundary between the area C containing the element X and the area D not containing the element X, and modulation in composition ratio of the element X occurs at the boundary. Such a modulation in composition ratio can be confirmed, for example, with the nano-beam EDX (Energy Dispersive X-ray Spectroscopy) using a Field Emission Type Transmission Electron Microscope (FE-TEM).

A description is now made of the extent of the area formed in the first magnetic layer 43 and containing the element X. In the present invention, it is preferable that, of the film thickness of the first magnetic layer 43, an area containing the element X at the composition ratio of smaller than 3 at % (the composition ratio of the element X in this area is 0 at % near the interface 42a between the first magnetic layer 43 and the nonmagnetic intermediate layer 42) has a film thickness of 3 to 10 Å and an area containing the element X at the composition ratio of not smaller than 3 at % has a film thickness of 3 to 15 Å.

Satisfying the above condition contributes to satisfactorily increasing the value of specific resistance of the first magnetic layer 43, increasing the coupling magnetic field based on the RKKY interaction generated between the first magnetic layer 43 and the second magnetic layer 41, and satisfactorily reducing the shunt loss of the sensing current for an improvement of the resistance change rate (ΔR/R). In addition, magnetization of the first magnetic layer 43 and magnetization of the second magnetic layer 41 can be more satisfactorily held in the antiparallel state.

In the present invention, more preferably, the film thickness of the area containing the element X at the composition ratio of not smaller than 3 at % is larger than 0% but not larger than 85% with respect to the overall film thickness of the first magnetic layer 43. By satisfying that condition, it is possible to more satisfactorily suppress the amount of the sensing current shunted to the first magnetic layer 43, to reduce the so-called shunt loss, and hence to more satisfactorily improve the resistance change rate (ΔR/R). It is also possible to prevent a reduction of the coupling magnetic field based on the RKKY interaction generated between the first magnetic layer 43 and the second magnetic layer 41.

Further, when the area containing the element X is formed of a CoFeX alloy or a CoFeNiX alloy and the area not containing the element X is formed of a CoFe alloy or a CoFeNi alloy, the film thickness ratio of the area formed of a CoFeX alloy or a CoFeNiX alloy to the first magnetic layer 43, i.e., (film thickness of the CoFeX alloy/film thickness of the first magnetic layer 43) or (film thickness of the CoFeNiX alloy/film thickness of the first magnetic layer 43), is preferably larger than 0 but not larger than 0.61. Further, the film thickness ratio of the area containing the element X in the range of 3 at % to 15 at % and formed of a CoFeX alloy or a CoFeNiX alloy is more preferably larger than 0 but not larger than 0.61. By satisfying those conditions, the resistance change rate can be increased from that obtained with the related art (in which the first magnetic layer is formed of only CoFe or CoFeNi, this is similarly applied to the following description). Also, in the exchange biasing method described later in connection with FIGS. 6 to 17, the unidirectional exchange bias magnetic field (Hex*) in both end portions of the free magnetic layer 1 can be increased from, e.g., 53 kA/m.

Alternatively, in the present invention, the film thickness ratio, i.e., (film thickness of the CoFeX alloy/film thickness of the first magnetic layer 43) or (film thickness of the CoFeNiX alloy/film thickness of the first magnetic layer 43), is preferably larger than 0 but not larger than 0.36. Further, the film thickness ratio of the area containing the element X in the range of 3 at % to 15 at % and formed of a CoFeX alloy or a CoFeNiX alloy is more preferably larger than 0 but not larger than 0.36. By satisfying those conditions, the coupling magnetic field based on the RKKY interaction can be increased. In addition, the resistance change rate (ΔR/R) can be increased from that obtained with the related art.

Alternatively, in the present invention, the film thickness ratio, i.e., (film thickness of the CoFeX alloy/film thickness of the first magnetic layer 43) or (film thickness of the CoFeNiX alloy/film thickness of the first magnetic layer 43), is preferably in the range of 0.26 to 0.82. Further, the film thickness ratio of the area containing the element X in the range of 3 at % to 15 at % and formed of a CoFeX alloy or a CoFeNiX alloy is more preferably in the range of 0.26 to 0.82. By satisfying those conditions, the resistance change rate can be increased up to, e.g., 10.27% or higher and the sheet resistance change (ΔRs) can be increased from that obtained with the related art.

Alternatively, in the present invention, the film thickness ratio, i.e., (film thickness of the CoFeX alloy/film thickness of the first magnetic layer 43) or (film thickness of the CoFeNiX alloy/film thickness of the first magnetic layer 43), is preferably in the range of 0.12 to 0.61. Further, the film thickness ratio of the area containing the element X in the range of 3 at % to 15 at % and formed of a CoFeX alloy or a CoFeNiX alloy is more preferably in the range of 0.12 to 0.61. By satisfying those conditions, the resistance change rate (ΔR/R) can be increased from that obtained with the related art and the sheet resistance change (ΔRs) can be increased up to, e.g., 1.467 Ω/□ or higher. In addition, the unidirectional exchange bias magnetic field (Hex*) can be increased up to, e.g., 53 kA/m or higher.

Alternatively, in the present invention, the film thickness ratio, i.e., (film thickness of the CoFeX alloy/film thickness of the first magnetic layer 43) or (film thickness of the CoFeNiX alloy/film thickness of the first magnetic layer 43), is preferably in the range of 0.26 to 0.61. Further, the film thickness ratio of the area containing the element X in the range of 3 at % to 15 at % and formed of a CoFeX alloy or a CoFeNiX alloy is more preferably in the range of 0.26 to 0.61. By satisfying those conditions, the resistance change rate can be increased up to, e.g., 10.27% or higher and the unidirectional exchange bias magnetic field (Hex*) can be increased up to, e.g., 53 kA/m or higher.

Alternatively, in the present invention, the film thickness ratio, i.e., (film thickness of the CoFeX alloy/film thickness of the first magnetic layer 43) or (film thickness of the CoFeNiX alloy/film thickness of the first magnetic layer 43), is preferably in the range of 0.26 to 0.36. Further, the film thickness ratio of the area containing the element X in the range of 3 at % to 15 at % and formed of a CoFeX alloy or a CoFeNiX alloy is more preferably in the range of 0.26 to 0.36. By satisfying those conditions, the resistance change rate can be increased up to, e.g., 10.27% or higher and the coupling magnetic field based on the RKKY interaction can be increased. In addition, the unidirectional exchange bias magnetic field (Hex*) can be increased from that obtained with the related art.

In this first embodiment described above, the area not containing the element X is present in the first magnetic layer 43 near the interface 42a between the first magnetic layer 43 and the nonmagnetic intermediate layer 42. In the present invention, therefore, even when the first magnetic layer 43 contains the element X in its entirety, the coupling magnetic field based on the RKKY interaction generated between the first magnetic layer 43 and the second magnetic layer 41 can be satisfactorily increased if the first magnetic layer 43 has the film composition explained below.

Stated otherwise, the present invention includes an embodiment in which the content of the element X at the opposite surface 43a of the first magnetic layer 43 away from the interface 42a between the first magnetic layer 43 and the nonmagnetic intermediate layer 42 is larger than that at the interface 42a between the first magnetic layer 43 and the nonmagnetic intermediate layer 42.

In such an embodiment, a trace amount of the element X is contained even near the interface 42a between the first magnetic layer 43 and the nonmagnetic intermediate layer 42, and therefore the element X is contained in the entirety of the first magnetic layer 43.

However, the content of the element X near the interface 42a between the first magnetic layer 43 and the nonmagnetic intermediate layer 42 is very small as stated above. Preferably, the content of the element X in an area near the interface 43a is smaller than 3 at %, whereby the coupling magnetic field based on the RKKY interaction can be generated in a satisfactory magnitude between the first magnetic layer 43 and the second magnetic layer 41.

On the side near the opposite surface 43a of the first magnetic layer 43 away from the interface 42a between the first magnetic layer 43 and the nonmagnetic intermediate layer 42, the content of the element X in the first magnetic layer 43 is relatively large and preferably in the range of 3 at % to 15 at %. Satisfying that range contributes to satisfactorily increasing the value of specific resistance of the first magnetic layer 43, reducing the loss of the sensing current shunted to the first magnetic layer 43, and improving the resistance change rate ($\Delta R/R$).

With the film makeup described above, therefore, it is also possible to improve the resistance change rate, to increase the coupling magnetic field based on the RKKY interaction generated between the first magnetic layer 43 and the second magnetic layer 41, and to control the first magnetic layer 43 and the second magnetic layer 41 to be satisfactorily magnetized into the antiparallel state.

In the case in which the element X is present in the entirety of the first magnetic layer 43, the film thickness ratio of an area containing the element X in the range of 3 at % to 15 at % and formed of a CoFeX alloy or a CoFeNiX alloy is preferably larger than 0 but not larger than 0.61, or larger than 0 but not larger than 0.36, or in the range of 0.26 to 0.82, or in the range of 0.12 to 0.61, or in the range of 0.26 to 0.61.

In the first embodiment of FIG. 1, similarly to the first magnetic layer 43 of the free magnetic layer 1, the first magnetic layer 13 of the pinned magnetic layer 3 of the multilayered ferri-structure is also preferably made up of an area E containing the element X and an area F not containing the element X.

The materials and the composition ratio of the first magnetic layer 13, the ratio of the film thickness in the first magnetic layer 13 in which the element X is contained at 3 at % or higher, etc. are the same as those in the first magnetic layer 43 constituting the free magnetic layer 1.

When the area E containing the element X is present on the side near an interface 4a between the first magnetic layer 13 and the antiferromagnetic layer 4 as shown in FIG. 1, the exchange coupling magnetic field (Hex) generated between the antiferromagnetic layer 4 and the area E containing the element X is increased in comparison with the case in which the area F not containing the element X is formed in contact with the interface 4a between the first magnetic layer 13 and the antiferromagnetic layer 4.

Also, with the presence of the area F not containing the element X on the side near the interface 4a between the first magnetic layer 13 and the nonmagnetic intermediate layer 12, the coupling magnetic field based on the RKKY interaction generated between the upper and lower magnetic layers 11 and 13 with the nonmagnetic intermediate layer 12 interposed therebetween is increased in comparison with the case in which the area E containing the element X is formed in contact with an interface 12a between the first magnetic layer 13 and the nonmagnetic intermediate layer 12.

Thus, by providing, in the first magnetic layer 13 constituting the pinned magnetic layer 3, the magnetic area E containing the element X on the side in contact with the interface 4a between the first magnetic layer 13 and the antiferromagnetic layer 4 and the magnetic area F not containing the element X on the side in contact with the interface 12a between the first magnetic layer 13 and the nonmagnetic intermediate layer 12, it is possible to increase the exchange coupling magnetic field (Hex) generated between the first magnetic layer 13 and the antiferromagnetic layer 4, and to increase the coupling magnetic field based on the RKKY interaction. Hence, the unidirectional exchange bias magnetic field (Hex*) in the pinned magnetic layer 3 can be satisfactorily increased from that obtained with the related art.

Herein, the term "unidirectional exchange bias magnetic field (Hex*)" represents a resultant magnetic field of the exchange coupling magnetic field (Hex) primarily generated between the antiferromagnetic layer 4 and the first magnetic layer 13 and the coupling magnetic field based on the RKKY interaction generated between the first magnetic layer 13 and the second magnetic layer 11.

Also, with this first embodiment, since the magnetic area containing the element X and having a high specific resistance is present on the side near the interface 4a between the first magnetic layer 13 and the antiferromagnetic layer 4, the amount of the sensing current shunted to the first magnetic layer 13, i.e., the so-called shunt loss, can be reduced and the resistance change rate ($\Delta R/R$) can be further improved.

Thus, with this first embodiment, it is possible to increase the unidirectional exchange bias magnetic field (Hex*) in the pinned magnetic layer 3, to improve the reliability in energization, which is represented by resistance against electro-migration, and to improve the resistance change rate ($\Delta R/R$).

Moreover, heat treatment is carried out on the first magnetic layer 13 to generate an exchange coupling magnetic field between the pinned magnetic layer 3 and the antiferromagnetic layer 4. On that occasion, thermal diffusion of the element X constituting the element X occurs, whereupon the first magnetic layer 13 includes an area in which the content of the element X gradually reduces from the interface 4a between the pinned magnetic layer 3 and the antiferromagnetic layer 4 toward the interface 12a between the pinned magnetic layer 3 and the nonmagnetic intermediate layer 12.

Note that, in the present invention, the pinned magnetic layer 3 is not necessarily of a multilayered ferri-structure, and it may be of a single layer structure or a multilayered structure comprising one or more layers of magnetic materials such as a CoFe alloy, for example.

Figure 2:
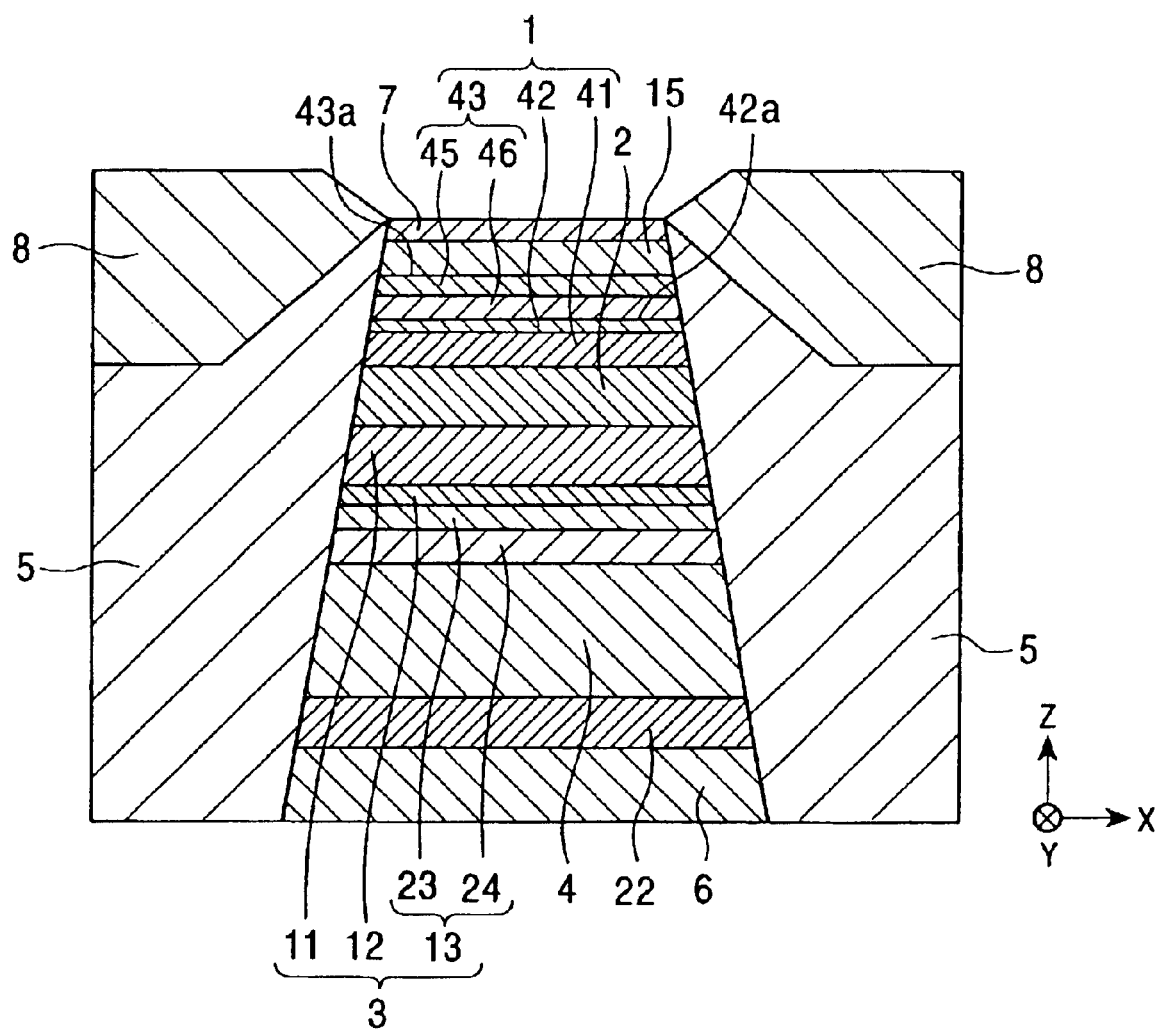
FIG. 2 is a partial sectional view of a structure of a magnetic sensor according to a second embodiment of the present invention, looking from a side facing a recording medium.

In a magnetic sensor show in FIG. 2 (which is a partial sectional view of a magnetic sensor according to a second embodiment of the present invention, looking from a side facing a recording medium), the first magnetic layer 43 constituting the free magnetic layer 1 is of a two-layered structure made up of a magnetic layer 45 and a magnetic layer 46.

In this second embodiment, of the magnetic layers 45 and 46, the magnetic layer 45 positioned nearer to the opposite surface 43a (on the side contacting the backed layer 15) of the first magnetic layer 43 away from the interface 42a between the first magnetic layer 43 and the nonmagnetic intermediate layer 42 is made of a magnetic material containing an element X (X represents at least one element selected from among Cr, Ti, V, Zr, Nb, Mo, Hf, Ta and W). On the other hand, the magnetic layer 46 on the side contacting the nonmagnetic intermediate layer 42 is formed of a magnetic material not containing the element X.

In this second embodiment, preferably, the magnetic layer 45 is formed of a CoFeX alloy and the magnetic layer 46 is formed of a CoFe alloy. As an alternative, preferably, the magnetic layer 45 is formed of a CoFeNiX alloy and the magnetic layer 46 is formed of a CoFeNi alloy. The use of those alloys makes it possible to satisfactorily increase the coupling magnetic field based on the RKKY interaction generated between the first magnetic layer 43 and the second magnetic layer 41, and to satisfactorily control magnetization of the free magnetic layer 1.

With this second embodiment, since the magnetic layer 46 not containing the element X is formed on the side contacting the nonmagnetic intermediate layer 42, the coupling magnetic field based on the RKKY interaction generated between the first magnetic layer 43 and the second magnetic layer 41 can be increased in comparison with the case in which the magnetic layer 45 containing the element X is formed in contact with the nonmagnetic intermediate layer 42.

Further, with this second embodiment, since the magnetic layer 45 containing the element X and having a high specific resistance is formed on the side near the opposite surface 43a of the first magnetic layer 43 away from the interface 42a between the first magnetic layer 43 and the nonmagnetic intermediate layer 42, the amount of the sensing current shunted from the electrode layer 8 to the first magnetic layer 43, i.e., the so-called shunt loss, can be reduced and the resistance change rate ($\Delta R/R$) can be improved.

Thus, according to this second embodiment, it is possible to increase the coupling magnetic field based on the RKKY interaction generated between the first magnetic layer 43 and the second magnetic layer 41 constituting the free magnetic layer 1, to control the first magnetic layer 43 and the second magnetic layer 41 to be satisfactorily magnetized into the antiparallel state, and to improve the resistance change rate ($\Delta R/R$). In addition, a magnetic sensor satisfactorily adaptable for a higher recording density expected in the future can be manufactured.

In this second embodiment, the first magnetic layer 43 is of the two-layered structure unlike the first embodiment shown in FIG. 1. Although the first magnetic layer 43 in FIG. 1 has a two-layered structure in the film forming stage as with the first magnetic layer 43 in FIG. 2, thermal diffusion occurs at the boundary between the two magnetic layers during the heat treatment carried out under a magnetic field. As a result, the first magnetic layer 43 in FIG. 1 is eventually completed as a single layer.

On the other hand, in the second embodiment of FIG. 2, the first magnetic layer 43 is completed as the two-layered structure, for example, by using an antiferromagnetic material that is able to generate the exchange coupling magnetic field (Hex) between the antiferromagnetic layer 4 and the pinned magnetic layer 3 without carrying out the heat treatment on the antiferromagnetic layer 4. As another case, even when the heat treatment is needed, the heat treatment is carried out under such a weak condition that the thermal diffusion will not occur between the two magnetic layers 45 and 46.

Eventually, the second embodiment of FIG. 2 is completed while the first magnetic layer 43 is held in the multilayered structure made up of the two magnetic layers 45 and 46.

Although the first magnetic layer 43 in FIG. 2 is of the two-layered structure made up of the two magnetic layers 45 and 46, it may comprise three or more layers. Also in that case, a magnetic layer containing the element X and formed of a CoFeX alloy or a CoFeNiX alloy is formed in a position on the side near the opposite surface 43a of the first magnetic layer 43 away from the interface 42a between the first magnetic layer 43 and the nonmagnetic intermediate layer 42, whereas a magnetic layer not containing the element X and formed of a CoFe alloy or a CoFeNi alloy is formed on the side contacting the interface 42a between the first magnetic layer 43 and the nonmagnetic intermediate layer 42.

Further, in FIG. 2, the film thickness of the magnetic layer 45 containing the element X is preferably in the range of 3 to 15 Å, and the film thickness of the magnetic layer 46 not containing the element X is preferably in the range of 3 to 15 Å. Moreover, the film thickness of the magnetic layer 45 containing the element X is preferably larger than 0% but not larger than 85% with respect to the film thickness of the first magnetic layer 43.

In addition, the composition ratio of the element X is preferably in the range of 3 at % to 15 at %.

By satisfying those conditions, it is possible to effectively increase the magnetic layer 45 containing the element X, to reduce the loss of the sensing current shunted to the first magnetic layer 43, and to appropriately improve the resistance change rate ($\Delta R/R$).

In this second embodiment, when the magnetic layer 45 containing the element X is formed of a CoFeX alloy or a CoFeNiX alloy and the magnetic layer 46 not containing the element X is formed of a CoFe alloy or a CoFeNi alloy, the film thickness ratio of the magnetic layer 45 formed of a CoFeX alloy or a CoFeNiX alloy to the first magnetic layer 43, i.e., (film thickness of the CoFeX-alloy/film thickness of the first magnetic layer 43) or (film thickness of the CoFeNiX alloy/film thickness of the first magnetic layer 43), is preferably larger than 0 but not larger than 0.61. By satisfying that condition, the resistance change rate can be increased from that obtained with the related art (in which the first magnetic layer is formed of only CoFe or CoFeNi, this is similarly applied to the following description). Further, in the exchange biasing method described later in connection with FIGS. 4 to 8, the unidirectional exchange bias magnetic field (Hex*) in both end portions of the free magnetic layer 1 can be increased from, e.g., 53 kA/m.

Alternatively, in the present invention, the film thickness ratio, i.e., (film thickness of the magnetic layer 45 formed of a CoFeX alloy/film thickness of the first magnetic layer 43) or (film thickness of the magnetic layer 45 formed of a CoFeNiX alloy/film thickness of the first magnetic layer 43), is preferably larger than 0 but not larger than 0.36. By satisfying that condition, the coupling magnetic field based on the RKKY interaction can be increased. Further, in the exchange biasing method shown in FIGS. 4 to 8, the unidirectional exchange bias magnetic field (Hex*) in both end portions of the free magnetic layer 1 can be increased from that obtained with the related art.

Alternatively, in the present invention, the film thickness ratio, i.e., (film thickness of the magnetic layer 45 formed of a CoFeX alloy/film thickness of the first magnetic layer 43) or (film thickness of the magnetic layer 45 formed of a CoFeNiX alloy/film thickness of the first magnetic layer 43), is preferably in the range of 0.26 to 0.82. By satisfying that condition, the resistance change rate can be increased up to, e.g., 10.27% or higher and the sheet resistance change ($\Delta Rs$) can be increased from that obtained with the related art.

Alternatively, in the present invention, the film thickness ratio, i.e., (film thickness of the magnetic layer 45 formed of a CoFeX alloy/film thickness of the first magnetic layer 43) or (film thickness of the magnetic layer 45 formed of a CoFeNiX alloy/film thickness of the first magnetic layer 43), is preferably in the range of 0.12 to 0.61. By satisfying that condition, the resistance change rate ($\Delta R/R$) can be increased from that obtained with the related art and the sheet resistance change ($\Delta Rs$) can be increased up to, e.g., 1.467 $\Omega/\square$ or higher. In addition, the unidirectional exchange bias magnetic field (Hex*) can be increased up to, e.g., 53 kA/m or higher.

Alternatively, in the present invention, the film thickness ratio, i.e., (film thickness of the magnetic layer 45 formed of a CoFeX alloy/film thickness of the first magnetic layer 43) or (film thickness of the magnetic layer 45 formed of a CoFeNiX alloy/film thickness of the first magnetic layer 43), is preferably in the range of 0.26 to 0.61. By satisfying that condition, the resistance change rate can be increased up to, e.g., 10.27% or higher and the unidirectional exchange bias magnetic field (Hex*) can be increased up to, e.g., 53 kA/m or higher.

Alternatively, in the present invention, the film thickness ratio, i.e., (film thickness of the magnetic layer 45 formed of a CoFeX alloy/film thickness of the first magnetic layer 43) or (film thickness of the magnetic layer 45 formed of a CoFeNiX alloy/film thickness of the first magnetic layer 43), is preferably in the range of 0.26 to 0.36. By satisfying that condition, the resistance change rate can be increased up to, e.g., 10.27% or higher and the coupling magnetic field based on the RKKY interaction can be increased. In addition, the unidirectional exchange bias magnetic field (Hex*) can be increased from that obtained with the related art.

In the second embodiment shown in FIG. 2, the pinned magnetic layer 3 is also of a multilayered ferri-structure. More specifically, the first magnetic layer 13 constituting the pinned magnetic layer 3 is of a multilayered structure made up of two magnetic layers 23, 24.

The magnetic layer 23 is a magnetic area containing the element X, and the magnetic layer 24 is a magnetic area not containing the element X. With the presence of the magnetic layer 23 containing the element X on the side near an interface between the first magnetic layer 13 and the antiferromagnetic layer 4, the exchange coupling magnetic field (Hex) generated between the antiferromagnetic layer 4 and the magnetic layer 23 can be increased. It is also possible to increase the specific resistance of the magnetic layer 23, to reduce the loss of the sensing current shunted to the first magnetic layer 13, i.e., the so-called shunt loss, and to improve the resistance change rate (ΔR/R). Further, with the presence of the magnetic layer 24 not containing the element X on the side near an interface between the first magnetic layer 13 and the nonmagnetic intermediate layer 12, the coupling magnetic field based on the RKKY interaction generated between the first magnetic layer 13 and the second magnetic layer 11 can be increased.

Thus, according to this second embodiment, the unidirectional exchange bias magnetic field (Hex*) in the pinned magnetic layer 3 can be increased from that obtained with the related art, and the reliability in energization can be enhanced. In addition, the resistance change rate (ΔR/R) can be improved and a magnetic sensor satisfactorily adaptable for a higher recording density expected in the future can be manufactured.

Figure 3:
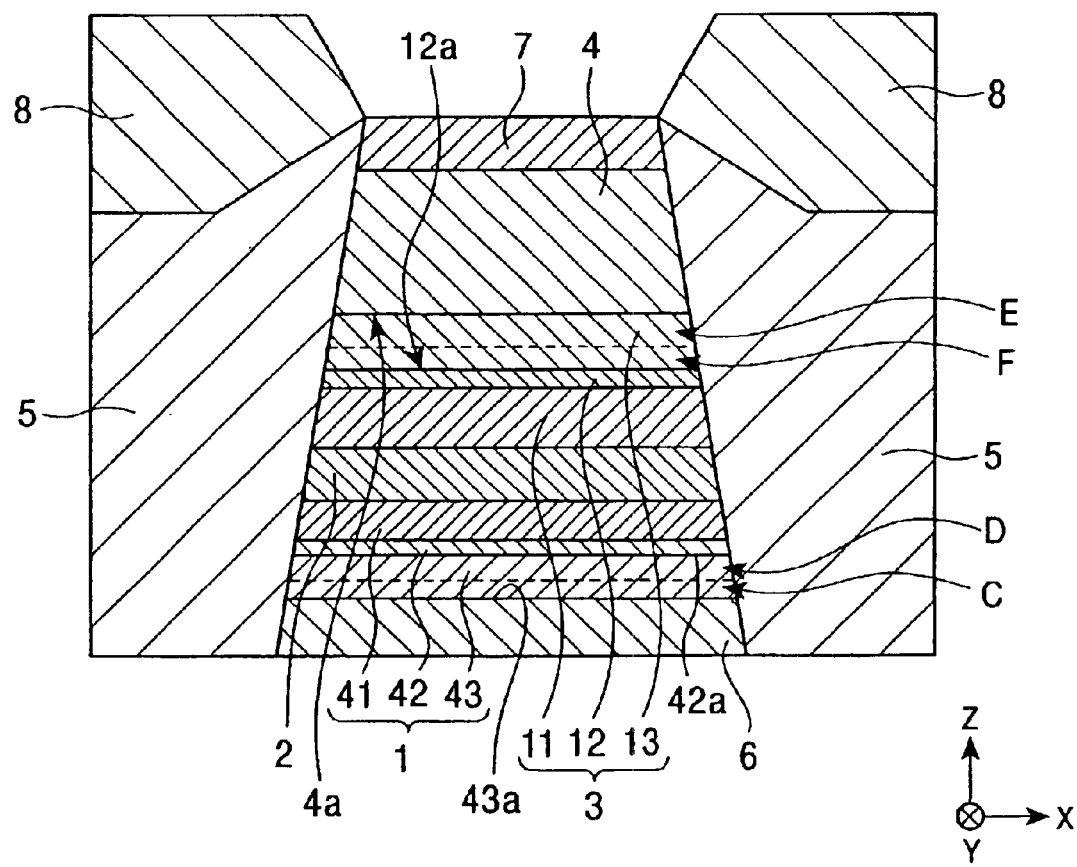
FIG. 3 is a partial sectional view of a structure of a magnetic sensor according to a third embodiment of the present invention, looking from a side facing a recording medium.

FIG. 3 is a partial sectional view of a structure of a magnetic sensor (single spin-valve type magnetoresistive sensor) according to a third embodiment of the present invention, looking from a side facing a recording medium. Note that, in FIG. 3, the same numerals as those in FIGS. 1 and 2 denote the same layers as those in FIGS. 1 and 2.

In FIG. 3, a free magnetic layer 1 is formed below an antiferromagnetic layer 4, and the multilayered structure is reversed to that shown in FIGS. 1 and 2.

As shown in FIG. 3, the free magnetic layer 1 is of a three-layered structure made up of a second magnetic layer 41 formed in contact with the nonmagnetic material layer 2, a nonmagnetic intermediate layer 42, and a first magnetic layer 43 formed in an opposing relation to the second magnetic layer 41 with the nonmagnetic intermediate layer 42 interposed therebetween.

Also in this third embodiment, the first magnetic layer 43 includes an area C formed of a magnetic material containing the element X and located on the side near an opposite surface 43a of the first magnetic layer 43 away from an interface 42a between the first magnetic layer 43 and the nonmagnetic intermediate layer 42, and an area D formed of a magnetic material not containing the element X located on the side near the interface 42a between the first magnetic layer 43 and the nonmagnetic intermediate layer 42.

Preferably, the area C is formed of a CoFeX alloy or a CoFeNiX alloy, and the area D is formed of a CoFe alloy or a CoFeNi alloy.

With the presence of the area D not containing the element X on the side near the interface 42a between the first magnetic layer 43 and the nonmagnetic intermediate layer 42, the coupling magnetic field based on the RKKY reaction generated between the first magnetic layer 43 and the nonmagnetic intermediate layer 42 can be increased so that magnetization of the first magnetic layer 43 and magnetization of the second magnetic layer 41 can be satisfactorily held in the antiparallel state.

Further, since the first magnetic layer 43 includes the area C containing the element X positioned away from the nonmagnetic intermediate layer 42 and the area C is an area having a high specific resistance with addition of the element X, it is possible to reduce the loss of the sensing current shunted from the electrode layer 8 to the first magnetic layer 43, i.e., the so-called shunt loss, and hence to improve the resistance change rate (ΔR/R).

Thus, according to this third embodiment, the coupling magnetic field based on the RKKY interaction generated between the first magnetic layer 43 and the second magnetic layer 41 both constituting the free magnetic layer 1 can be increased so that magnetization of the first magnetic layer 43 and magnetization of the second magnetic layer 41 can be satisfactorily held in the antiparallel state. Moreover, the reproduction characteristics can be improved and the resistance change rate (ΔR/R) can be increased. As a result, a magnetic sensor satisfactorily adaptable for a higher recording density expected in the future can be manufactured.

Additionally, in the third embodiment shown in FIG. 3, the pinned magnetic layer 3 is also of a multilayered ferri-structure. More specifically, as with the first magnetic layer 43 of the free magnetic layer 1, a first magnetic layer 13 constituting the pinned magnetic layer 3 is made of up an area E containing the element X and an area F not containing the element X. However, the pinned magnetic layer 3 may be of a single layer structure or a multilayered structure of one or more magnetic materials.

Note that the materials, composition ratio, film thickness, film thickness ratio, etc. used in the first magnetic layer 43, the nonmagnetic intermediate layer 42 and the second magnetic layer 41, which constitute the free magnetic layer 1, are the same as those described above in connection with FIGS. 1 and 2, and a reference should be made on the above description.

A method of manufacturing the magnetic sensors shown in FIGS. 1 to 3 comprises the steps of forming multilayered films from the buffer layer 6 to the barrier layer 7, shaping a resulting laminate substantially into the trapezoidal form as shown by, e.g., ion milling, and then forming the hard bias layer 5 and the electrode layer 8 on each of both sides of the laminate in the track-width direction.

The magnetic sensors shown in FIGS. 1 to 3 have the so-called CIP (current in the plane) type structure in which the hard bias layer 5 and the electrode layer 8 are formed on each of both sides of the magnetic sensor in the track-width direction (X-direction in the figures), and an electrical current flows through the laminate including from the buffer layer 6 to the barrier layer 7 in a direction parallel to the film surface of each layer within the magnetic sensor.

Figure 4:
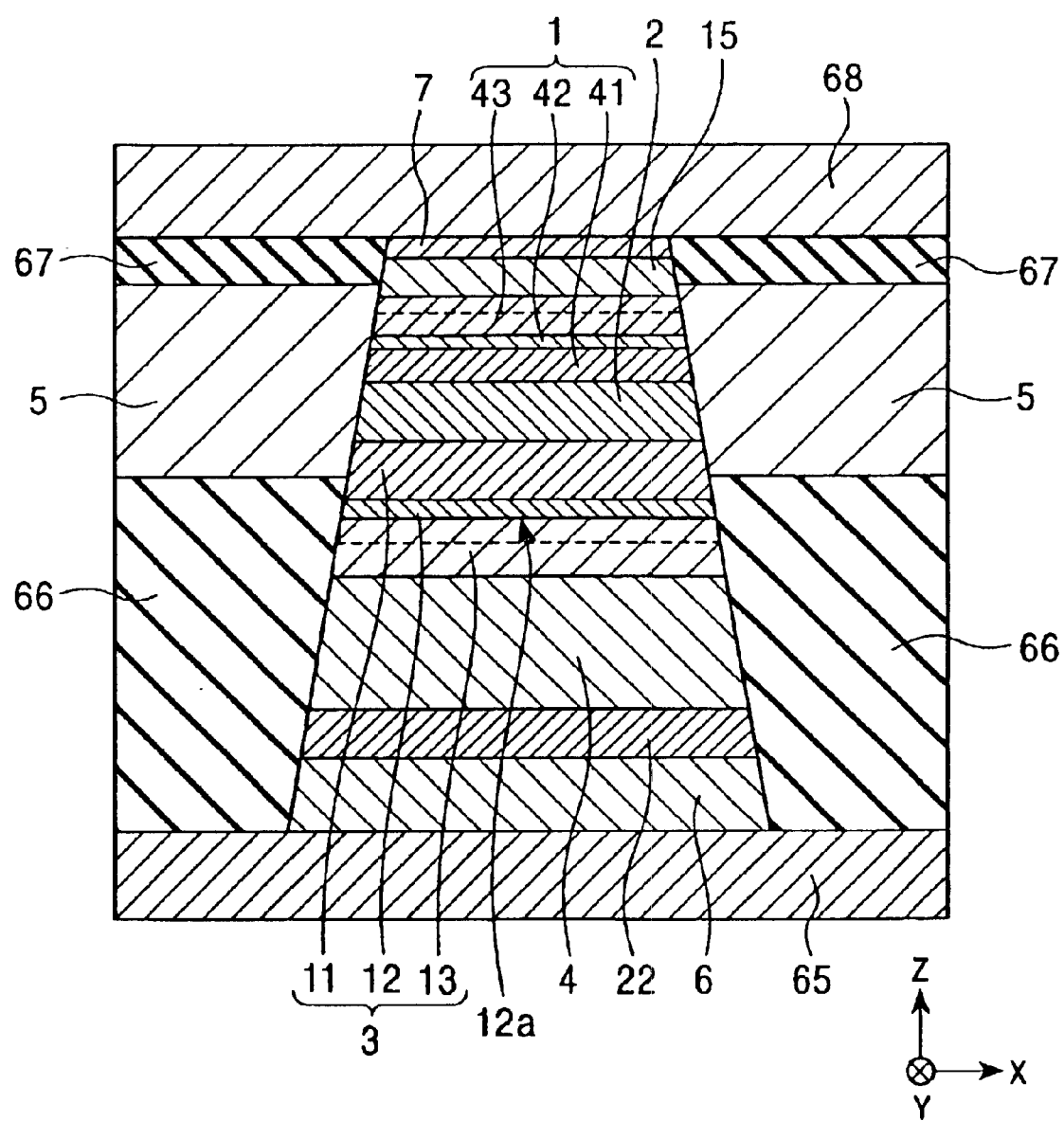
FIG. 4 is a partial sectional view of a structure of a magnetic sensor according to a fourth embodiment of the present invention, looking from a side facing a recording medium.

On the other hand, a magnetic sensor shown in FIG. 4 has the so-called CPP (current perpendicular to the plane) type structure in which electrode layers 65, 68 are formed respectively on and under the laminate, and an electrical current applied from the electrode layers 65, 68 into the laminate flows in a direction perpendicular to the film surface of each layer of the laminate. The present invention is also applicable to the CPP type magnetic sensor.

The multilayered structure of the laminate is the same as that shown in FIG. 1 and hence it is not described here. Note that the buffer layer 6 and/or the seed layer 22 may be omitted.

In a fourth embodiment shown in FIG. 4, a lower shield layer 65 serving also as a lower electrode is disposed under the buffer layer 6. The lower shield layer 65 is formed of a magnetic material, e.g., Permalloy (NiFe), by plating.

Further, on each of both sides of the laminate in the track-width direction (X-direction in FIG. 4), an insulating layer 66, a hard bias layer 5 and an insulating layer 67 are successively formed from that bottom in that order. The insulating layers 66, 67 are each made of, e.g., $Al_2O_3$ or $SiO_2$. The hard bias layer 5 is formed in a position where the hard bias layer 5 faces at least one magnetic layer of the free magnetic layer 1 in the X-direction in FIG. 4. As shown in FIG. 4, the hard bias layer 5 may be positioned to face the whole of each of both lateral surfaces of the free magnetic layer 1 in the X-direction.

Also, as shown in FIG. 4, an upper shield layer 68 serving also as an upper electrode is formed in a covering relation to the barrier layer 7 and the insulating layers 67 on both sides of the barrier layer 7.

Thus, in the magnetic sensor shown in FIG. 4, the shield layers 65, 68 serving also as electrodes are disposed respectively on and under the laminate, and an electrical current flows between the shield layers 65 and 68 in the direction perpendicular to the film surface of each layer within the laminate.

With the magnetic sensor shown in FIG. 4, since the hard bias layer 5 is covered with the insulating layer 66, 67 from above and below, the current flowing from the upper shield layer 68 into the laminate is not shunted to the hard bias layer 5, whereby the current satisfactorily flows within the laminate. By employing the structure of the magnetic sensor shown in FIG. 4, therefore, a CPP type magnetic sensor can be manufactured in which a current path is prevented from widening beyond the track width Tw and a higher reproduction output is obtained.

In the magnetic sensor shown in FIG. 4, the nonmagnetic material layer 2 constituting the magnetic sensor may be made of a nonmagnetic electrically conductive material, e.g., Cu. Alternatively, the nonmagnetic material layer 2 may be made of an insulating material, e.g., $Al_2O_3$ or $SiO_2$. The magnetic sensor using a nonmagnetic electrically conductive material has a structure called a spin-valve type giant magnetoresistive sensor (CPP-GMR), and the magnetic sensor using an insulating material has a structure called a spin-valve tunneling type magnetoresistive sensor (CPP-TMR).

In a tunneling type magnetoresistive sensor, a resistance change is generated based on the spin tunneling effect. When the pinned magnetic layer 3 and the free magnetic layer 1 are magnetized in the antiparallel state, the tunneling current is hardest to flow through the nonmagnetic material layer 2 and the resistance value is maximized. On the other hand, when the pinned magnetic layer 3 and the free magnetic layer 1 are magnetized parallel to each other, the tunneling current is easiest to flow through the nonmagnetic material layer 2 and the resistance value is minimized.

Based on that principle, the magnetization of the free magnetic layer 1 varies under the effect of an external magnetic field. A resulting change of the electrical resistance is taken as a voltage change (in the constant-current operation) or a current change (in the constant-voltage operation), whereby a magnetic field leaked from a recording medium is detected.

Note that the film makeup of the laminate shown in FIG. 4 is the same as that shown in FIG. 1, but the multilayered structure may be the same as that shown in FIG. 2 or 3.

Figure 5:
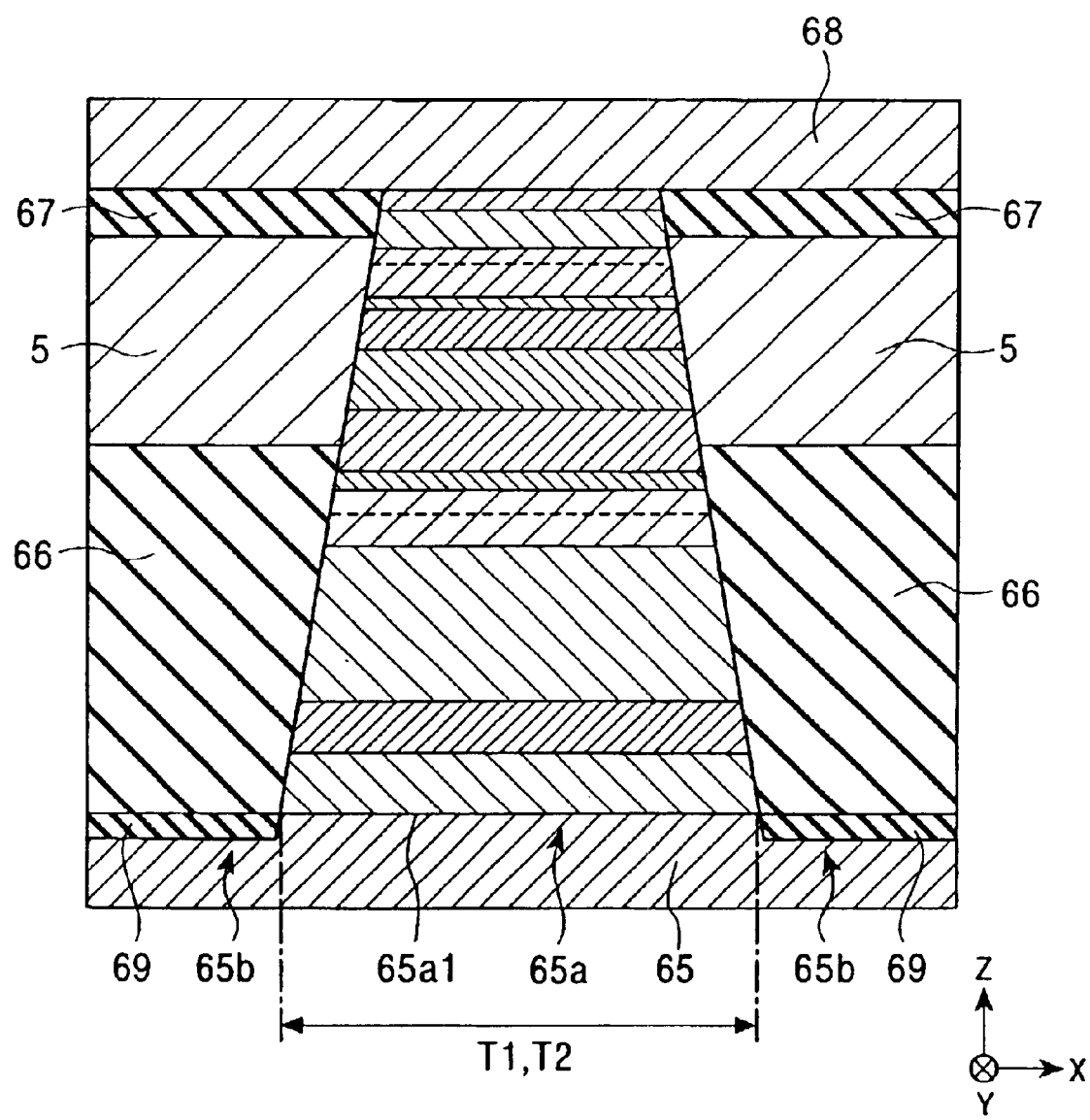
FIG. 5 is a partial sectional view of a structure of a magnetic sensor according to a fifth embodiment of the present invention, looking from a side facing a recording medium.

In a fifth embodiment shown in FIG. 5, the lower shield layer 65 serving also as the lower electrode has a projection 65a projected in its central portion in the track-width direction (X-direction in FIG. 5) to project in a multilayered direction of the magnetic sensor (Z-direction in FIG. 5). An upper surface 65a1 of the projection 65a contacts a bottom surface of the laminate so that an electrical current flows from the projection 65a into the laminate (or from the laminate into the projection 65a).

Further, in the fifth embodiment shown in FIG. 5, an insulating layer 69 is disposed between the insulating layer 66 and each of both end portions 65b of the lower shield layer 65 in the track-width direction (X-direction). The insulating layer 69 is made of an insulating material such as $Al_2O_3$, $SiO_2$, AlN, Al—Si—O, $Ti_2O_3$ or $Ti_3O_5$.

The fifth embodiment shown in FIG. 5 has the advantage that the projection 65a formed on the lower shield layer 65 narrows the current path in the magnetic sensor.

With the insulating layer 69 disposed on each of both the end portions 65b of the lower shield layer 65, even if the insulating layer 66 is not formed and the hard bias layer 5 is formed in contact with the insulating layer 69, an electrical current can be satisfactorily suppressed from being shunted from both the end portions 65b into the hard bias layers 5, and a magnetic sensor having a high reproduction output and a narrow effective track width can be more effectively manufactured.

In the above case not providing the insulating layer 66, however, a width T1 of the upper surface 65a1 of the projection 65a in the track-width direction is preferably set equal to or smaller than a width T2 of the bottom surface of the laminate in the track-width direction because the loss of the sensing current shunted to the hard bias layer 5 can be satisfactorily suppressed. The insulating layer 66 and the insulating layer 69 may be formed as a single insulating layer.

In the above-described magnetic sensors shown in FIGS. 1 to 5, the free magnetic layer 1 is of the multilayered ferri-structure and the hard bias layer 5 is formed on each of both sides of the free magnetic layer 1 in the track-width direction (X-direction). Then, magnetization of the free magnetic layer 1 is controlled by the longitudinal bias magnetic field applied from the hard bias layer 5 and the coupling magnetic field based on the RKKY interaction generated between the first magnetic layer 43 and the second magnetic layer 41 both constituting the free magnetic layer 1. On the other hand, magnetic sensors described later, shown in FIGS. 6 to 17, have a structure in which antiferromagnetic layers are formed on the free magnetic layer 1 in the track-width direction (X-direction) while leaving a predetermined spacing therebetween, and the magnetization of the free magnetic layer 1 is controlled by the exchange biasing method. The structures of the magnetic sensors shown in FIGS. 6 to 17 will be described below.

Figure 6:
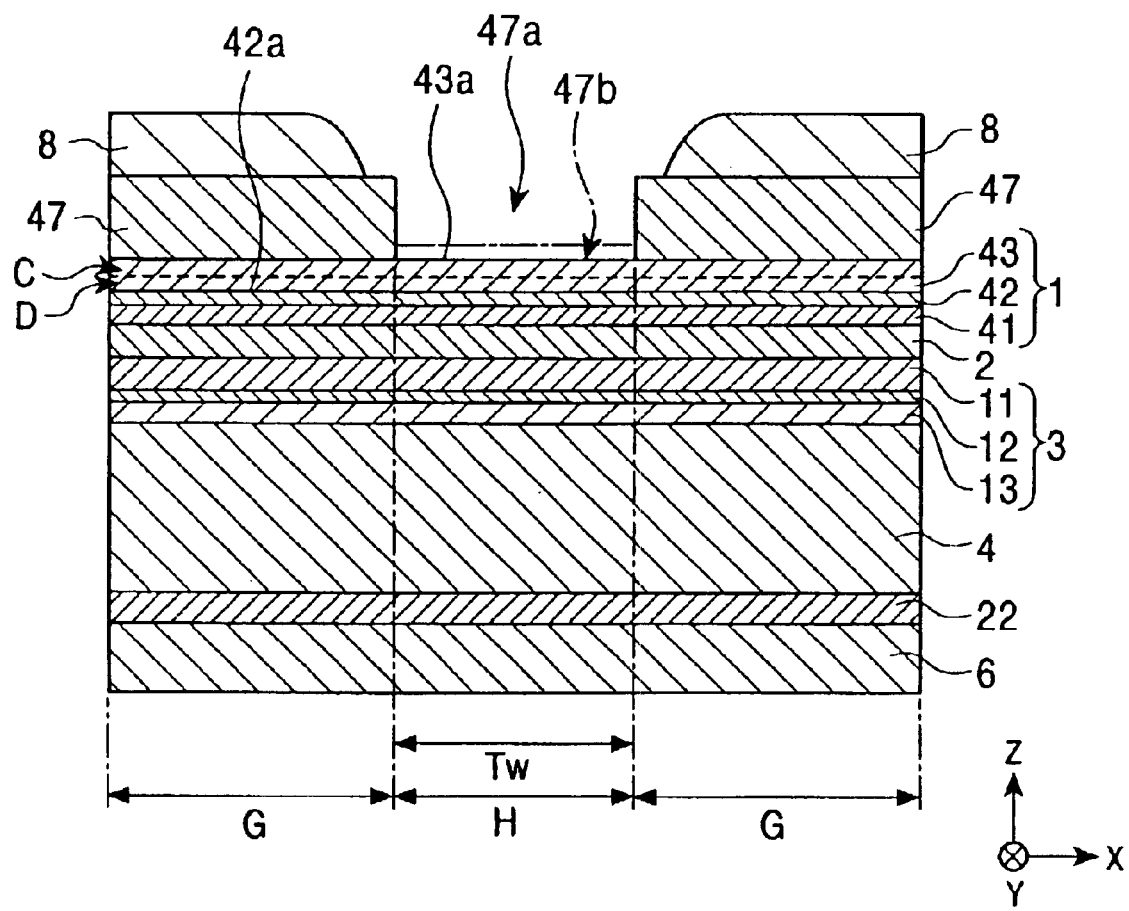
FIG. 6 is a partial sectional view of a structure of a magnetic sensor according to a sixth embodiment of the present invention, looking from a side facing a recording medium.

FIG. 6 is a partial sectional view of a structure of a magnetic sensor according to a sixth embodiment of the present invention, looking from a side facing a recording medium. Note that, in FIG. 6, the same numerals as those in FIG. 1 denote the same layers as those in FIG. 1.

In this sixth embodiment, second antiferromagnetic layers (exchange bias layers) 47 are formed on a free magnetic layer 1 in the track-width direction (X-direction) while leaving a predetermined spacing (=a track width Tw) therebetween. An antiferromagnetic layer may be disposed between the second antiferromagnetic layer 47 and the free magnetic layer 1.

A nonmagnetic layer made of, e.g., Ta may be disposed on a portion of the free magnetic layer 1 which is exposed to the outside in a spacing 47a between the second antiferromagnetic layers 47. Also, the nonmagnetic layer may be a specular layer (mirror reflecting layer) made of an oxide of Ta, for example.

As shown in FIG. 6, the free magnetic layer 1 is of a multilayered ferri-structure similarly to that shown in FIG. 1. More specifically, a first magnetic layer 43 constituting the free magnetic layer 1 includes a magnetic area C which is positioned nearer to an opposite surface 43a (on the side confronting the second antiferromagnetic layer 47) of the first magnetic layer 43 away from an interface 42a between the first magnetic layer 43 and a nonmagnetic intermediate layer 42 and which contains an element X (X represents at least one element selected from among Cr, Ti, V, Zr, Nb, Mo, Hf, Ta and W), and a magnetic area D which is located on the side contacting the interface 42a between the first magnetic layer 43 and the nonmagnetic intermediate layer 42 and which does not contain the element X.

Preferably, the magnetic area C is formed of a CoFeX alloy or a CoFeNiX alloy, and the magnetic area D is formed of a CoFe alloy or a CoFeNi alloy.

With such an arrangement that the magnetic area C containing the element X is formed in the first magnetic layer 43 constituting the free magnetic layer 1 on the side contacting the second antiferromagnetic layer 47, the exchange coupling magnetic field (Hex) generated between the first magnetic layer 43 and the second antiferromagnetic layer 47 can be increased.

Further, since the magnetic area D not containing the element X is present in the first magnetic layer 43 on the side contacting the nonmagnetic intermediate layer 42, the coupling magnetic field based on the RKKY interaction generated between the first magnetic layer 43 and the second magnetic layer 41 can be increased.

As a result, the unidirectional exchange bias magnetic field (Hex*) in both the end portions G of the free magnetic layer 1 can be increased from that obtained with the related art.

Accordingly, magnetization in both the end portions G of the free magnetic layer 1 can be appropriately pinned. On the other hand, a central portion H of the free magnetic layer 1 is put into a weak single domain state in which magnetization is reversible in response to an external magnetic field. With the structure shown in FIG. 6, therefore, the magnetization of the free magnetic layer 1 can be satisfactorily controlled.

Moreover, since the first magnetic layer 43 includes the magnetic area C containing the element X and having a high specific resistance, the amount of the sensing current shunted from the electrode layer 8 to the first magnetic layer 43, i.e., the so-called shunt loss, can be reduced and the resistance change rate ($\Delta R/R$) can be satisfactorily improved.

Thus, according to the sixth embodiment shown in FIG. 6, it is possible to increase the unidirectional exchange bias magnetic field (Hex*) in both the end portions G of the free magnetic layer 1, to satisfactorily control the magnetization of the free magnetic layer 1, and to improve the resistance change rate ($\Delta R/R$). In addition, a magnetic sensor satisfactorily adaptable for a higher recording density expected in the future can be manufactured.

Note that the materials, composition ratio, film thickness, etc. used in the first magnetic layer 43, the nonmagnetic intermediate layer 42 and the second magnetic layer 41, which constitute the free magnetic layer 1, are the same as those described above in connection with FIG. 1, and a reference should be made on the above description. Also, the film makeup of the first magnetic layer 43 may be modified such that the magnetic area D contains the element X, but the content is very small as described in connection with FIG. 1, or that the first magnetic layer 43 is of a two-layered structure as described in connection with FIG. 2.

Additionally, the first magnetic layer 13 constituting the pinned magnetic layer 3 may also be formed of the same structure as that of the first magnetic layer 43 of the free magnetic layer 1.

As mentioned above, a ferromagnetic layer may be formed between the free magnetic layer 1 and the second antiferromagnetic layer 47. In that case, the ferromagnetic layer is preferably formed of, e.g., a CoFeX alloy or a CoFeNiX alloy containing the element X.

Using such an alloy contributes to increasing the coupling magnetic field generated between the ferromagnetic layer and the second antiferromagnetic layer 47. It is hence possible to more satisfactorily increase the unidirectional exchange bias magnetic field (Hex*) in both the end portions G of the free magnetic layer 1 and to more satisfactorily control the magnetization of the first magnetic layer 43.

When the ferromagnetic layer is interposed between the free magnetic layer 1 and the second antiferromagnetic layer 47, it may also be formed on the central portion H of the free magnetic layer 1. Alternatively, as denoted by a one-dot-chain in FIG. 6, a central part 47b of the second antiferromagnetic layer 47 may be formed on the central portion H of the free magnetic layer 1. In that case, the above-mentioned ferromagnetic layer may be interposed between the free magnetic layer 1 and the central second antiferromagnetic layer 47b formed on the central portion H of the free magnetic layer 1.

However, when the central second antiferromagnetic layer 47b is partly formed on the central portion H of the free magnetic layer 1, the central second antiferromagnetic layer 47b must be formed in a small film thickness (not larger than 50 Å) so that the exchange coupling magnetic field will not be generated between the central second antiferromagnetic layer 47b and the central portion H of the free magnetic layer 1, or its value is very small even though generated. If a large exchange coupling magnetic field is generated between the central second antiferromagnetic layer 47b and the central portion H of the free magnetic layer 1, magnetization of the free magnetic layer 1 would be fixed in the central portion H and the sensitivity of the free magnetic layer 1 to an external magnetic field would be reduced, thus resulting in deterioration of the reproduction characteristics.

A method of manufacturing the magnetic sensors shown in FIG. 6 comprises, by way of example, the steps of forming multilayered films from the buffer layer 6 to the second antiferromagnetic layer 47 in succession, cutting in a central portion H of the second antiferromagnetic layer 47 by ion milling, and then forming the spacing (hole) 47a between the separated second antiferromagnetic layers 47 and 47 as shown in FIG. 6.

Figure 7:
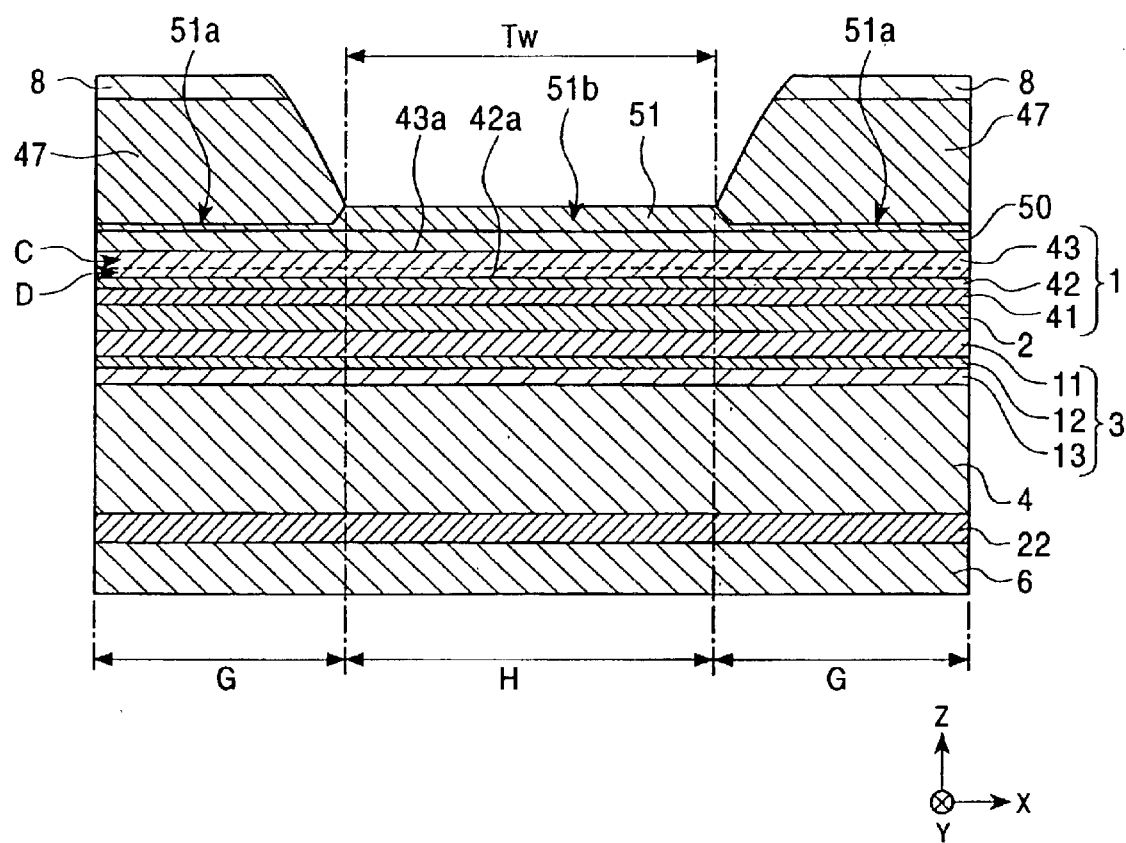
FIG. 7 is a partial sectional view of a structure of a magnetic sensor according to a seventh embodiment of the present invention, looking from a side facing a recording medium.

FIG. 7 shows a magnetic sensor according to a seventh embodiment, in which the magnetization of the free magnetic layer 1 is controlled by the exchange biasing method as with the magnetic sensor of FIG. 6, but the structure differs from that of FIG. 6 in makeup of films formed over the free magnetic layer 1.

A method of manufacturing the magnetic sensors shown in FIG. 7 comprises, by way of example, the steps of forming multilayered films from the buffer layer 6 to the free magnetic layer 1 in succession, and then forming an antiferromagnetic layer (hereinafter referred to as a "third antiferromagnetic layer") 50 over the entire surface of the free magnetic layer 1. In this seventh embodiment, the third antiferromagnetic layer 50 is preferably formed in film thickness of 20 Å to 50 Å and more preferably of 30 Å to 40 Å.

Further, on the third antiferromagnetic layer 50, a nonmagnetic layer 51 made of, e.g., Ru is formed in a constant film thickness.

The seventh embodiment shown in FIG. 7 has a first feature in that the third antiferromagnetic layer 50 is formed on the entire surface of the free magnetic layer 1 and the formed third antiferromagnetic layer 50 has a thin film thickness of not larger than 50 Å.

After forming the multilayered films up to the nonmagnetic layer 51 as described above, heat treatment under a magnetic field is carried out to generate an exchange coupling magnetic field between the pinned magnetic layer 3 and the antiferromagnetic layer 4. On that occasion, because the third antiferromagnetic layer 50 is formed in a thin film thickness of not larger than 50 Å, it has a non-antiferromagnetic property. Even when subjected to the heat treatment under a magnetic field, therefore, the third antiferromagnetic layer 50 is hard to regularly transform, whereby the exchange coupling magnetic field will not be generated between the third antiferromagnetic layer 50 and the first magnetic layer 43 constituting the free magnetic layer 1, or its value is very small even though generated. Consequently, the magnetization of the free magnetic layer 1 will not be so firmly fixed as that of the pinned magnetic layer 3.

Then, both end portions 51a of the nonmagnetic layer 51 in the track-width direction are cut by ion milling to further reduce the film thickness of both the end portions 51a. Thereafter, the second antiferromagnetic layer 47 and the electrode layer 8 are formed on each of both the end portions 51a. Finally, heat treatment under a magnetic field is carried out to generate an exchange coupling magnetic field between both end portions G of the third antiferromagnetic layer 50 and the first magnetic layer 43 of the free magnetic layer 1. In this seventh embodiment, the nonmagnetic layer 51 is formed as a dense layer that is not easily oxidized even when exposed to the atmosphere, and is made of, e.g., one or more kinds of precious metals selected from among Ru, Re, Pd, Os, Ir, Pt, Au and Rh.

The nonmagnetic layer 51 made of a precious metal, such as Ru, is a dense layer that is not easily oxidized even when exposed to the atmosphere. Even with a small film thickness of the nonmagnetic layer 51, therefore, the nonmagnetic layer 51 can satisfactorily prevent the third antiferromagnetic layer 50 from being oxidized when exposed to the atmosphere.

This seventh embodiment has a second feature in that the nonmagnetic layer 51 is formed in film thickness of 3 Å to 10 Å in the film forming stage. By forming the nonmagnetic layer 51 in such a small film thickness, low-energy ion milling is usable and milling control can be satisfactorily improved in the step of cutting both the end portions 51a of the nonmagnetic layer 51 by ion milling.

Further, in the seventh embodiment shown in FIG. 7, both the end portions 51a of the nonmagnetic layer 51 have a smaller film thickness than a central portion 51b thereof as a result of the ion milling and the second antiferromagnetic layer 47 is formed on each of both the end portions 51a. In other words, in this seventh embodiment, both the end portions 51a of the nonmagnetic layer 51 have a small film thickness of not larger than 3 Å (as an alternative, both the end portions 51a of the nonmagnetic layer 51 may be all removed by the ion milling). Since both the end portions 51a of the nonmagnetic layer 51 are formed in a very small film thickness, the antiferromagnetic interaction can be developed between the second antiferromagnetic layers 47 formed on both the end portions 51a and both the end portions G of the third antiferromagnetic layer 50, thus enabling the second antiferromagnetic layer 47 and each of both the end portions G of the third antiferromagnetic layer 50 to function as a one-piece antiferromagnetic layer.

As stated above, the nonmagnetic layer 51 is made of, e.g., Ru in film thickness of about 3 Å to 10 Å in the film forming stage, and therefore low-energy ion milling is usable in the step of cutting both the end portions 51a of the nonmagnetic layer 51 by the ion milling. The use of the low-energy ion milling means that both the end portions 51a of the nonmagnetic layer 51 can be left in a very small film thickness, that even when both the end portions 51a of the nonmagnetic layer 51 are all removed by the ion milling, the exposed both end portions G of the third antiferromagnetic layer 50 are less susceptible to damages caused upon the ion milling, and that both the end portions G of the third antiferromagnetic layer 50 can maintain satisfactory properties as an antiferromagnetic layer. In this seventh embodiment, therefore, it is possible to cause the second antiferromagnetic layer 47 and each of both the end portions G of the third antiferromagnetic layer 50 to satisfactorily function as a one-piece antiferromagnetic layer, and to satisfactorily control the magnetization of the free magnetic layer 1.

In the seventh embodiment shown in FIG. 7, the free magnetic layer 1 is of a multilayered ferri-structure similarly to that shown in FIGS. 1 to 6. More specifically, a first magnetic layer 43 constituting the free magnetic layer 1 includes a magnetic area C which is positioned nearer to an opposite surface 43a (on the side contacting the third antiferromagnetic layer 50) of the first magnetic layer 43 away from an interface 42a between the first magnetic layer 43 and a nonmagnetic intermediate layer 42 and which contains an element X (X represents at least one element selected from among Cr, Ti, V, Zr, Nb, Mo, Hf, Ta and W), and a magnetic area D which is located on the side contacting the interface 42a between the first magnetic layer 43 and the nonmagnetic intermediate layer 42 and which does not contain the element X.

Preferably, the magnetic area C is formed of a CoFeX alloy or a CoFeNiX alloy, and the magnetic area D is formed of a CoFe alloy or a CoFeNi alloy.

With such a film makeup of the first magnetic layer 43 constituting the free magnetic layer 1, the exchange coupling magnetic field (Hex) generated between the first magnetic layer 43 and each of both the end portions G of the third antiferromagnetic layer 50 can be increased. Further, the coupling magnetic field based on the RKKY interaction generated between the first magnetic layer 43 and the second magnetic layer 41 can be increased. As a result, the unidirectional exchange bias magnetic field (Hex*) in both the end portions G of the free magnetic layer 1 can be increased.

Accordingly, magnetization in both the end portions G of the free magnetic layer 1 can be appropriately pinned. On the other hand, a central portion H of the free magnetic layer 1 is put into a weak single domain state in which magnetization is reversible in response to an external magnetic field. With the structure shown in FIG. 7, therefore, the magnetization of the free magnetic layer 1 can be satisfactorily controlled.

Moreover, since the first magnetic layer 43 includes the magnetic area C containing the element X and having a high specific resistance, the amount of the sensing current shunted from the electrode layer 8 to the first magnetic layer 43, i.e., the so-called shunt loss, can be reduced and the resistance change rate ($\Delta R/R$) can be satisfactorily improved.

Thus, according to this seventh embodiment, it is possible to increase the unidirectional exchange bias magnetic field (Hex*) in both the end portions G of the free magnetic layer 1, to satisfactorily control the magnetization of the free magnetic layer 1, and to improve the resistance change rate ($\Delta R/R$). In addition, a magnetic sensor satisfactorily adaptable for a higher recording density expected in the future can be manufactured.

Note that the materials, composition ratio, film thickness, etc. used in the first magnetic layer 43, the nonmagnetic intermediate layer 42 and the second magnetic layer 41, which constitute the free magnetic layer 1, are the same as those described above in connection with FIG. 1, and a reference should be made on the above description. Also, the film makeup of the first magnetic layer 43 may be modified such that the magnetic area D contains the element X, but the content is very small as described in connection with FIG. 1, or that the first magnetic layer 43 is of a two-layered structure as described in connection with FIG. 2.

Additionally, the first magnetic layer 13 constituting the pinned magnetic layer 3 may also be formed of the same structure as that of the first magnetic layer 43 of the free magnetic layer 1.

Figure 8:
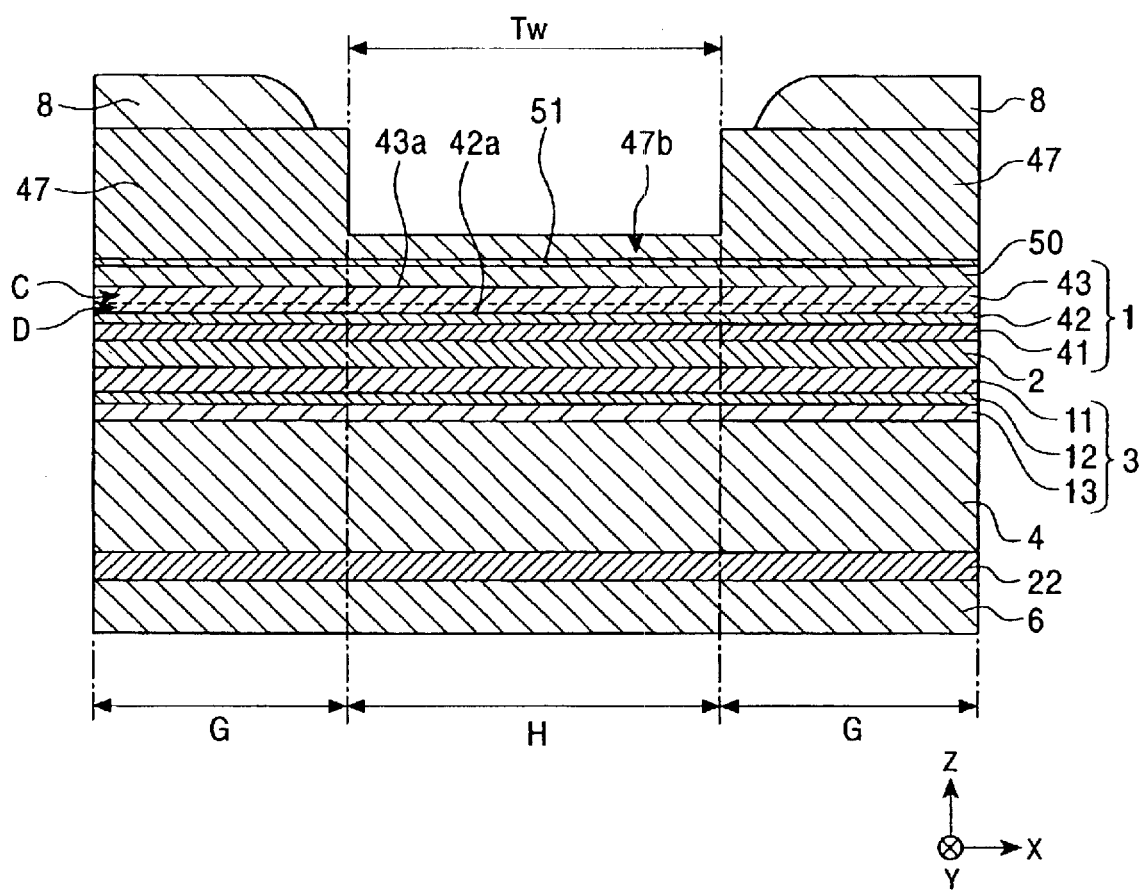
FIG. 8 is a partial sectional view of a structure of a magnetic sensor according to an eighth embodiment of the present invention, looking from a side facing a recording medium.

FIG. 8 is a partial sectional view of a structure of a magnetic sensor according to an eighth embodiment of the present invention, looking from a side facing a recording medium.

As with the seventh embodiment shown in FIG. 7, in the eighth embodiment shown in FIG. 8, a third antiferromagnetic layer 50 is formed on a free magnetic layer 1, and a nonmagnetic layer 51 made of, e.g., Ru is formed on the third antiferromagnetic layer 50. Further, a second antiferromagnetic layer 47 is formed on the nonmagnetic layer 51.

The eighth embodiment shown in FIG. 8 is formed by a manufacturing method different from that for the seventh embodiment shown in FIG. 7, but materials, functions, etc. of the third antiferromagnetic layer 50 and the nonmagnetic layer 51 are the same as those in FIG. 7.

The method of manufacturing the magnetic sensors shown in FIG. 8 comprises, by way of example, the steps of forming multilayered films from the buffer layer 6 to the nonmagnetic layer 51 in succession, and then carrying out first heat treatment (annealing) under a magnetic field to generate an exchange coupling magnetic field between the antiferromagnetic layer 4 and the pinned magnetic layer 3. Then, an upper surface of the nonmagnetic layer 51 is uniformly cut by ion milling to reduce its film thickness (to be not larger than 3 Å). After forming the second antiferromagnetic layer 47 on the nonmagnetic layer 51, a central portion H of the second antiferromagnetic layer 47 is cut in by ion milling. Subsequently, second heat treatment under a magnetic field is carried out to generate an exchange coupling magnetic field between both the end portions G of the third antiferromagnetic layer 50 and the first magnetic layer 43 of the free magnetic layer 1.

While in the eighth embodiment shown in FIG. 8 the second antiferromagnetic layer 47 formed on the nonmagnetic layer 51 is partly disposed (left) on its central portion H as well, the second antiferromagnetic layer 47 in the central portion H may be all cut out by the ion milling so that the surface of the nonmagnetic layer 51 may be exposed in the central portion H.

The amount by which the second antiferromagnetic layer 47 is cut out by the ion milling must be adjusted so that a total of the film thickness of a central second antiferromagnetic layer 47b left in the central portion H and the film thickness of the third antiferromagnetic layer 50 is held in the range of 20 Å to 50 Å, and hence so that the central portion H of the third antiferromagnetic layer 50 will not exhibit antiferromagnetic properties. By satisfying the above condition, an exchange coupling magnetic field is prevented from being generated between the central portion H of the third antiferromagnetic layer 50 and the central portion H of the first magnetic layer 43 constituting the free magnetic layer 1.

As stated above, the second antiferromagnetic layer 47 in the central portion H may be all removed by the ion milling so as to expose the surface of the nonmagnetic layer 51 in the central portion H. Alternatively, the nonmagnetic layer 51 exposed in the central portion H may also be all removed so that the surface of the third antiferromagnetic layer 50 is exposed in the central portion H (on this occasion, the surface of the third antiferromagnetic layer 50 may be slightly cut).

In the eighth embodiment shown in FIG. 8, the free magnetic layer 1 is of a multilayered ferri-structure similarly to that shown in FIGS. 1 to 7. More specifically, a first magnetic layer 43 constituting the free magnetic layer 1 includes a magnetic area C which is positioned nearer to an opposite surface 43a (on the side contacting the third antiferromagnetic layer 50) of the first magnetic layer 43 away from an interface 42a between the first magnetic layer 43 and a nonmagnetic intermediate layer 42 and which contains an element X (X represents at least one element selected from among Cr, Ti, V, Zr, Nb, Mo, Hf, Ta and W), and a magnetic area D which is located on the side contacting the interface 42a between the first magnetic layer 43 and the nonmagnetic intermediate layer 42 and which does not contain the element X.

Preferably, the magnetic area C is formed of a CoFeX alloy or a CoFeNiX alloy, and the magnetic area D is formed of a CoFe alloy or a CoFeNi alloy.

With such a film makeup of the first magnetic layer 43 constituting the free magnetic layer 1, the exchange coupling magnetic field (Hex) generated between the first magnetic layer 43 and each of both the end portions G of the third antiferromagnetic layer 50 can be increased. Further, the coupling magnetic field based on the RKKY interaction generated between the first magnetic layer 43 and the second magnetic layer 41 can be increased. As a result, the unidirectional exchange bias magnetic field (Hex*) in both the end portions G of the free magnetic layer 1 can be increased.

Accordingly, magnetization in both the end portions G of the free magnetic layer 1 can be appropriately pinned. On the other hand, a central portion H of the free magnetic layer 1 is put into a weak single domain state in which magnetization is reversible in response to an external magnetic field. With the structure shown in FIG. 8, therefore, the magnetization of the free magnetic layer 1 can be satisfactorily controlled.

Moreover, since the first magnetic layer 43 includes the magnetic area C containing the element X and having a high specific resistance, the amount of the sensing current shunted from the electrode layer 8 to the first magnetic layer 43, i.e., the so-called shunt loss, can be reduced and the resistance change rate ($\Delta R/R$) can be satisfactorily improved.

Thus, according to this eighth embodiment, it is possible to increase the unidirectional exchange bias magnetic field (Hex*) in both the end portions G of the free magnetic layer 1, to satisfactorily control the magnetization of the free magnetic layer 1, and to improve the resistance change rate ($\Delta R/R$). In addition, a magnetic sensor satisfactorily adaptable for a higher recording density expected in the future can be manufactured.

Note that the materials, composition ratio, film thickness, etc. used in the first magnetic layer 43, the nonmagnetic intermediate layer 42 and the second magnetic layer 41, which constitute the free magnetic layer 1, are the same as those described above in connection with FIG. 1, and a reference should be made on the above description. Also, the film makeup of the first magnetic layer 43 may be modified such that the magnetic area D contains the element X, but the content is very small as described in connection with FIG. 1, or that the first magnetic layer 43 is of a two-layered structure as described in connection with FIG. 2.

Additionally, the first magnetic layer 13 constituting the pinned magnetic layer 3 may also be formed of the same structure as that of the first magnetic layer 43 of the free magnetic layer 1.

Figure 9:
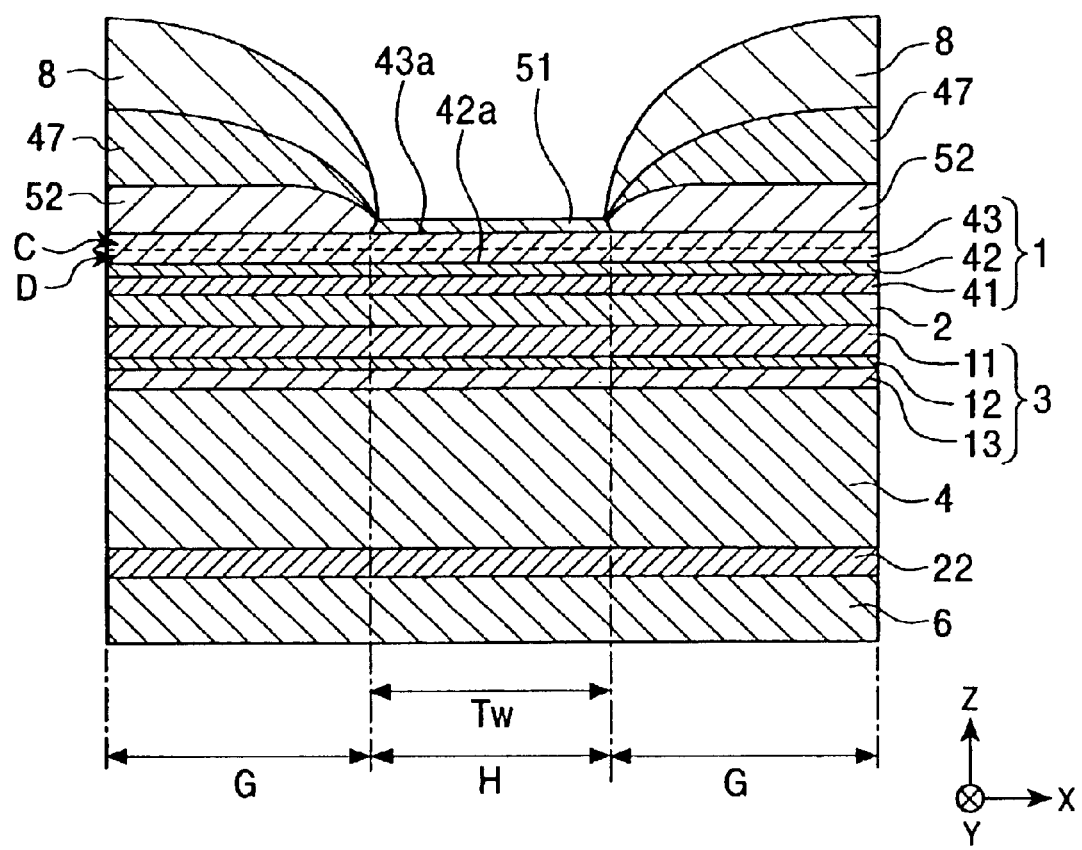
FIG. 9 is a partial sectional view of a structure of a magnetic sensor according to a ninth embodiment of the present invention, looking from a side facing a recording medium.

FIG. 9 is a partial sectional view of a structure of a magnetic sensor according to a ninth embodiment of the present invention, looking from a side facing a recording medium.

The ninth embodiment shown in FIG. 9 differs from the seventh embodiment shown in FIG. 7 in that the third antiferromagnetic layer 50 is not disposed on a free magnetic layer 1 and a nonmagnetic layer 51 is formed on a central portion H of the free magnetic layer 1. By forming the nonmagnetic layer 51 on the free magnetic layer 1, the free magnetic layer 1 can be satisfactorily protected against oxidization caused upon exposure to the atmosphere.

In this ninth embodiment, the nonmagnetic layer 51 is required to be a dense layer that is not easily oxidized even when exposed to the atmosphere. To that end, in the present invention, the nonmagnetic layer 51 is preferably made of one or more kinds of precious metals selected from among Ru, Re, Pd, Os, Ir, Rh, Cr, Cu, Pt and Au. As an alternative, the nonmagnetic layer 51 may be a specular layer (mirror reflecting layer) made of an oxide of Cr, for example.

The nonmagnetic layer 51 made of a precious metal, such as Ru, is a dense layer that is not easily oxidized even when exposed to the atmosphere. Even with a small film thickness of the nonmagnetic layer 51, therefore, the nonmagnetic layer 51 can satisfactorily prevent the free magnetic layer 1 from being oxidized when exposed to the atmosphere.

In a method of manufacturing the magnetic sensors shown in FIG. 9, multilayered films from the buffer layer 6 to the nonmagnetic layer 51 are first formed in succession. The film thickness of the nonmagnetic layer 51 in the film forming stage is preferably in the range of 3 Å to 20 Å and more preferably in the range of 3 Å to 10 Å. Even the nonmagnetic layer 51 having such a small film thickness can satisfactorily prevent the free magnetic layer 1 from being oxidized when exposed to the atmosphere.

After forming the multilayered films up to the nonmagnetic layer 51, first heat treatment under a magnetic field is carried out to generate an exchange coupling magnetic field between the pinned magnetic layer 3 and the antiferromagnetic layer 4. Then, both end portions G of the nonmagnetic layer 51 are cut out by, e.g., ion milling (both the end portions G of the nonmagnetic layer 51 are not shown in FIG. 7, but they are present just after the stage of forming the nonmagnetic layer 51). While in the ninth embodiment shown in FIG. 9 both the end portions G of the nonmagnetic layer 51 are all cut out and removed, they may be partly left on both end portions G of the free magnetic layer 1. In that case, however, the film thickness of the left both end portions G of the nonmagnetic layer 51 must be set to a very small value so that ferromagnetic coupling is generated between both the end portions G of the first magnetic layer 43 of the free magnetic layer 1 and a ferromagnetic layer 52 formed on the left nonmagnetic layer 51.

This ninth embodiment has the feature, as described above, in that the nonmagnetic layer 51 is made of a precious metal, such as Ru, and that in the film forming stage the nonmagnetic layer 51 is formed in small thin thickness of about 3 Å to 20 Å and more preferably of about 3 Å to 10 Å. By forming the nonmagnetic layer 51 in such a small film thickness, in the step of removing both the end portions G of the nonmagnetic layer 51 by the ion milling, low-energy ion milling is usable to cut both the end portions G of the nonmagnetic layer 51, and milling control can be improved.

In the ninth embodiment of FIG. 9, the ferromagnetic layer 52 is formed on each of both the end portions G of the free magnetic layer 1, which are exposed on both sides of the nonmagnetic layer 51 in the track-width direction (X-direction in FIG. 9). Further, a second antiferromagnetic layer 47 and an electrode layer 8 are formed on the ferromagnetic layer 52.

As stated above, in the step of removing both the end portions G of the nonmagnetic layer 51 by the ion milling, low-energy ion milling is usable to cut both the end portions G of the nonmagnetic layer 51. The use of the low-energy ion milling means makes it possible to maintain satisfactory magnetic characteristics of the exposed both end portions G of the first magnetic layer 43 of the free magnetic layer 1, and to strengthen ferromagnetic coupling between each both the end portions G of the first magnetic layer 43 of the free magnetic layer 1 and the ferromagnetic layer 52 formed thereon.

After forming the electrode layer 8, second heat treatment under a magnetic field is carried out to generate an exchange coupling magnetic field between the second antiferromagnetic layer 47 and the ferromagnetic layer 52.

To strengthen the exchange coupling magnetic field between the second antiferromagnetic layer 47 and the ferromagnetic layer 52, the ferromagnetic layer 52 preferably contains the element X. To this end, the ferromagnetic layer 52 is preferably formed of, e.g., a CoFeX alloy or a CoFeNiX alloy.

In the ninth embodiment shown in FIG. 9, the free magnetic layer 1 is of a multilayered ferri-structure similarly to that shown in FIGS. 1 to 8. More specifically, a first magnetic layer 43 constituting the free magnetic layer 1 includes a magnetic area C which is positioned nearer to an opposite surface 43a (on the side contacting the ferromagnetic layer 52 and the nonmagnetic layer 51) of the first magnetic layer 43 away from an interface 42a between the first magnetic layer 43 and a nonmagnetic intermediate layer 42 and which contains an element X (X represents at least one element selected from among Cr, Ti, V, Zr, Nb, Mo, Hf, Ta and W), and a magnetic area D which is located on the side contacting the interface 42a between the first magnetic layer 43 and the nonmagnetic intermediate layer 42 and which does not contain the element X.

Preferably, the magnetic area C is formed of a CoFeX alloy or a CoFeNiX alloy, and the magnetic area D is formed of a CoFe alloy or a CoFeNi alloy.

When the film thickness of the ferromagnetic layer 52 containing the element X is as small as about 5 Å, the exchange coupling magnetic field (Hex) generated between the ferromagnetic layer 52 and the second antiferromagnetic layer 47 cannot be sufficiently increased. With the above-described film makeup of the first magnetic layer 43 constituting the free magnetic layer 1 in this ninth embodiment, however, a total film thickness of the area containing the element X can be increased with summing of the ferromagnetic layer 52 and the magnetic area C of the first magnetic layer 43, and hence the exchange coupling magnetic field (Hex) can be effectively increased. Further, the coupling magnetic field based on the RKKY interaction generated between the first magnetic layer 43 and the second magnetic layer 41 can be increased. As a result, the unidirectional exchange bias magnetic field (Hex*) in both the end portions G of the free magnetic layer 1 can be increased.

Accordingly, magnetization in both the end portions G of the free magnetic layer 1 can be appropriately pinned. On the other hand, a central portion H of the free magnetic layer 1 is put into a weak single domain state in which magnetization is reversible in response to an external magnetic field. With the structure shown in FIG. 9, therefore, the magnetization of the free magnetic layer 1 can be satisfactorily controlled.

Moreover, since the first magnetic layer 43 includes the magnetic area C containing the element X and having a high specific resistance, the amount of the sensing current shunted from the electrode layer 8 to the first magnetic layer 43, i.e., the so-called shunt loss, can be reduced and the resistance change rate ($\Delta R/R$) can be satisfactorily improved.

Thus, according to this ninth embodiment, it is possible to increase the unidirectional exchange bias magnetic field (Hex*) in both the end portions G of the free magnetic layer 1, to satisfactorily control the magnetization of the free magnetic layer 1, and to improve the resistance change rate ($\Delta R/R$). In addition, a magnetic sensor satisfactorily adaptable for a higher recording density expected in the future can be manufactured.

Note that the materials, composition ratio, film thickness, etc. used in the first magnetic layer 43, the nonmagnetic intermediate layer 42 and the second magnetic layer 41, which constitute the free magnetic layer 1, are the same as those described above in connection with FIG. 1, and a reference should be made on the above description. Also, the film makeup of the first magnetic layer 43 may be modified such that the magnetic area D contains the element X, but the content is very small as described in connection with FIG. 1, or that the first magnetic layer 43 is of a two-layered structure as described in connection with FIG. 2.

Additionally, the first magnetic layer 13 constituting the pinned magnetic layer 3 may also be formed of the same structure as that of the first magnetic layer 43 of the free magnetic layer 1.

Figure 10:
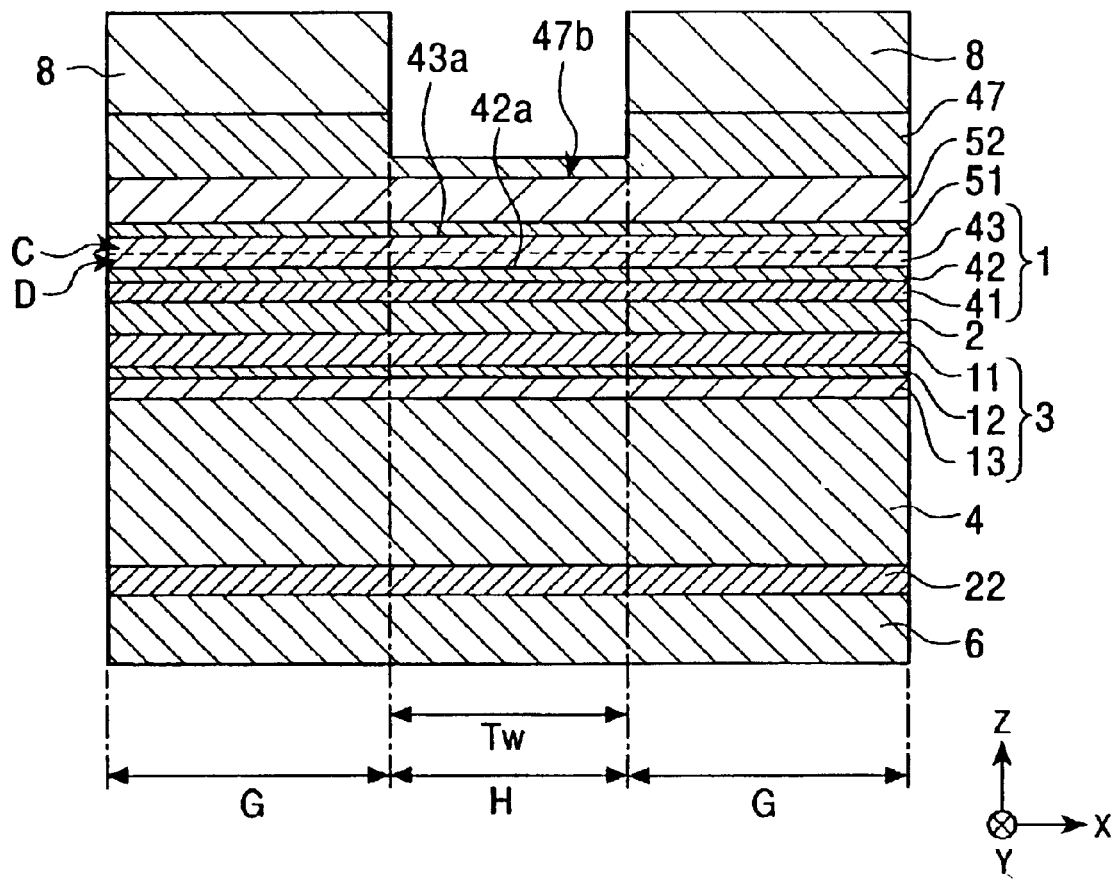
FIG. 10 is a partial sectional view of a structure of a magnetic sensor according to a tenth embodiment of the present invention, looking from a side facing a recording medium.

FIG. 10 is a partial sectional view of a structure of a magnetic sensor according to a tenth embodiment of the present invention, looking from a side facing a recording medium.

In the tenth embodiment shown in FIG. 10, a nonmagnetic layer 51 is formed on a free magnetic layer 1, and a ferromagnetic layer 52 is formed on the nonmagnetic layer 51. Further, a second antiferromagnetic layer 47 is formed on the ferromagnetic layer 52.

The magnetic sensor shown in FIG. 10 is manufactured by a method differing from that used for manufacturing the magnetic sensor shown in FIG. 9. The materials, functions, etc. of the nonmagnetic layer 51 and the ferromagnetic layer 52 are the same as those in FIG. 9.

In the method for manufacturing the magnetic sensor shown in FIG. 10, after forming multilayered films from a buffer layer 6 to the nonmagnetic layer 51, first heat treatment under a magnetic field is carried out to generate an exchange coupling magnetic field between the pinned magnetic layer 3 and the antiferromagnetic layer 4.

Then, the surface of the nonmagnetic layer 51 is evenly cut by ion milling to reduce its film thickness. Thereafter, the ferromagnetic layer 52, the second antiferromagnetic layer 47 and an electrode layer 8 are successively formed on the nonmagnetic layer 51, and a central portion H of the second antiferromagnetic layer 47 is cut in by ion milling. Subsequently, second heat treatment under a magnetic field is carried out to generate an exchange coupling magnetic field between the ferromagnetic layer 52 and the second antiferromagnetic layer 47.

In this tenth embodiment, a central part 47b of the second antiferromagnetic layer 47 is left in the central portion H, and the central second antiferromagnetic layer 47b left in the central portion H has a film thickness (not larger than 50 Å) smaller than that that of the second antiferromagnetic layer 47 formed in both end portions G. By so reducing the film thickness of the central second antiferromagnetic layer 47b left in the central portion H, an exchange coupling magnetic field is not generated between the central second antiferromagnetic layer 47b and the ferromagnetic layer 52, or it can be suppressed to a very small value even though generated.

Further, in the tenth embodiment of FIG. 10, the nonmagnetic layer 51 made of a precious metal, such as Ru, has a very small thin thickness of not larger than 3 Å (after the ion milling), whereby ferromagnetic coupling can be generated between the ferromagnetic layer 52 and the first magnetic layer 43 constituting the free magnetic layer 1.

When magnetization in both end portions G of the ferromagnetic layer 52 is fixed in the track-width direction by the exchange coupling magnetic field generated between both the end portions G of the ferromagnetic layer 52 and the second antiferromagnetic layer 47, both end portions G of the first magnetic layer 43 of the free magnetic layer 1 are also fixedly magnetized in the same direction as that of magnetization of the ferromagnetic layer 52 with the ferromagnetic coupling generated between the ferromagnetic layer 52 and both the end portions G of the first magnetic layer 43. On the other hand, both end portions G of the second magnetic layer 41 of the free magnetic layer 1 are fixedly magnetized in a direction opposed to that of magnetization of the first magnetic layer 43 by the coupling magnetic field based on the RKKY interaction generated between the first magnetic layer 43 and the second magnetic layer 41.

A central portion H of the free magnetic layer 1 is put into a weak single domain state in which magnetization is reversible in response to an external magnetic field. Thus, in the central portion H, the magnetization of the first magnetic layer 43 and the magnetization of the second magnetic layer 41 are reversible in response to an external magnetic field while keeping the antiparallel state.

In the tenth embodiment shown in FIG. 10, the free magnetic layer 1 is of a multilayered ferri-structure similarly to that shown in FIG. 9. More specifically, a first magnetic layer 43 constituting the free magnetic layer 1 includes a magnetic area C which is positioned nearer to an opposite surface 43a (on the side contacting the ferromagnetic layer 52 and the nonmagnetic layer 51) of the first magnetic layer 43 away from an interface 42a between the first magnetic layer 43 and a nonmagnetic intermediate layer 42 and which contains an element X (X represents at least one element selected from among Cr, Ti, V, Zr, Nb, Mo, Hf, Ta and W), and a magnetic area D which is located on the side contacting the interface 42a between the first magnetic layer 43 and the nonmagnetic intermediate layer 42 and which does not contain the element X.

Preferably, the magnetic area C is formed of a CoFeX alloy or a CoFeNiX alloy, and the magnetic area D is formed of a CoFe alloy or a CoFeNi alloy.

When the film thickness of the ferromagnetic layer 52 containing the element X is as small as about 5 Å, the exchange coupling magnetic field (Hex) generated between the ferromagnetic layer 52 and the second antiferromagnetic layer 47 cannot be sufficiently increased. With the above-described film makeup of the first magnetic layer 43 constituting the free magnetic layer 1 in this tenth embodiment, however, a total film thickness of the area containing the element X can be increased with summing of the ferromagnetic layer 52 and the magnetic area C of the first magnetic layer 43, and hence the exchange coupling magnetic field (Hex) can be effectively increased. Further, the coupling magnetic field based on the RKKY interaction generated between the first magnetic layer 43 and the second magnetic layer 41 can be increased. As a result, the unidirectional exchange bias magnetic field (Hex*) in both the end portions G of the free magnetic layer 1 can be increased.

Accordingly, magnetization in both the end portions G of the free magnetic layer 1 can be appropriately pinned. On the other hand, a central portion H of the free magnetic layer 1 is put into a weak single domain state in which magnetization is reversible in response to an external magnetic field. With the structure shown in FIG. 10, therefore, the magnetization of the free magnetic layer 1 can be satisfactorily controlled.

Moreover, since the first magnetic layer 43 includes the magnetic area C containing the element X and having a high specific resistance, the amount of the sensing current shunted from the electrode layer 8 to the first magnetic layer 43, i.e., the so-called shunt loss, can be reduced and the resistance change rate ($\Delta R/R$) can be satisfactorily improved.

Thus, according to this tenth embodiment, it is possible to increase the unidirectional exchange bias magnetic field (Hex*) in both the end portions G of the free magnetic layer 1, to satisfactorily control the magnetization of the free magnetic layer 1, and to improve the resistance change rate ($\Delta R/R$). In addition, a magnetic sensor satisfactorily adaptable for a higher recording density expected in the future can be manufactured.

In the step of cutting the central portion H of the second antiferromagnetic layer 47 by the ion milling, the second antiferromagnetic layer 47 in the central portion H may be all cut out so as to expose the surface of the ferromagnetic layer 52 in the central portion H (on this occasion, the surface of the ferromagnetic layer 52 may be partly cut). Further, the ferromagnetic layer 52 exposed in the central portion H may be all removed so that the surface of the nonmagnetic layer 51 is exposed in the central portion H. In addition, the nonmagnetic layer 51 exposed in the central portion H may be all removed so that the surface of the first magnetic layer 43 of the free magnetic layer 1 is exposed in the central portion H.

Note that the materials, composition ratio, film thickness, etc. used in the first magnetic layer 43, the nonmagnetic intermediate layer 42 and the second magnetic layer 41, which constitute the free magnetic layer 1, are the same as those described above in connection with FIG. 1, and a reference should be made on the above description. Also, the film makeup of the first magnetic layer 43 may be modified such that the magnetic area D contains the element X, but the content is very small as described in connection with FIG. 1, or that the first magnetic layer 43 is of a two-layered structure as described in connection with FIG. 2.

Additionally, the first magnetic layer 13 constituting the pinned magnetic layer 3 may also be formed of the same structure as that of the first magnetic layer 43 of the free magnetic layer 1.

The magnetic sensors shown in FIGS. 6 to 10 have the so-called CIP (current in the plane) type structure in which the electrode layer 8 is formed on each of both end portions G of a laminate in the track-width direction (X-direction in the figures), which comprises multilayered films from the buffer layer 6 to the free magnetic layer 1 (the third antiferromagnetic layer 50 in FIGS. 7 and 8 or the ferromagnetic layer 52 in FIG. 10), and a current applied from the electrode layer 8 into the laminate flows in a direction parallel to the film surface of each layer within the laminate.

On the other hand, magnetic sensors described below with reference to FIG. 11 and subsequent figures have the so-called CPP (current perpendicular to the plane) type structure in which electrode layers 70, 71 are formed respectively on and under the laminate, and an electrical current applied from the electrode layers 70, 71 into the laminate flows in a direction perpendicular to the film surface of each layer of the laminate. The present invention is also applicable to the CPP type magnetic sensor.

Figure 11:
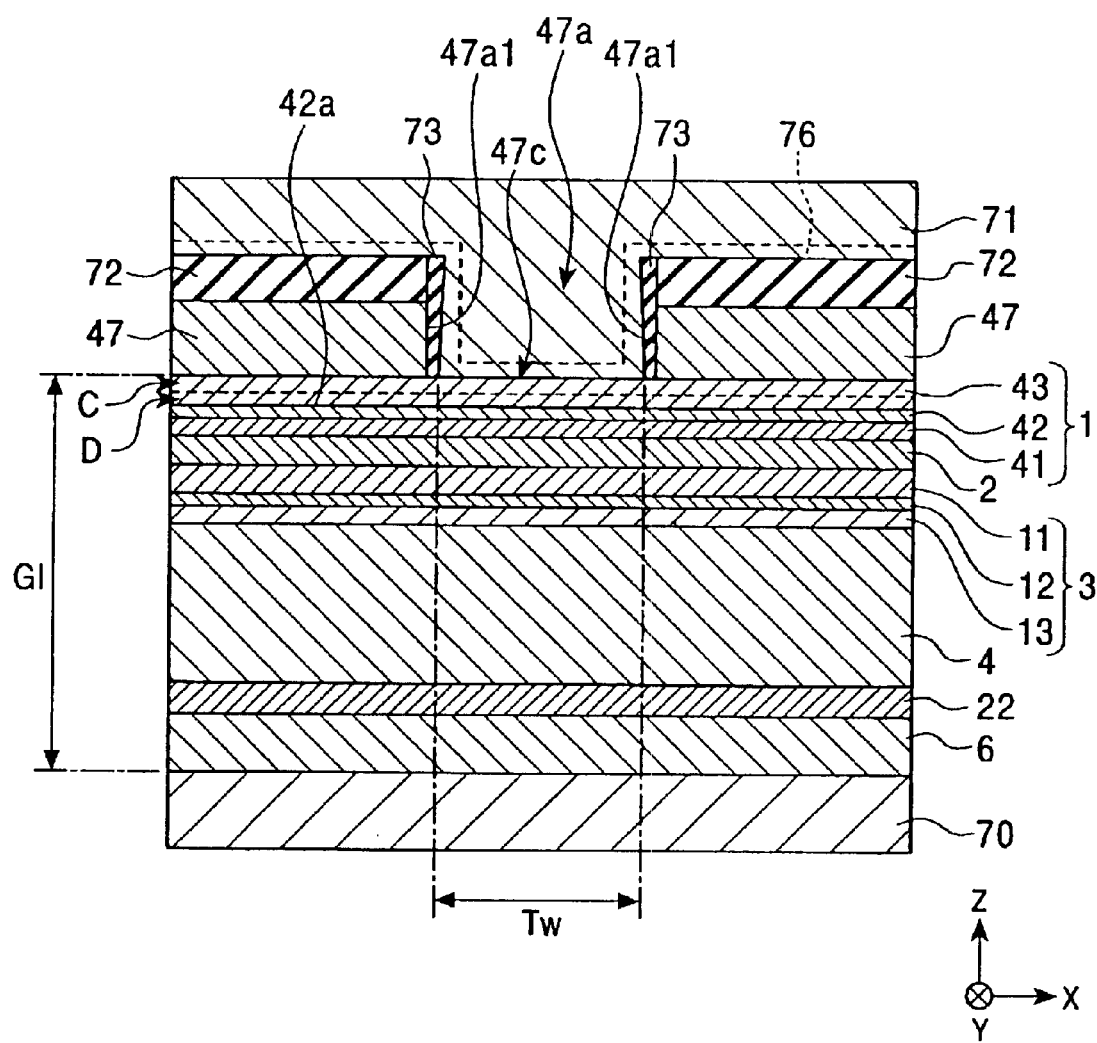
FIG. 11 is a partial sectional view of a structure of a magnetic sensor according to an eleventh embodiment of the present invention, looking from a side facing a recording medium.

The structure of the magnetic sensor shown in FIG. 11 is the same as the film makeup from the buffer layer 6 to the second antiferromagnetic layer 47 in the magnetic sensor of FIG. 6, but differs from it in the following points.

In an eleventh embodiment shown in FIG. 11, a lower shield layer 70 serving also as a lower electrode is disposed under the buffer layer 6. The lower shield layer 70 is formed of a magnetic material, e.g., Permalloy (NiFe), by plating. Note that the buffer layer 6 and/or a seed layer 22 may be omitted. In that case, the lower shield layer 70 is disposed under a lower surface of the seed layer 22 or under a lower surface of an antiferromagnetic layer 4.

Further, as shown in FIG. 11, a first insulating layer 72 is disposed on the second antiferromagnetic layer 47. The first insulating layer 72 is made of an insulating material such as $Al_2O_3$, $SiO_2$, AlN, Al—Si—O, Al—Si—O—N, $Ti_3O_5$, or $Ti_2O_3$.

Central portions of the first insulating layer 72 and the second antiferromagnetic layer 47 are removed to leave a spacing 47a, and opposed lateral surfaces 47a of the spacing 47a are each formed as a continuous surface defined by inner end surfaces of the first insulating layer 72 and the second antiferromagnetic layer 47. While the lateral surfaces 47a1 are shown as being perpendicular relative to the track-width direction (X-direction in FIG. 11), they may be formed as inclined surfaces or curved surfaces such that the width of the spacing 47a in the track-width direction gradually increases as the lateral surfaces 47a1 approach the side farther away from the free magnetic layers 1.

As shown in FIG. 11, a second insulating layer 73 is formed on the lateral surface 47a1 of the spacing 47a. The second insulating layer 73 is made of an insulating material such as $Al_2O_3$, $SiO_2$, AlN, Al—Si—O, Al—Si—O—N, $Ti_3O_5$, or $Ti_2O_3$.

In this eleventh embodiment, the first insulating layer 72 formed on the second antiferromagnetic layer 47 is separate from the second insulating layer 73 formed on the lateral surface 47a1 of the spacing 47a. According to a manufacturing method described later, the first insulating layer 72 and the second insulating layer 73 can be formed separately from each other, and both the insulating layers 72, 73 are each formed in a film thickness suitable to prevent the shunt loss.

Also, as shown in FIG. 11, an upper shield layer 71 serving also as an upper electrode layer is disposed to cover the second insulating layer 73 and a bottom surface 47C of the spacing 47a (the bottom surface 47C corresponding to an upper surface of the free magnetic layer 1 in the eleventh embodiment of FIG. 11).

Thus, in the magnetic sensor shown in FIG. 11, the shield layers 70, 71 serving also as electrodes are formed respectively on and under the laminate, and an electrical current applied between the shield layers 70 and 71 flows in a direction perpendicular to the film surface of each layer within the laminate.

Further, in the magnetic sensor shown in FIG. 11, since the upper surface of the second antiferromagnetic layer 47 and the opposed lateral surfaces 47a1 of the spacing 47a are covered with both the insulating layers 72, 73, the current flowing from the upper shield layer 71 is not shunted to the second antiferromagnetic layer 47, etc. and satisfactorily flows within the track width Tw that is defined by an interval between the opposing second insulating layers 73 and 73 on the bottom surface 47c of the spacing 47a. With the magnetic sensor having the structure shown in FIG. 11, therefore, a CPP type magnetic sensor can be manufactured in which a current path can be prevented from spreading beyond the track width Tw and a higher reproduction output is obtained.

As denoted by a dotted line in FIG. 11, a nonmagnetic layer 76 may be disposed to cover the first insulating layer 72, the second insulating layer 73 and the bottom surface 47c of the spacing 47a. The nonmagnetic layer 76 is preferably made of a nonmagnetic electrically conductive material such as Ta, Ru, Rh, Ir, Cr, Re and Cu. The nonmagnetic layer 76 serves also as an upper gap layer, but it is formed on the bottom surface 47c of the spacing 47a as well. If the nonmagnetic layer 76 is made of, e.g., an insulating material and is disposed to cover the bottom surface 47c of the spacing 47a which serves as an inlet and an outlet of the current path, this would not be preferable because the current becomes harder to flow into the magnetic sensor. For that reason, in the present invention, the nonmagnetic layer 76 is preferably made of a nonmagnetic electrically conductive material.

Moreover, in the magnetic sensor shown in FIG. 11, the nonmagnetic material layer 2 constituting the magnetic sensor may be made of a nonmagnetic electrically conductive material, e.g., Cu. Alternatively, the nonmagnetic material layer 2 may be made of an insulating material, e.g., $Al_2O_3$ or $SiO_2$. The magnetic sensor using a nonmagnetic electrically conductive material has a structure called a spin-valve type giant magnetoresistive sensor (CPP-GMR), and the magnetic sensor using an insulating material has a structure called a spin-valve tunneling type magnetoresistive sensor (CPP-TMR).

In a tunneling type magnetoresistive sensor, a resistance change is generated based on the spin tunneling effect. When the pinned magnetic layer 3 and the free magnetic layer 1 are magnetized in the antiparallel state, the tunneling current is hardest to flow through the nonmagnetic material layer 2 and the resistance value is maximized. On the other hand, when the pinned magnetic layer 3 and the free magnetic layer 1 are magnetized parallel to each other, the tunneling current is easiest to flow through the nonmagnetic material layer 2 and the resistance value is minimized.

Based on that principle, the magnetization of the free magnetic layer 1 varies under the effect of an external magnetic field. A resulting change of the electrical resistance is taken as a voltage change (in the constant-current operation) or a current change (in the constant-voltage operation), whereby a magnetic field leaked from a recording medium is detected.

Figure 12:
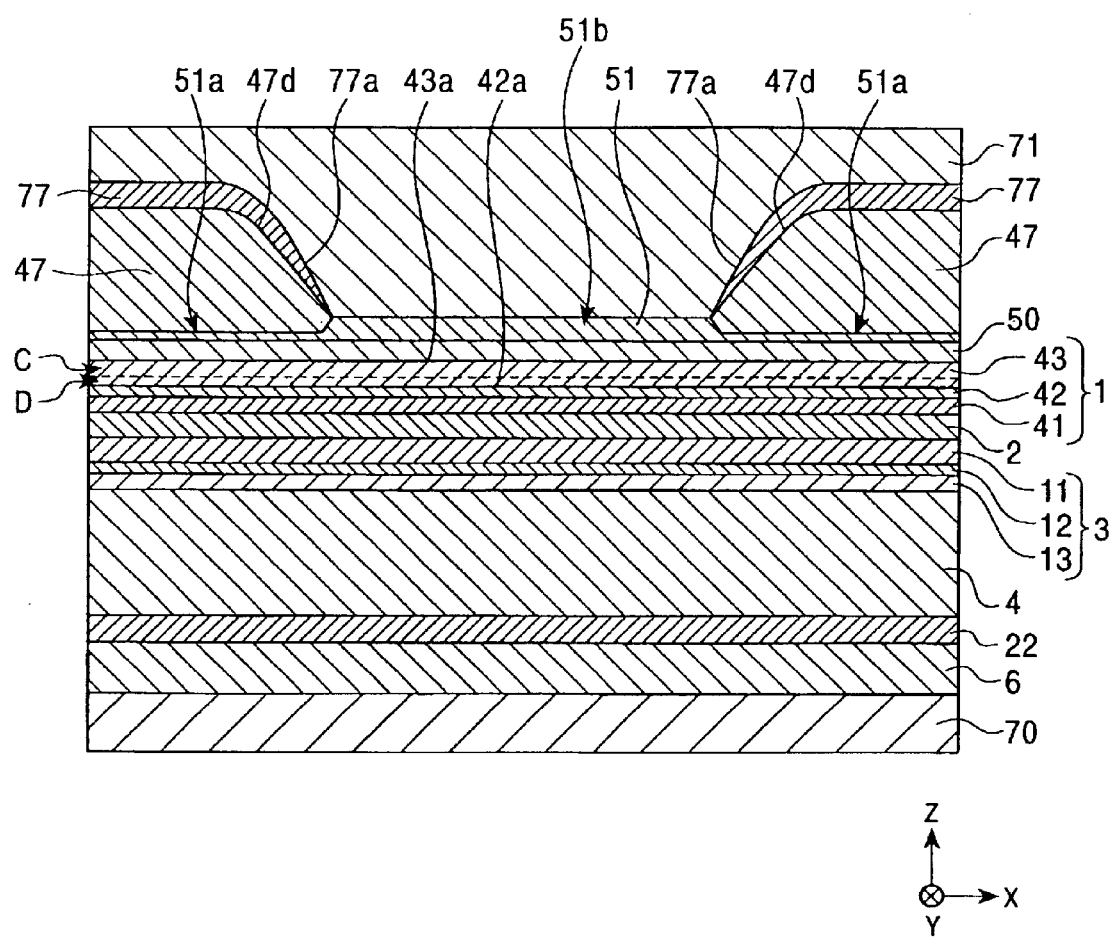
FIG. 12 is a partial sectional view of a structure of a magnetic sensor according to a twelfth embodiment of the present invention, looking from a side facing a recording medium.

FIG. 12 shows a twelfth embodiment in which the magnetic sensor shown in FIG. 7 is modified into a CPP type magnetic sensor similarly to that shown in FIG. 11. In the magnetic sensor shown in FIG. 12, unlike that shown in FIG. 11, only one insulating layer 77 is formed on the second antiferromagnetic layer 47 and an upper surface of the second antiferromagnetic layer 47 is covered with the insulating layer 77. Such a difference is attributable to the difference in a manufacturing method described later. The insulating layer 77 has the same function as that of the first insulating layer 72 and the second insulating layer 73 shown in FIG. 11, and serves to satisfactorily prevent an electrical current, which flows from an upper shield layer 71 into multilayered films, from being shunted to the second antiferromagnetic layer 47. An inner end portion 77a of the insulating layer 77 may be formed so as to extend to lie over an end region of the central portion 51b of the nonmagnetic layer 51. This arrangement is able to further suppress the current from being shunted to the second antiferromagnetic layer 47.

Figure 13:
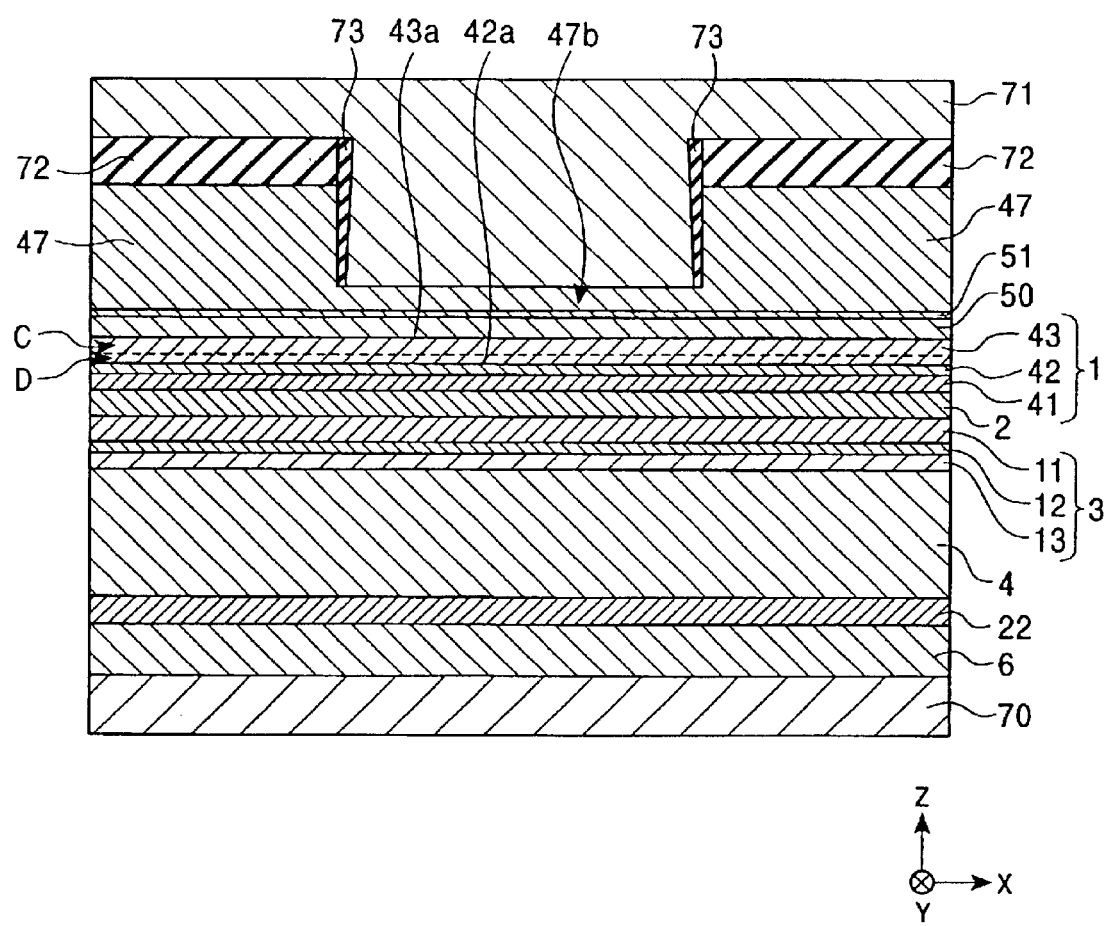
FIG. 13 is a partial sectional view of a structure of a magnetic sensor according to a thirteenth embodiment of the present invention, looking from a side facing a recording medium.
Figure 14:
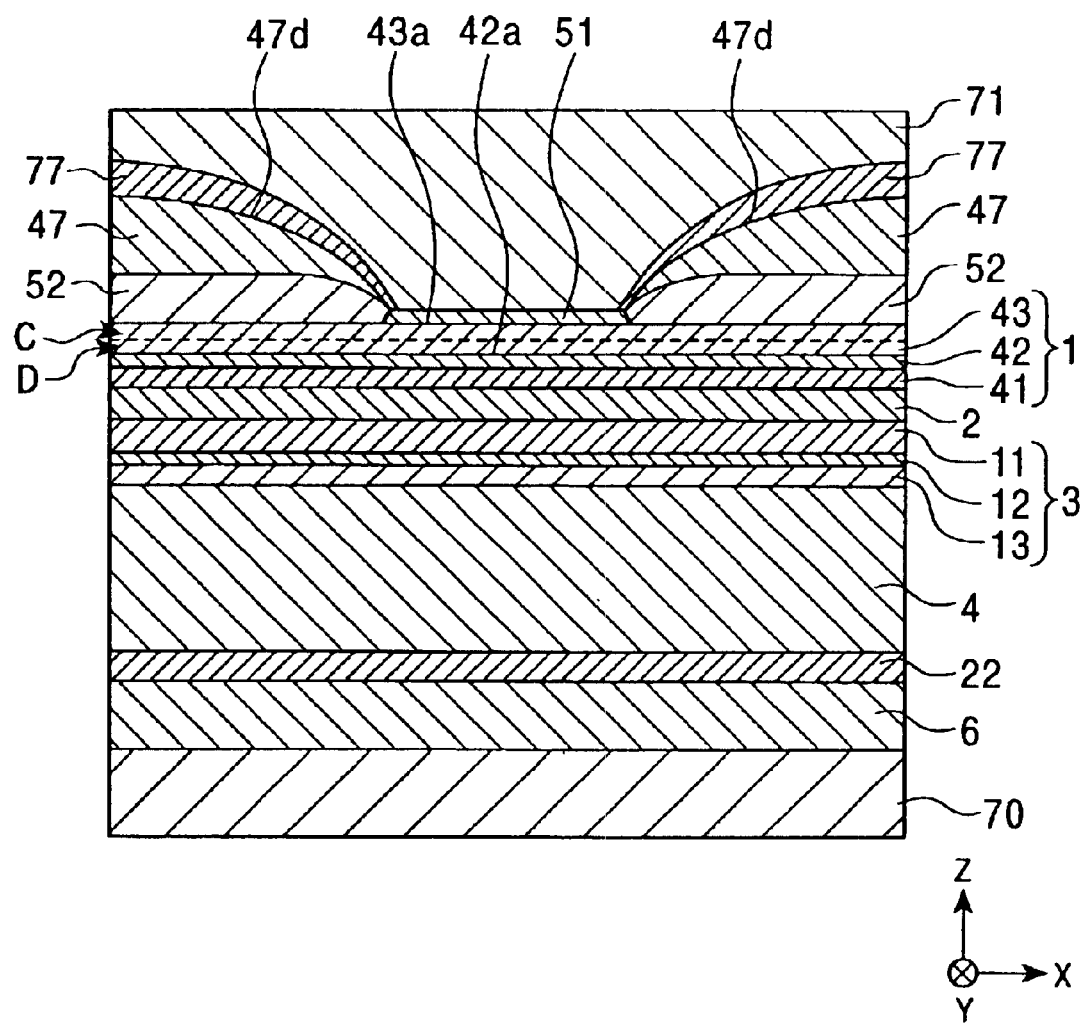
FIG. 14 is a partial sectional view of a structure of a magnetic sensor according to a fourteenth embodiment of the present invention, looking from a side facing a recording medium.
Figure 15:
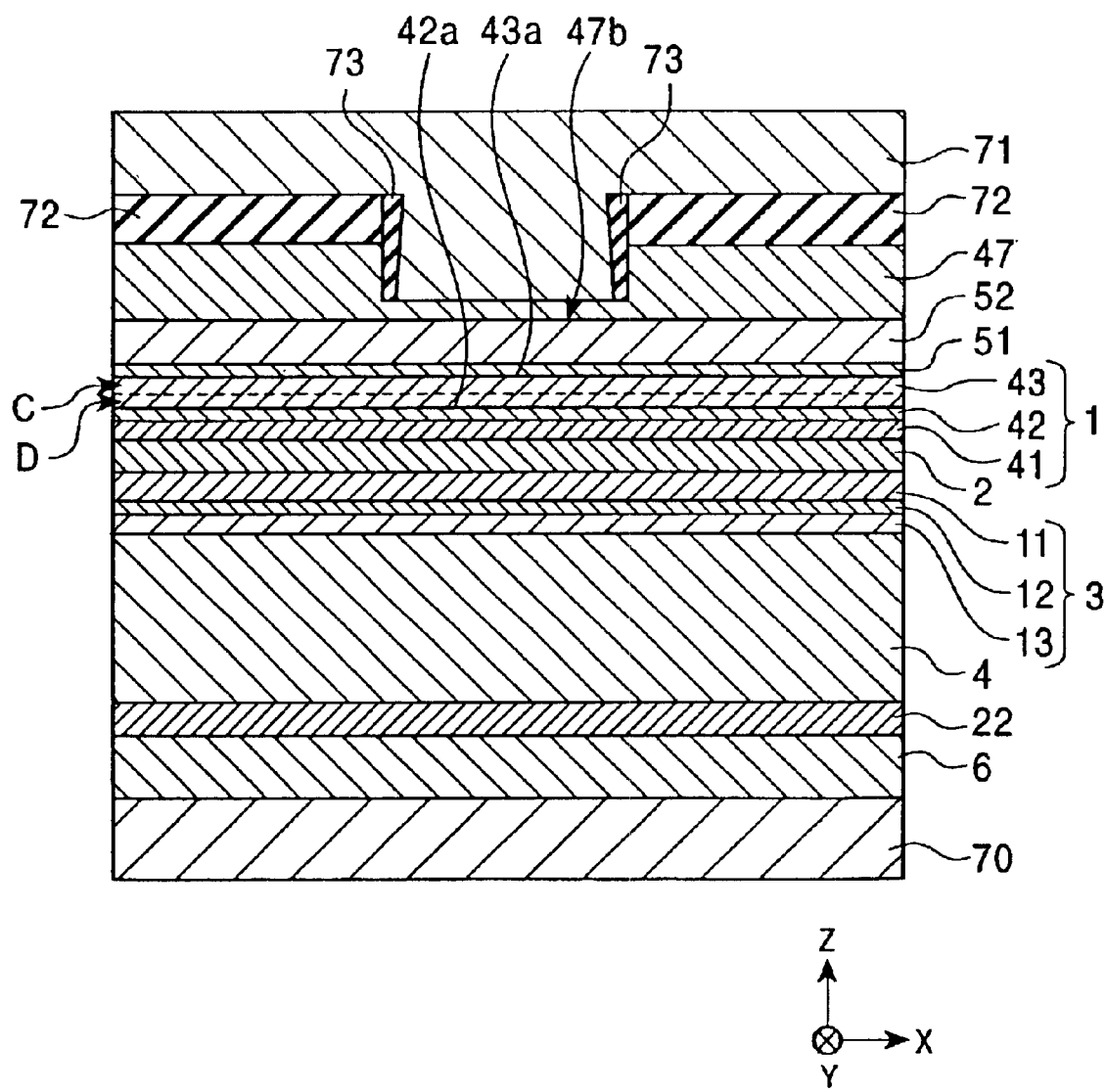
FIG. 15 is a partial sectional view of a structure of a magnetic sensor according to a fifteenth embodiment of the present invention, looking from a side facing a recording medium.

FIG. 13 shows a thirteenth embodiment in which the magnetic sensor shown in FIG. 8 is modified into a CPP type one similarly to that shown in FIG. 11. FIG. 14 shows a fourteenth embodiment in which the magnetic sensor shown in FIG. 9 is modified into a CPP type one similarly to that shown in FIG. 12. FIG. 15 shows a fifteenth embodiment in which the magnetic sensor shown in FIG. 10 is modified into a CPP type one similarly to that shown in FIG. 11.

In the magnetic sensors shown in FIGS. 12 and 14, inner end surfaces 47d of the opposing second antiferromagnetic layers 47 are formed as inclined surfaces or curved surfaces such that the spacing between the inner end surfaces 47d in the track-width direction (X-direction in the figures) gradually increases as the inner end surfaces 47d approach the upper side from the lower side. Forming the inner end surfaces 47d as inclined surfaces or curved surfaces is preferable in that the insulating layer 77 having a proper film thickness can be more easily formed on the inner end surfaces 47d and the shunt loss can be satisfactorily reduced.

Forming the inner end surfaces of the second antiferromagnetic layer 47 as inclined surfaces or curved surfaces can also be realized in the magnetic sensors shown in FIGS. 11, 13 and 15.

Figure 16:
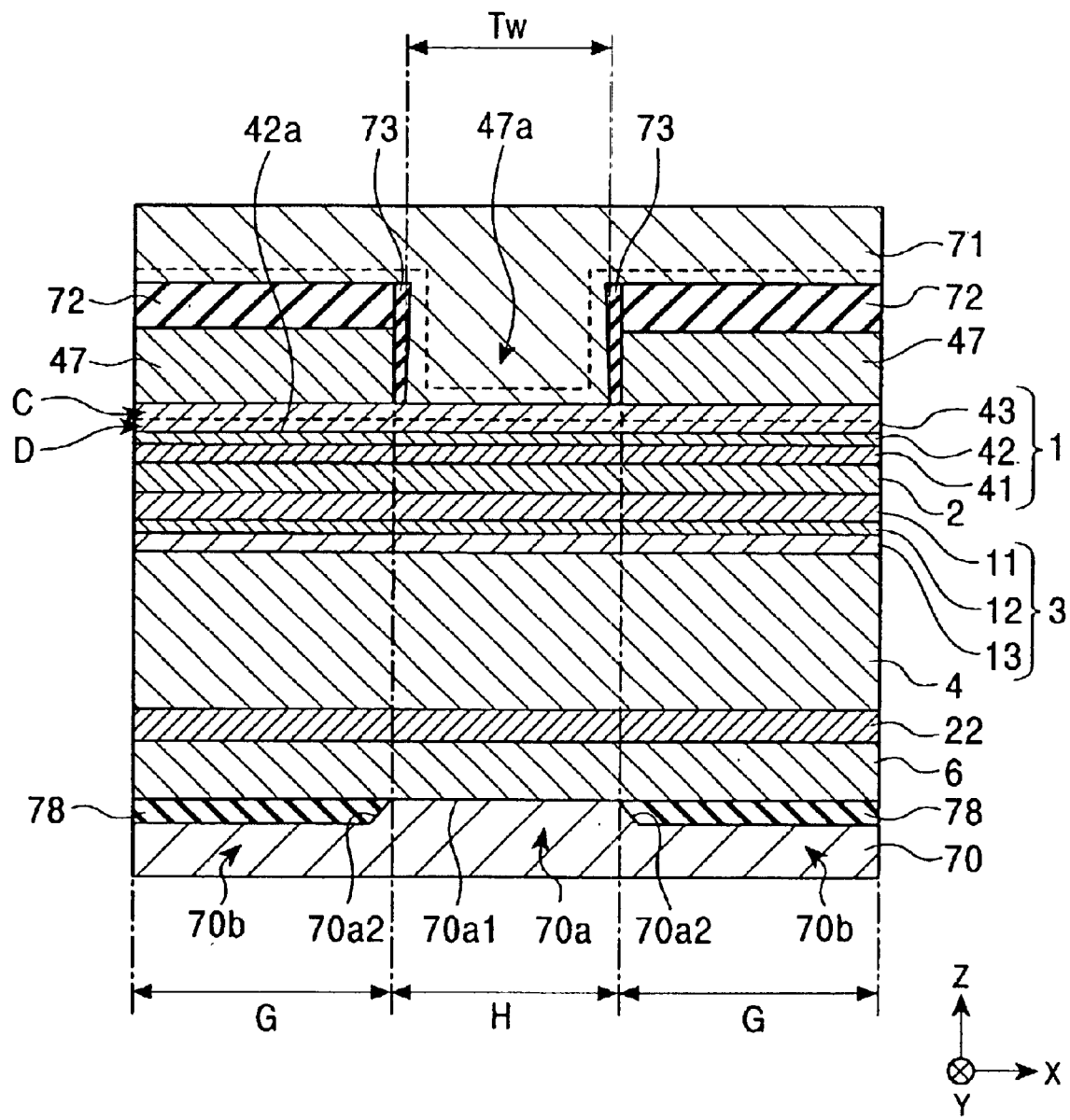
FIG. 16 is a partial sectional view of a structure of a magnetic sensor according to a sixteenth embodiment of the present invention, looking from a side facing a recording medium.
Figure 17:
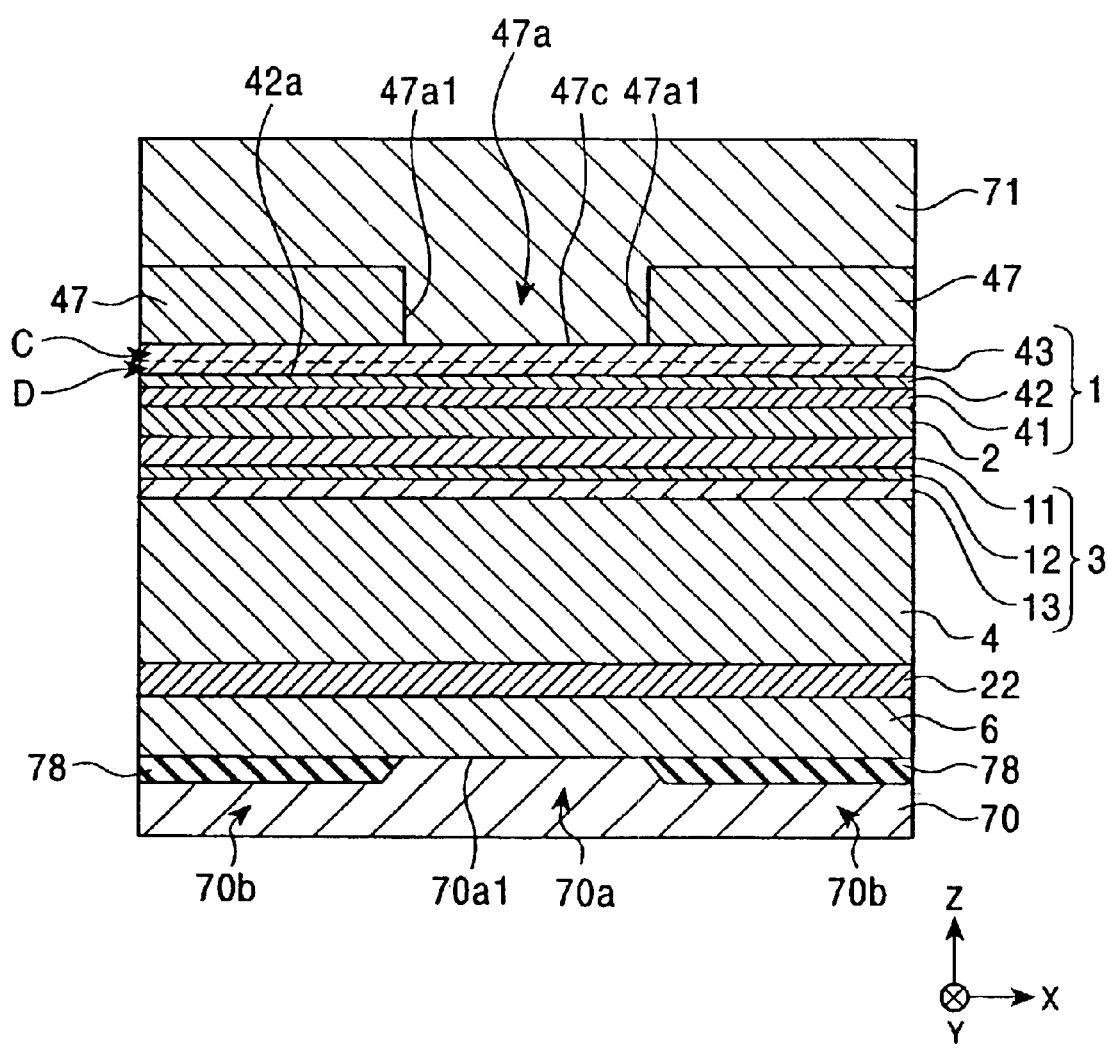
FIG. 17 is a partial sectional view of a structure of a magnetic sensor according to a seventeenth embodiment of the present invention, looking from a side facing a recording medium.

Magnetic sensors shown in FIGS. 16 and 17 are CPP type ones similarly to those shown in FIGS. 11 to 15, but differ from those shown in FIGS. 11 to 15 in shape of the lower shield layer 70.

A sixteenth embodiment shown in FIG. 16 represents a CPP type magnetic sensor having the same film makeup as that shown in FIG. 11 except that the lower shield layer 70 serving also as the lower electrode has a projection 70a projected in its central portion in the track-width direction (X-direction in FIG. 16) to project in a multilayered direction of the laminate (Z-direction in FIG. 16). An upper surface 70a1 of the projection 70a contacts a lower surface of the buffer layer 6 so that an electrical current flows from the projection 70a into the laminate (or from the laminate into the projection 70a).

Further, in the sixteenth embodiment shown in FIG. 16, an insulating layer 78 is disposed between the buffer layer 6 and each of both end portions 70b of the lower shield layer 70 in the track-width direction (X-direction). The insulating layer 78 is made of an insulating material such as $Al_2O_3$, $SiO_2$, AlN, Al—Si—O, Al—Si—O—N, $Ti_2O_3$ or $Ti_3O_5$.

The sixteenth embodiment shown in FIG. 16 has the advantages given below. The projection 70a formed on the lower shield layer 70 narrows the current path in the magnetic sensor. With the insulating layer 78 disposed between each of both the end portions 70b of the lower shield layer 70 and the laminate, an electrical current can be satisfactorily suppressed from being shunted from both the end portions 70b into the laminate, and a magnetic sensor having a high reproduction output and a narrow effective track width can be more effectively manufactured.

While in the sixteenth embodiment shown in FIG. 16 an upper surface 70a1 of the projection 70a of the lower shield layer 70 has a width in the track-width direction (X-direction) equal to the width of a region H in the track-width direction (X-direction), the width of the upper surface 70a1 may be larger than that of the region H. More preferably, the width of the upper surface 70a1 is equal to the track width Tw. That feature makes it possible to more effectively manufacture a magnetic sensor in which the current can be allowed to flow into the region corresponding to the track width Tw within the magnetic sensor and a higher reproduction output can be obtained.

Also, in the sixteenth embodiment shown in FIG. 16, both lateral surfaces 70a2 of the projection 70a formed on the lower shield layer 70 in the track-width direction (X-direction) are formed as inclined surfaces or curved surfaces such that the width of the projection 70a in the track-width direction gradually increases as both the lateral surfaces 70a2 approach the side farther away from the laminate (in a direction opposed to the Z-direction). However, both the lateral surfaces 70a2 may be perpendicular relative to the track-width direction (X-direction).

A seventeenth embodiment shown in FIG. 17 has a lower shield layer 70 in the same form as that shown in FIG. 16. More specifically, the lower shield layer 70 shown in FIG. 17 has a projection 70a projected in its central portion in the track-width direction (X-direction in FIG. 17) to project in a multilayered direction of the laminate (Z-direction in FIG. 17). An upper surface 70a1 of the projection 70a contacts a lower surface of the buffer layer 6 so that an electrical current flows from the projection 70a into the laminate (or from the laminate into the projection 70a). Then, an insulating layer 78 is disposed between the buffer layer 6 and each of both end portions 70b of the lower shield layer 70 in the track-width direction (X-direction).

The seventeenth embodiment shown in FIG. 17 differs from the sixteenth embodiment shown in FIG. 16 in that the first insulating layer 72 is not disposed on the second antiferromagnetic layer 47 and the second insulating layer 73 is not disposed on each of the opposed lateral surfaces 47a1 of the spacing 47a. Further, the upper shield layer 71 serving also as the upper electrode is directly joined so as to cover the second antiferromagnetic layer 47 and the opposed lateral surfaces 47a1 and the bottom surface 47c of the spacing 47a.

In the seventeenth embodiment shown in FIG. 17, since insulation is established neither between the upper shield layer 71 and the second antiferromagnetic layer 47, nor between the upper shield layer 71 and the opposed lateral surfaces 47a1 of the spacing 47a, it seems that the current path tends to become wider than the track width Tw and the reproduction output is reduced in comparison with the sixteenth embodiment shown in FIG. 16. In fact, however, since the projection 70a is formed on the lower shield layer 70 at the underside of the magnetic sensor, the current path can be narrowed with suppression of spreading thereof and a reduction of the reproduction output can be suppressed.

Further, in the magnetic sensors shown in FIGS. 16 and 17, the upper surface 70a1 of the projection 70a formed on the lower shield layer 70 is preferably formed flush with upper surfaces of the insulating layers 78 formed on both sides of the projection 70a. As a result, a magnetic sensor can be manufactured in which each layer of the laminate can be formed over the projection 70a and the insulating layers 78 to have a film surface more exactly parallel to the track-width direction and more superior reproduction characteristics are obtained.

In each of the CPP type magnetic sensors shown in FIGS. 11 to 17, the lower shield layer 70 and the upper shield layer 71 are formed in contact with the bottom and top surfaces of the laminate, respectively, and both the shield layers 70, 71 function also as electrode layers. Such an arrangement is advantageous in eliminating the necessity of forming the electrode layer and the shield layer separately from each other, and facilitating manufacture of the CPP type magnetic sensor.

In addition, with each shield layer having both the electrode function and the shielding function, a gap length G1 determined by the distance between the two shield layers can be set to a smaller value (see FIG. 11, when the nonmagnetic layer 76 is disposed, the gap length G1 is determined including the film thickness of the nonmagnetic layer 76). Hence, a magnetic sensor more satisfactorily adaptable for a higher recording density expected in the future can be manufactured.

However, the present invention is not limited to the embodiments shown in FIGS. 11 to 17, but it may be modified such that electrode layers made of, e.g., Au, W, Cr or Ta are disposed on the top and/or bottom surfaces of the laminate and a shield layer made of a magnetic material is disposed on a surface of the electrode layer, which is located on the side opposed to the magnetic sensor, with a gap layer interposed therebetween.

A method of manufacturing the magnetic sensor shown in FIG. 11 and the magnetic sensor shown in FIG. 12 will be described below.

First, on the lower shield layer 70 made of a magnetic material and formed by plating, the buffer layer 6, the seed layer 22, the antiferromagnetic layer 4, the pinned magnetic layer 3, the nonmagnetic material layer 2, the free magnetic layer 1, the second antiferromagnetic layer 47, and the first insulating layer 72 are successively formed in that order by sputtering.

Alternatively, when the third antiferromagnetic layer 50 is disposed as with the magnetic sensor shown in FIG. 13, the third antiferromagnetic layer 50 (30 to 50 Å) and the nonmagnetic layer 51 (made of, e.g., Ru) (3 to 10 Å) are formed on the free magnetic layer 1. First annealing is then carried out under a magnetic field applied in the Y-direction so that the antiferromagnetic layer 4 is regularly transformed. After removing the nonmagnetic layer 51 by low-energy ion milling, the second antiferromagnetic layer 47 and the first insulating layer 72 are successively formed by sputtering without breaking a vacuum.

Figure 18:
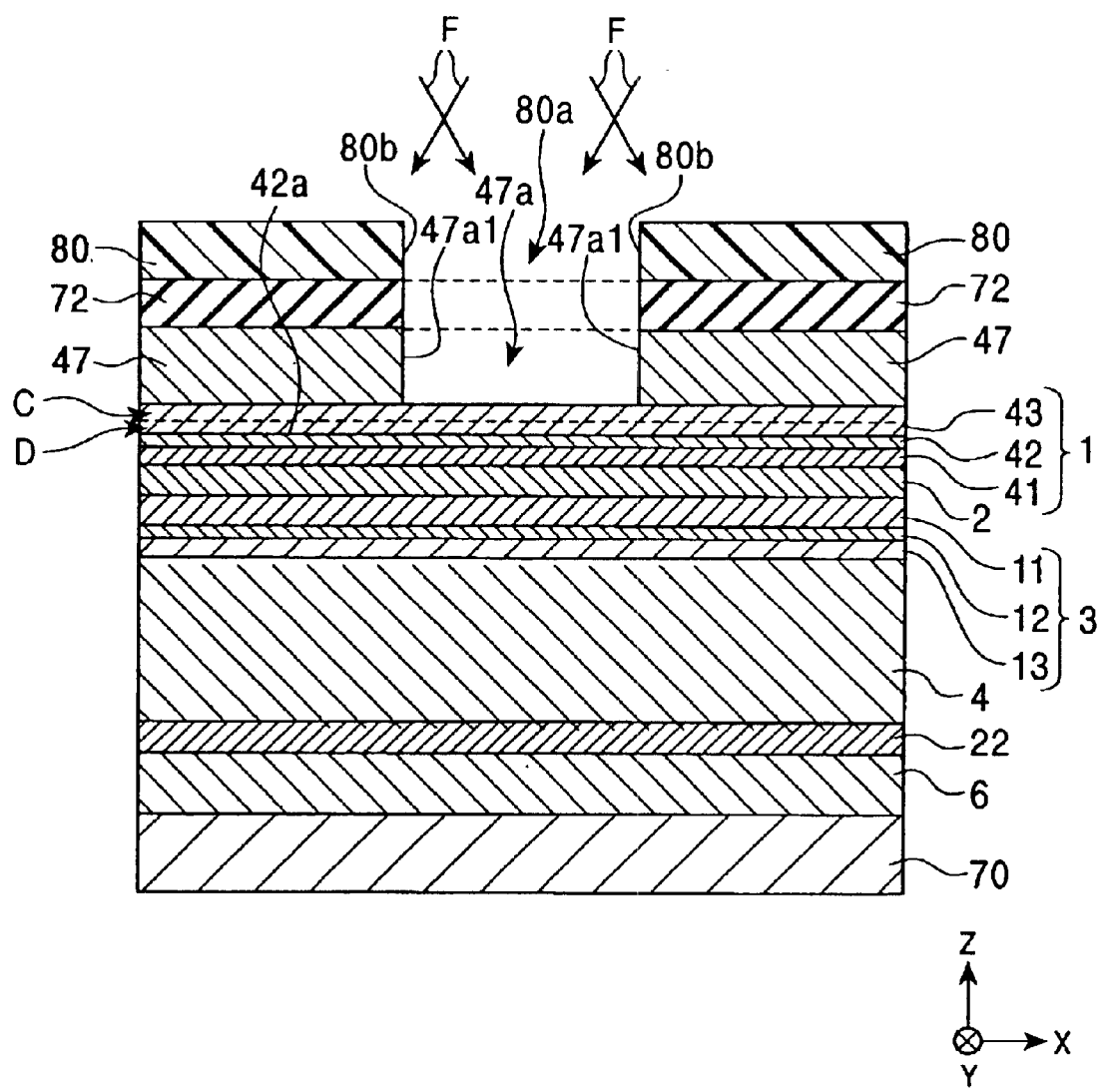
FIG. 18 is a partial sectional view showing one step of a method of manufacturing the magnetic sensor according to the eleventh embodiment.

Then, as shown in FIG. 18, a resist layer 80 is formed on the first insulating layer 72, and a hole 80a is formed in a central portion of the first insulating layer 72 in the track-width direction (X-direction in FIG. 18) by steps of exposure and development. However, when, instead of successively forming the first insulating layer 72 as a continuous film in the previous step, the first insulating layer 72 is formed in such a shape as shown in FIG. 18 beforehand by using, e.g., a resist that is formed on the second antiferromagnetic layer 47 or on a barrier layer disposed on the second antiferromagnetic layer 47, there is no need of forming the resist in the subsequent step because the first insulating layer 72 itself can serve also as a mask in etching.

Then, portions of the first insulating layer 72 and the second insulating layer 47 not covered with the resist layer 80 are cut out by ion milling applied in the direction of an arrow F in FIG. 18 (the portions of those layers denoted by dotted lines in FIG. 18 are removed).

In FIG. 18, inner end surfaces 80b of the resist layer 80 are shown as being vertical surfaces. When the inner end surfaces 80b are formed as inclined surfaces or curved surfaces, the opposed lateral surfaces 47a1 of the spacing 47a formed in the magnetic sensor by cutting with the ion milling are also formed as inclined surfaces or curved surfaces. Thereafter, the resist layer 80 is removed.

Figure 19:
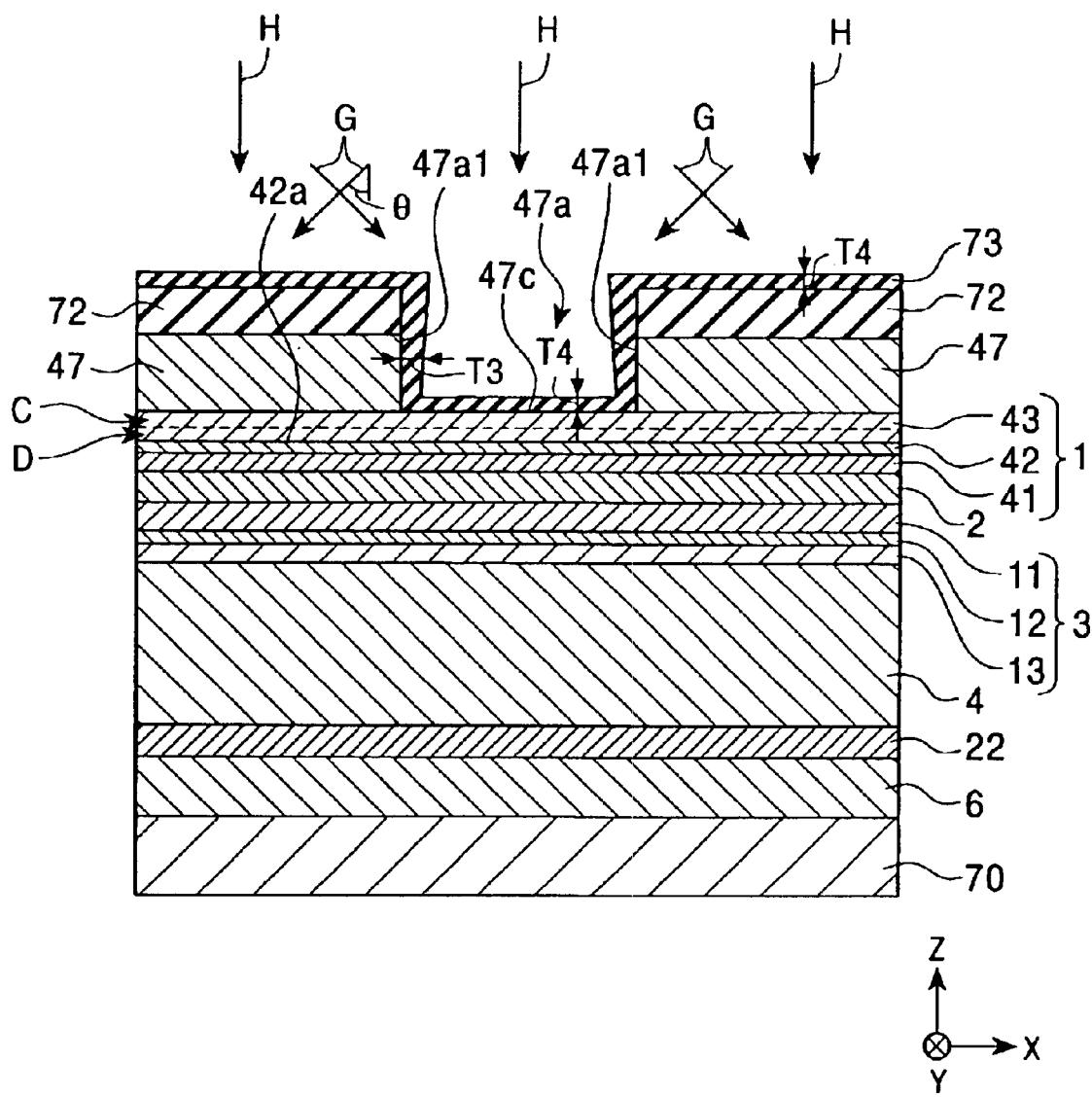
FIG. 19 is a partial sectional view showing another step of the manufacturing method subsequent to the step of FIG. 18.

In the step shown in FIG. 19, the second insulating layer 73 made of an insulating material, such as $Al_2O_3$, $SiO_2$, AlN, Al—Si—O, Al—Si—O—N, $Ti_3O_5$, or $Ti_2O_3$, is formed by sputtering so as to cover the first insulating layer 72 and the opposed lateral surfaces 47a1 and the bottom surface 47c of the spacing 47a. For the sputtering, ion beam sputtering, long throw sputtering, collimation sputtering, etc. are usable.

The point to be noted herein is a sputtering angle $\theta 1$ (inclination with respect to the Z-direction in FIG. 19) in the step of forming the second insulating layer 73. As shown in FIG. 19, a sputtering direction G is inclined at the sputtering angle $\theta 1$ with respect to the direction perpendicular to the film surface of each layer of the laminate. In the present invention, however, the sputtering angle $\theta 1$ is preferably set to be as large as possible (i.e., the sputtering direction G is preferably set to be as close as possible to the horizontal) so that the second insulating layer 73 is more easily formed on the lateral surface 47a1 of the spacing 47a. For example, the sputtering angle $\theta 1$ is preferably in the range of 50 to 70°.

By increasing the sputtering angle $\theta 1$ as described above, a film thickness T3 of the second insulating layer 73 in the track-width direction (X-direction) formed on the lateral surfaces 47a1 of the spacing 47a can be made greater than a film thickness T4 of the second insulating layer 73 formed on the upper surface of the first insulating layer 72 and on the bottom surface 47c of the spacing 47a. Unless the film thickness of the second insulating layer 73 is not adjusted as described above, the second insulating layer 73 on each of the lateral surfaces 47a1 of the spacing 47a would be all removed by the ion milling in the next step. Even when the second insulating layer 73 is left, its film thickness becomes very small so that the second insulating layer 73 cannot function as an insulating layer to satisfactorily reduce the shunt loss.

Then, as shown in FIG. 19, ion milling is carried out in the direction perpendicular to the film surface of each layer of the laminate (i.e., in the direction parallel to the Z-direction in FIG. 19) or at an angle close to the perpendicular direction (about 0° to 20° relative to the direction perpendicular to the film surface of each layer of the laminate). On that occasion, the ion milling is carried out until the second insulating layer 73 formed on the bottom surface 47c of the spacing 47a is appropriately removed. With the above ion milling, the second insulating layer 73 formed on the upper surface of the second antiferromagnetic layer 47 is also removed. At the same time, the second insulating layer 73 formed on the lateral surface 47a1 of the spacing 47a is cut to some extent. However, since the second insulating layer 73 formed on the lateral surface 47a1 of the spacing 47a has the film thickness T3 greater than that formed on the bottom surface 47c of the spacing 47a and the ion milling is carried out in a milling direction H that is inclined as viewed from the second insulating layer 73 formed on the lateral surface 47a1 of the spacing 47a, the second insulating layer 73 formed on the lateral surface 47a1 of the spacing 47a is harder to cut than the second insulating layer 73 formed on the bottom surface 47c of the spacing 47a. Accordingly, the second insulating layer 73 is left in an appropriate film thickness on the lateral surface 47a1 of the spacing 47a.

Figure 20:
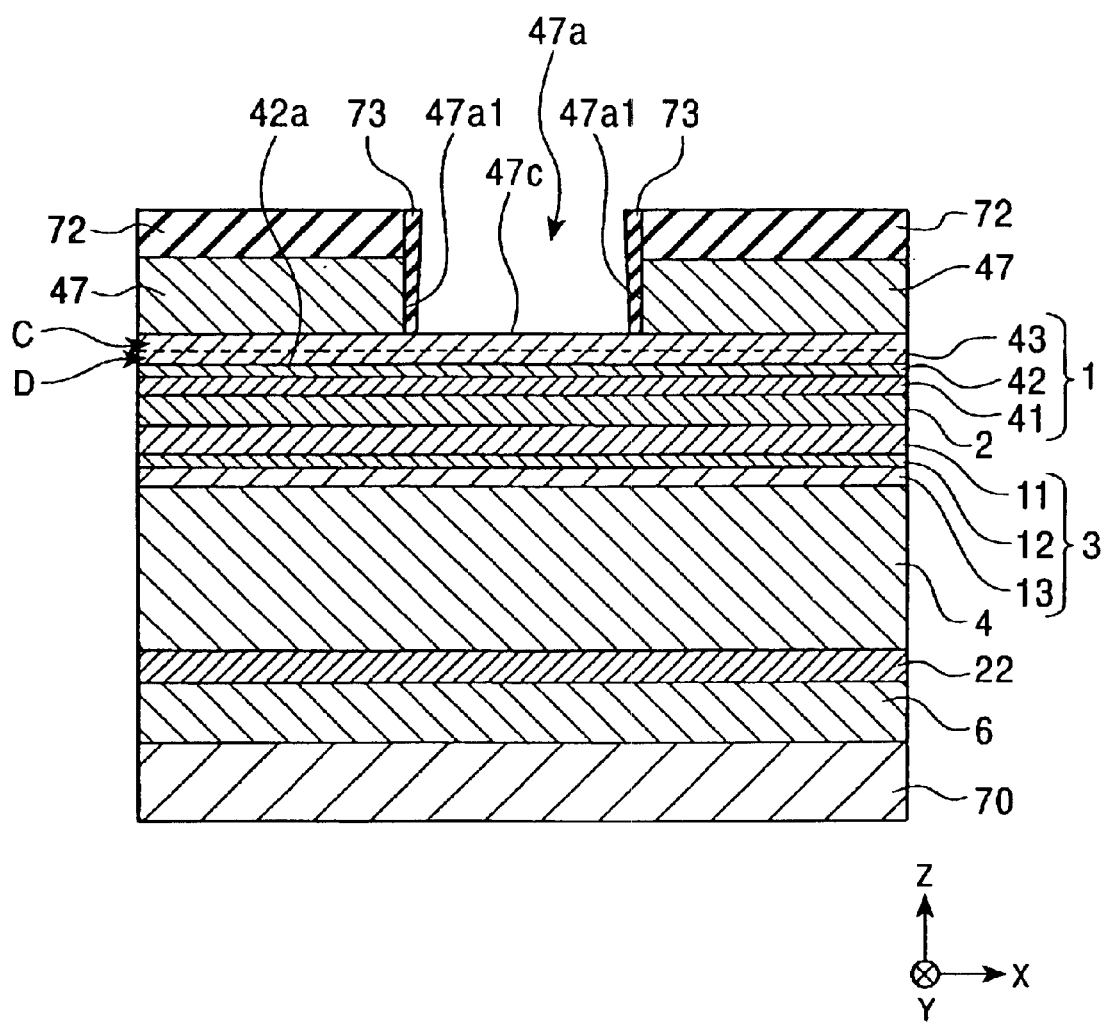
FIG. 20 is a partial sectional view showing still another step of the manufacturing method subsequent to the step of FIG. 19.

A thus-resulting state is shown in FIG. 20. The second insulating layer 73 left on the lateral surface 47a1 of the spacing 47a preferably has the film thickness T3 of about 5 to 10 nm in the track-width direction.

In the state shown in FIG. 20, the upper surface of the second antiferromagnetic layer 47 is covered with the first insulating layer 72, and the lateral surface 47a1 of the spacing 47a is covered with the second insulating layer 73. Then, second annealing is carried out under a weak magnetic field applied in the track-width direction so that the second antiferromagnetic layer 47 (or the second and third antiferromagnetic layers 47, 50 in the magnetic sensor shown in FIG. 13) is regularly transformed and the magnetization of the free magnetic layer 1 in its both end portions is fixed in the X-direction. Subsequently, if necessary, the nonmagnetic layer 76 shown in FIG. 11 is formed to cover both the insulating layers 72, 73 and the bottom surface 47c of the spacing 47a. Thereafter, the upper shield layer 71 serving also as the upper electrode is formed by plating.

In the magnetic sensor manufactured as described above, the upper surface of the second antiferromagnetic layer 47 and the lateral surface 47a1 of the spacing 47a can be satisfactorily covered with both the insulating layers 72, 73. Therefore, a CPP type magnetic sensor capable of satisfactorily suppressing the shunt loss of an electrical current flowing from the shield layer can be manufactured.

Next, the magnetic sensor shown in FIG. 12 is manufactured as follows. First, on the lower shield layer 70 made of a magnetic material and formed by plating, the buffer layer 6, the seed layer 22, the antiferromagnetic layer 4, the pinned magnetic layer 3, the nonmagnetic material layer 2, the free magnetic layer 1, and the nonmagnetic layer 51 are successively formed in that order by sputtering.

After forming a resist layer for lift-off on the central portion 51b of the nonmagnetic layer 51, both the end portions 51a of the nonmagnetic layer 51, which are not covered with the resist layer, are cut in to a predetermined position. Then, the second antiferromagnetic layer 47 and the insulating layer 77 are successively formed on both the end portions 51a of the nonmagnetic layer 51 by sputtering. Subsequently, a buffer layer of the same material as that of the upper shield layer 70 is formed by sputtering so as to cover the insulating layer 77 and the central portion 51b of the nonmagnetic layer 51, and thereafter the upper shield layer 71 of the magnetic material is formed by plating. By setting the sputtering angle (inclination with respect to the Z-direction) in the step of forming the insulating layer 77 to be larger (i.e., closer to the horizontal) than that in the step of forming the second antiferromagnetic layer 47, the inner end portion 77a of the insulating layer 77 can be more easily formed in such a manner that it extends to lie over the corresponding end of the central portion 51b of the nonmagnetic layer 51.

An upper section of each of the magnetic sensors shown in FIGS. 13 and 15 can be formed through the same steps as those for FIG. 11 (i.e., the steps described above with reference to FIGS. 18 to 20) and hence a description thereof is omitted herein. Also, an upper section of the magnetic sensor shown in FIG. 14 can be formed through the same steps as those for FIG. 12 and hence a description thereof is omitted herein.

In the magnetic sensors shown in FIGS. 16 and 17, the projection 70a is formed on the lower shield layer 70 and the insulating layer 78 is formed between each of both end portions 70b of the lower shield layer 70 and the buffer layer 6. To that end, after forming the lower shield layer 70 by plating or sputtering and polishing the upper surface of the lower shield layer 70 into a smooth surface, a resist layer is formed on a central portion of the lower shield layer 70 in the track-width direction (X-direction). Then, both the end portions 70b of the lower shield layer 70, which are not covered with the resist layer, are cut in halfway by ion milling. As a result, the projection 70a is formed on a central portion of the lower shield layer 70 in the track-width direction.

Furthermore, the insulating layer 78 is formed by sputtering on both the end portions 70b of the lower shield layer 70 which are not covered with the resist layer. At the time when an upper surface of the insulating layer 78 becomes substantially flush with the upper surface 70a1 of the projection 70a of the lower shield layer 70, the film forming step by the sputtering is brought to an end. The resist layer is then removed. After removing the resist layer, the upper surface 70a1 of the projection 70a of the lower shield layer 70 and the upper surface of the insulating layer 78 may be polished by CMP, for example, so that the upper surface 70a1 of the projection 70a and the upper surface of the insulating layer 78 are flush with each other at high accuracy. In that case, the polishing step first mentioned can be dispensed with.

Figure 21:
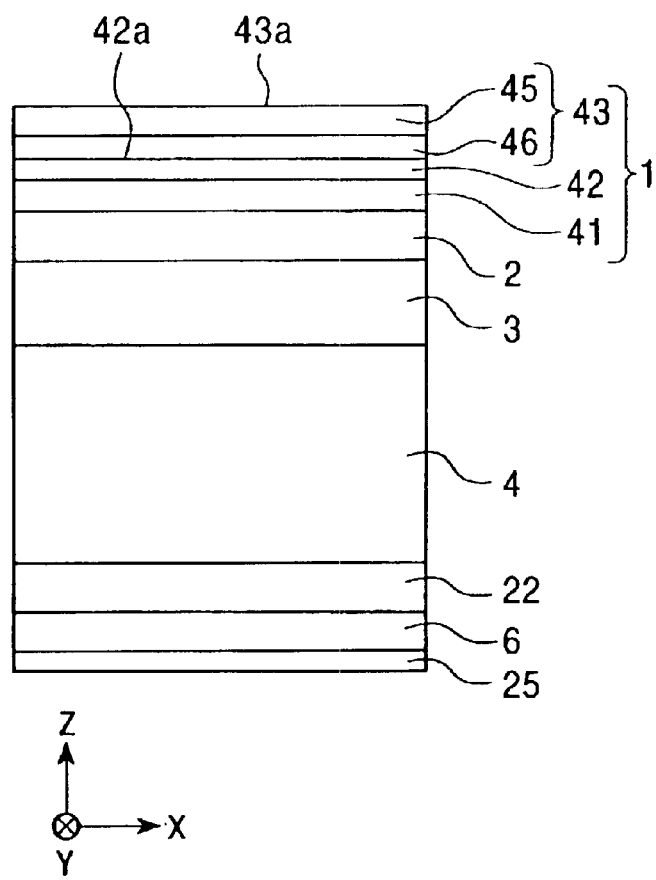
FIG. 21 is a partial sectional view (schematic view) for explaining one step of a method of manufacturing the magnetic sensor according to each of the embodiments.

Of the method of manufacturing the magnetic sensor in common to the various embodiments, a method of manufacturing the free magnetic layer 1, in particular, will be primarily described below with reference to FIG. 21. FIG. 21 is a partial schematic view for explaining the manufacturing method.

First, the buffer layer 6 is formed on a substrate 25. The buffer layer 6 is preferably made of at least one element selected from among Ta, Hf, Nb, Zr, Ti, Mo and W. Then, the seed layer 22 is formed on the buffer layer 6 by sputtering. In the sputtering step, a target made of NiFeCr or Cr is prepared. The seed layer 22 is formed in film thickness of, e.g., about 20 Å to 60 Å. When the seed layer 22 is made of NiFeCr, the composition ratio is given as, e.g., $(Ni_{0.8}Fe_{0.2})_{60\ at\ \%}Cr_{40\ at\ \%}$.

Then, the antiferromagnetic layer 4 is formed on the seed layer 22 by sputtering.

In the present invention, the antiferromagnetic layer 4 is preferably formed of an antiferromagnetic material containing an element X (X represents one or more elements selected from among Pt, Pd, Ir, Rh, Ru and Os) and Mn by sputtering.

Also, in the present invention, the antiferromagnetic layer 4 may be formed by sputtering using an X—Mn—X' alloy (X' represents one or more elements selected from among Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements).

Further, in the present invention, the composition ratio of the element X or the elements X+X' is preferably held in the range of 45 at % to 60 at %.

Then, the pinned magnetic layer 3 is formed on the antiferromagnetic layer 4 by sputtering, the nonmagnetic material layer 2 made of, e.g., Cu is formed on the pinned magnetic layer 3, and the free magnetic layer 1 is formed on the nonmagnetic material layer 2. In the present invention, the free magnetic layer 1 is formed of a multilayered ferri-structure. Specifically, the free magnetic layer 1 has a three-layered structure made up of the second magnetic layer 41 formed in contact with the nonmagnetic material layer 2, the nonmagnetic intermediate layer 42, and the first magnetic layer 43 formed in an opposing relation to the second magnetic layer 41 with the nonmagnetic intermediate layer 42 interposed therebetween.

In the present invention, the free magnetic layer 1 is formed in accordance with the method described below. First, the second magnetic layer 41 is formed on the nonmagnetic material layer 2 by sputtering. In the present invention, the second magnetic layer 41 may be made of any kind of magnetic material. For the purpose of satisfactorily increasing the coupling magnetic field based on the RKKY interaction generated between the first magnetic layer 43 and the second magnetic layer 41 as described later, however, the second magnetic layer 41 is preferably made of a CoFe alloy or a CoFeNi alloy.

Then, the nonmagnetic intermediate layer 42 is formed on the second magnetic layer 41 by sputtering. The nonmagnetic intermediate layer 42 is preferably made of one or more (alloy) selected from among Ru, Rh, Ir, Os, Cr, Re and Cu.

Then, the first magnetic layer 43 is formed on the nonmagnetic intermediate layer 42. In the present invention, the magnetic layer 46 made of a magnetic material not containing an element X (X represents at least one element selected from among Cr, Ti, V, Zr, Nb, Mo, Hf, Ta and W), preferably, e.g., a CoFe alloy, is first formed on the nonmagnetic intermediate layer 42 by sputtering.

Then, the magnetic layer 45 made of a magnetic material containing the element X (X represents at least one element selected from among Cr, Ti, V, Zr, Nb, Mo, Hf, Ta and W), preferably, e.g., a CoFeX or CoFeNiX alloy (more preferably a CoFeCr or CoFeNiX alloy), is formed on the magnetic layer 46 by sputtering. The composition ratio of the element X is preferably held in the range of 3 at % to 15 at %.

Then, heat treatment is carried out. As stated above, the antiferromagnetic layer 4 is preferably formed of an X—Mn alloy or an X—Mn—X' alloy. In the case using such an antiferromagnetic material, an exchange coupling magnetic field (Hex) is not generated at the interface between the antiferromagnetic layer 4 and the pinned magnetic layer 3 unless subjected to heat treatment. In the present invention, therefore, heat treatment is carried out to generate the exchange coupling magnetic field (Hex) at the interface between the antiferromagnetic layer 4 and the pinned magnetic layer 3. Also, by applying a magnetic field in a direction parallel to the Y-direction in FIG. 21 during the heat treatment, magnetization of the pinned magnetic layer 3 can be fixed in the direction parallel to the Y-direction.

In the present invention, since the first magnetic layer 43 of the free magnetic layer 1 includes the magnetic layer 46 not containing the element X on the side in contact with the nonmagnetic intermediate layer 42, a coupling magnetic field based on the RKKY interaction generated between the magnetic layer 46 and the second magnetic layer 41 can be increased.

By carrying out the heat treatment under a magnetic field to generate the exchange coupling magnetic field between the antiferromagnetic layer 4 and the pinned magnetic layer 3, or by carrying out heat treatment under a magnetic field to generate exchange coupling magnetic fields between the first magnetic layer 43 of the free magnetic layer 1 and the second antiferromagnetic layer 47, between the second antiferromagnetic layer 47 and the ferromagnetic layer 52, etc. in the magnetic sensors according to the embodiments shown in FIGS. 6 to 17, there occurs thermal diffusion between the magnetic layer 45 and the magnetic layer 46 of the first magnetic layer 43 constituting the free magnetic layer 1, whereupon the elements are mixed with each other at an interface between the magnetic layer 45 and the magnetic layer 46.

After the heat treatment, therefore, a clear boundary cannot be discerned between the magnetic layer 45 and the magnetic layer 46 shown in FIG. 21, and the first magnetic layer 43 constituting the free magnetic layer 1 appears as a single layer. Accordingly, by measuring the composition ratio of the first magnetic layer 43 constituting the free magnetic layer 1 after the heat treatment, it is confirmed that composition modulation occurs in the first magnetic layer 43.

The composition modulation appears such that, in an area near the interface between the magnetic layer 45 and the magnetic layer 46 of the free magnetic layer 1, the composition ratio of the element X gradually reduces toward the side of the nonmagnetic intermediate layer 42 from the side near the opposite surface 43a of the first magnetic layer 43 away from the interface 42a between the first magnetic layer 43 and the nonmagnetic intermediate layer 42 (i.e., in a direction opposed to the Z-direction in FIG. 21).

However, that composition modulation does not in some cases such as when the antiferromagnetic layer 4, the second antiferromagnetic layer 47, etc. are made of a material capable of generating the exchange coupling magnetic field (Hex) with respect to the pinned magnetic layer 3, the free magnetic layer 1, etc. without heat treatment, or when heat treatment conditions are set to a level at which thermal diffusion will not occur between the magnetic layer 45 and the magnetic layer 46 constituting the first magnetic layer 43 of the free magnetic layer 1. In those cases, the interface between the magnetic layer 45 and the magnetic layer 46 can be clearly observed, or though not clearly observed, it is possible to confirm such an extreme variation in the composition ratio of the element X that the composition ratio of the element X abruptly approaches 0 at % near the interface between both the magnetic layers 45 and 46 in the course toward the side of the nonmagnetic intermediate layer 42 from the side near the opposite surface 43a of the first magnetic layer 43 opposed to the nonmagnetic intermediate layer 42.

While the manufacturing method shown in FIG. 21 forms the first magnetic layer 43 of a two-layered structure made up of the magnetic layer 45 and the magnetic layer 46, the first magnetic layer 43 may be of a three or more-layered structure. Also in that case, a magnetic layer containing the element X and having a high specific resistance is disposed on the side near the opposite surface 43a of the first magnetic layer 43 away from the interface 42a between the first magnetic layer 43 and the nonmagnetic intermediate layer 42, and a magnetic layer not containing the element X and having a low specific resistance is disposed on the side contacting the nonmagnetic intermediate layer 42.

As another manufacturing method, a target made of, e.g., CoFe or CoFeNi and a target made of the element X (preferably Cr) are prepared in the step of forming the first magnetic layer 43. In an initial stage of the step of forming the first magnetic layer 43 on the interface 42a with respect to the nonmagnetic intermediate layer 42, electrical power is supplied only to the target made of CoFe or CoFeNi, thereby forming a magnetic layer made of CoFe or CoFeNi. Then, electrical power is further supplied to the target made of the element X in a gradually increasing amount so that the element X is mixed in the formed film of CoFe or CoFeNi. Eventually, a magnetic layer formed of a CoFeX alloy or a CoFeNiX alloy containing the element X can be formed in a position on the side near the opposite surface 43a of the first magnetic layer 43 away from the interface 42a between the first magnetic layer 43 and the nonmagnetic intermediate layer 42.

That another manufacturing method can also provide a structure in which a CoFe or CoFeNi alloy not containing the element X and having a low specific resistance is present near the interface 42a between the first magnetic layer 43 and the nonmagnetic intermediate layer 42, and a greater coupling magnetic field can be generated based on the RKKY interaction between the first magnetic layer 43 and the second magnetic layer 41. On the other hand, the magnetic layer containing the element X and having a high specific resistance can be formed on the side near the opposite surface 43a of the first magnetic layer 43 away from the interface 42a between the first magnetic layer 43 and the nonmagnetic intermediate layer 42. Accordingly, the loss of the sensing current shunted to the first magnetic layer 43, i.e., the shunt loss, can be reduced and a magnetic sensor having an increased resistance change rate ($\Delta R/R$) can be manufactured.

Particularly, in the structure wherein magnetization of the free magnetic layer 1 is controlled by the exchange biasing method as shown in FIGS. 6 to 17, since the element-X containing magnetic layer of the first magnetic layer 43 constituting the free magnetic layer 1 faces the second antiferromagnetic layer 47 (or the third antiferromagnetic layer 50 in FIGS. 7 and 8), the exchange coupling magnetic field generated between the first magnetic layer 43 of the free magnetic layer 1 and the second antiferromagnetic layer 47 can be strengthened, and the unidirectional exchange bias magnetic field (Hex*) in the free magnetic layer 1 can be increased. The magnetization of the free magnetic layer 1 can be more satisfactorily controlled.

Figure 22:
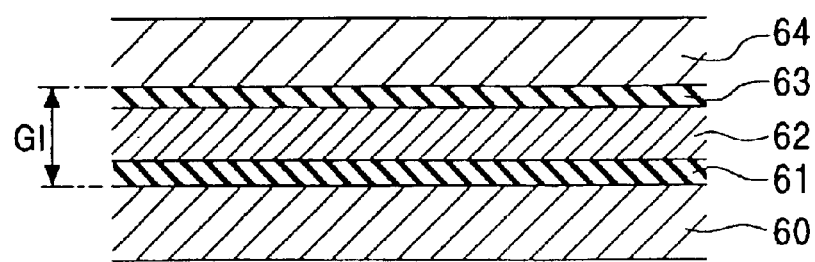
FIG. 22 is a partial sectional view of a thin-film magnetic head having a magnetic sensor.

FIG. 22 is a partial sectional view showing a structure of a reading head in which any of the magnetic sensors shown in FIGS. 1 to 3 and 6 to 10 is formed, looking from a side facing a recording medium.

A lower gap layer 61 is formed on a lower shield layer 60 made of, e.g., a NiFe alloy. A magnetic sensor 62 shown in any of FIGS. 1 to 3 and 6 to 10 is formed on the lower gap layer 61. An upper gap layer 63 is formed on the magnetic sensor 62. Further, an upper shield layer 64 made of, e.g., a NiFe alloy is formed on the upper gap layer 63.

The lower gap layer 61 and the upper gap layer 63 are each made of an insulating material such as $SiO_2$ or $Al_2O_3$ (alumina). As shown in FIG. 22, the length from the lower gap layer 61 to the upper gap layer 63 defines a gap length G1. A magnetic sensor having a smaller gap length G1 is adaptable for a higher recording density.

In the present invention, a greater exchange coupling magnetic field (Hex) can be generated in spite of reducing the film thickness of each of the antiferromagnetic layer 4 and the second antiferromagnetic layer 47. The film thickness of the antiferromagnetic layer 4 and the second antiferromagnetic layer 47 is set to be not smaller than 150 Å, for example. Stated otherwise, the film thickness of the antiferromagnetic layer 4 and the second antiferromagnetic layer 47 can be sufficiently reduced in comparison with the related art in which the film thickness has been about 300 Å. The reason why a greater exchange coupling magnetic field (Hex) can be obtained with the present invention is in that the area C made of a magnetic material containing the element X, such as a CoFeX or CoFeNiX alloy, and having a high specific resistance is formed in the first magnetic layer 43 of the free magnetic layer 1 on the side facing the second antiferromagnetic layer 47, or the area E made of a magnetic material containing the element X, such as a CoFeX alloy, and having a high specific resistance is formed in the first magnetic layer 13 of the pinned magnetic layer 3 on the side facing the antiferromagnetic layer 4. With such an arrangement, a sufficiently great exchange coupling magnetic field (Hex) can be obtained in spite of reducing the film thickness of the antiferromagnetic layer 4 and the second antiferromagnetic layer 47.

As a result, a thin-film magnetic head having a narrower gap and being adaptable for a higher recording density can be manufactured.

An inductive head for writing may be formed on the upper shield layer 64.

Additionally, the magnetic sensor of the present invention is also applicable to a magnetic sensor other than a magnetic head incorporated in a hard disk drive.

In the CPP type magnetic sensors shown in FIGS. 4, 5 and 11 to 17, the layers denoted by 65, 68, 70 and 71 are able to function as shield layers. In those cases, the structures shown in FIGS. 4, 5 and 11 to 17 constitute in themselves thin-film magnetic heads similar to that shown in FIG. 22.

EXAMPLES

As experiments for accomplishing the present invention, a multilayered film having a film makeup described below was formed and the magnitude of an exchange coupling magnetic field (Hex) generated between the free magnetic layer and the antiferromagnetic layer (or the second antiferromagnetic layer) was measured when the free magnetic layer was formed as a single magnetic layer and four kinds of materials were used for the free magnetic layer.

The film makeup comprises, from the bottom side, seed layer: $(Ni_{0.8}Fe_{0.2})_{60\ at\ \%}Cr_{40\ at\ \%}$ (55)/pinned magnetic layer: $[Ni_{80\ at\ \%}Fe_{20\ at\ \%}(50)/Co_{90\ at\ \%}Fe_{10\ at\ \%}(10)]$/nonmagnetic material layer: Cu (40)/free magnetic layer: materials are listed in Table 1 (30)/antiferromagnetic layer: $Pt_{50\ at\ \%}Mn_{50\ at\ \%}$ (160)/barrier layer: Ta (30). A numerical value in ( ) represents the film thickness in units of angstrom. In the film makeup used in the above experiments, the first antiferromagnetic layer to be inserted between the pinned magnetic layer and the seed layer is not formed. This is because the first antiferromagnetic layer in omitted in the film makeup for convenience in measuring the exchange coupling magnetic field (Hex) of the free magnetic layer based on a magnetic resistance curve (R—H curve).

After forming the magnetic sensor having the above-described film makeup, heat treatment was carried out to generate the exchange coupling magnetic field (Hex) between the antiferromagnetic layer and the free magnetic layer, which was then measured. Experiment results are listed in Table 1.

TABLE 1

| Materials of free magnetic layer | Ms of free magnetic layer (T) | Saturation Magnetization Ms Ratio to CoFe | Exchange coupling magnetic field Hex (A/m) | Exchange coupling energy J per unit area (mJ/m$^2$) |
|---|---|---|---|---|
| $(Co_{0.9}Fe_{0.1})_{95}Cr_5$ | 1.36 | 0.80 | $9.7 \times 10^4$ | 0.395 |
| $Co_{90}Fe_{10}$ | 1.70 | 1.00 | $5.1 \times 10^4$ | 0.262 |
| $Co_{50}Fe_{50}$ | 2.39 | 1.41 | $3.4 \times 10^4$ | 0.244 |
| $Ni_{60}Fe_{30}$ | 1.09 | 0.64 | $4.6 \times 10^4$ | 0.152 |

As shown in Table 1, four alloys of $(Co_{0.9}Fe_{0.1})_{95\ at\ \%}Cr_{5\ at\ \%}$, $Co_{90\ at\ \%}Fe_{10\ at\ \%}$, $Co_{50\ at\ \%}Fe_{50\ at\ \%}$, and $Ni_{80\ at\ \%}Fe_{20\ at\ \%}$ were used as material for the free magnetic layer.

As seen from Table 1, by using the CoFeCr alloy for the free magnetic layer, the exchange coupling magnetic field (Hex) can be increased from that obtained in the case using the CoFe alloy. Also, it is seen that the use of the CoFeCr alloy for the free magnetic layer can increase the exchange coupling magnetic field (Hex) about twice that obtained in the case using the NiFe alloy.

The rightmost column in Table 1 represents exchange coupling energy J per unit area. As seen from the rightmost column, the CoFeCr alloy provides the highest exchange coupling energy J.

From the experiment results of Table 1, it is confirmed that the CoFeCr alloy is more preferable than the CoFe alloy as the material of the free magnetic layer from the viewpoint of generating a greater exchange coupling magnetic field (Hex) between the free magnetic layer and the antiferromagnetic layer.

Next, a multilayered film having a film makeup described below was formed and the magnitude of a unidirectional exchange bias magnetic field (Hex*) in the free magnetic layer having a multilayered ferri-structure was measured for samples in which the first magnetic layer of the free magnetic layer was made of different materials.

Herein, the unidirectional exchange bias magnetic field (Hex*) means the magnitude of a resultant magnetic field of both the exchange coupling magnetic field (Hex) primarily generated between the antiferromagnetic layer and the free magnetic layer, and the coupling magnetic field based on the RKKY interaction generated between the first magnetic layer and the second magnetic layer of the free magnetic layer.

The film makeup used in experiments comprises, from the bottom side, seed layer: $(Ni_{0.8}Fe_{0.2})_{60\ at\ \%}Cr_{40\ at\ \%}$ (55)/pinned magnetic layer: $[Ni_{80\ at\ \%}Fe_{20\ at\ \%}(18)/Co_{90\ at\ \%}Fe_{10\ at\ \%}(10)]$/nonmagnetic material layer: Cu (21)/free magnetic layer: [second magnetic layer: see Table 2 for materials (32)/nonmagnetic intermediate layer: Ru (8.7)/first magnetic layer: see Table 2 for materials (18)]/antiferromagnetic layer: $Pt_{50\ at\ \%}Mn_{50\ at\ \%}$ (160)/barrier layer: Ta (30). A numerical value in ( ) represents the film thickness in units of angstrom. In the film makeup used in the above experiments, the first antiferromagnetic layer to be inserted between the pinned magnetic layer and the seed layer is not formed. This is because the first antiferromagnetic layer is omitted in the film makeup for convenience in measuring the exchange coupling magnetic field (Hex) of the free magnetic layer based on a magnetic resistance curve (R—H curve).

After forming the magnetic sensor having the above-described film makeup, heat treatment was carried out and the unidirectional exchange bias magnetic field (Hex*) in the free magnetic layer was then measured.

layer and the magnetization of the second magnetic layer are less apt to come out of the antiparallel state.

In other words, it is estimated that when selecting the CoFe alloy for both the first magnetic layer and the second magnetic layer, the antiparallel state of the magnetization of the first magnetic layer and the magnetization of the second magnetic layer is hardest to give away, and the coupling magnetic field based on the RKKY interaction is much higher than that obtained with the other samples.

Concluding from the above results in combination with the results obtained from Table 1, a magnetic layer made of a CoFeCr alloy should be formed in the first magnetic layer on the side nearer to the antiferromagnetic layer for the purpose of increasing the exchange coupling magnetic field (Hex) generated between the first magnetic layer and the antiferromagnetic layer, and a magnetic layer made of a CoFe alloy should be formed in the first magnetic layer on the side nearer to the nonmagnetic intermediate layer for the purpose of increasing the coupling magnetic field based on the RKKY interaction.

With such an arrangement, it is possible to obtain a great exchange coupling magnetic field (Hex) between the antiferromagnetic layer and the CoFeCr alloy, and to increase the coupling magnetic field based on the RKKY interaction generated between the CoFe alloy of the first magnetic layer, which is formed on the side nearer to the nonmagnetic intermediate layer, and the second magnetic layer. As a result, the unidirectional exchange bias magnetic field (Hex*) in the free magnetic layer can be increased from that obtained with the case forming the first magnetic layer as a single layer of the CoFe or CoFeCr alloy.

Next, a multilayered film having a film makeup described below was prepared in which the first magnetic layer was formed of a multilayered structure made up of a CoFeCr alloy and a CoFe alloy. Then, the optimum film thickness and film thickness ratio of the CoFeCr alloy were examined from the viewpoint of various characteristics.

TABLE 2

| Materials of first magnetic layer | Materials of second magnetic layer | (A) (T · nm) | Saturation magnetic field Hs (A/m) | Unidirectional exchange coupling bias magnetic field, Hex* (A/m) |
|---|---|---|---|---|
| $Co_{90}Fe_{10}$ | $Co_{90}Fe_{10}$ | 2.38 | $4.7 \times 10^5$ | $8.10 \times 10^4$ |
| $(Co_{0.9}Fe_{0.1})_{95}Cr_5$ | $Co_{90}Fe_{10}$ | 2.99 | $3.6 \times 10^5$ | $7.89 \times 10^4$ |
| $(Co_{0.9}Fe_{0.1})_{95}Cr_5$ | $(Co_{0.9}Fe_{0.1})_{95}Cr_5$ | 1.90 | $3.8 \times 10^5$ | $5.91 \times 10^4$ |
| $Co_{90}Fe_{10}$ | $(Co_{0.9}Fe_{0.1})_{95}Cr_5$ | 1.29 | $4.4 \times 10^5$ | $1.48 \times 10^4$ |

(A) Resultant magnetic moment per unit area of the first magnetic layer and the second magnetic layer in the free magnetic layer of a multilayered ferri-structure As seen from Table 2, a maximum unidirectional exchange bias magnetic field (Hex*) can be generated in the sample using the CoFe alloy as materials for both the first magnetic layer and the second magnetic layer.

Also, in the same sample, the saturation magnetic field (Hs) is much greater than that in the other samples. The saturation magnetic field (Hs) means the magnitude of a magnetic field resulting when the first magnetic layer and the second magnetic layer opposing with the nonmagnetic intermediate layer interposed therebetween are both magnetized in the same direction. A greater value of the saturation magnetic field (Hs) implies that a stronger coupling magnetic field is generated based on the RKKY interaction between the first magnetic layer and the second magnetic layer, and hence that the magnetization of the first magnetic The film makeup of the multilayered film used in experiments comprises, from the bottom side, Si substrate/alumina/seed layer: $(Ni_{0.8}Fe_{0.2})_{60\ at\ \%}Cr_{40\ at\ \%}$ (60)/pinned magnetic layer: $Co_{90\ at\ \%}Fe_{10\ at\ \%}$ (20)/nonmagnetic material layer: Cu (21)/free magnetic layer: [second magnetic layer: $Co_{90\ at\ \%}Fe_{10\ at\ \%}$ (32)/nonmagnetic intermediate layer: Ru (8.7)/first magnetic layer: $[Co_{90\ at\ \%}Fe_{10\ at\ \%}$ (14-X)]/$(Co_{0.9}Fe_{0.1})_{95\ at\ \%}Cr_{5\ at\ \%}$ (X)]/antiferromagnetic layer: $Pt_{50\ at\ \%}Mn_{50\ at\ \%}$ (150)/barrier layer: Ta (30). A numerical value in ( ) represents the film thickness in units of angstrom. In the film makeup used in the above experiments, the first antiferromagnetic layer to be inserted between the pinned magnetic layer and the seed layer is not formed. This is because the first antiferromagnetic layer is omitted in the film makeup for convenience in measuring the exchange coupling magnetic field (Hex) of the free magnetic layer based on a magnetic resistance curve (R—H curve).

After forming the multilayered film described above, it was subjected to heat treatment under a magnetic field of 800 kA/m at 290° C. for 4 hours. Note that, after the experiments, the interface between the CoFeCr alloy and the CoFe alloy constituting the first magnetic layer could not be clearly discerned because of thermal diffusion occurred between both the alloys.

In the experiments, the film thickness of the CoFeCr alloy constituting the first magnetic layer 43 was increased from 0 Å to 14 Å, whereas the film thickness of the CoFe alloy constituting the first magnetic layer 43 was decreased from 14 Å to 0 Å. The film thickness of the first magnetic layer 43 was kept at 14 Å.

Figure 23:
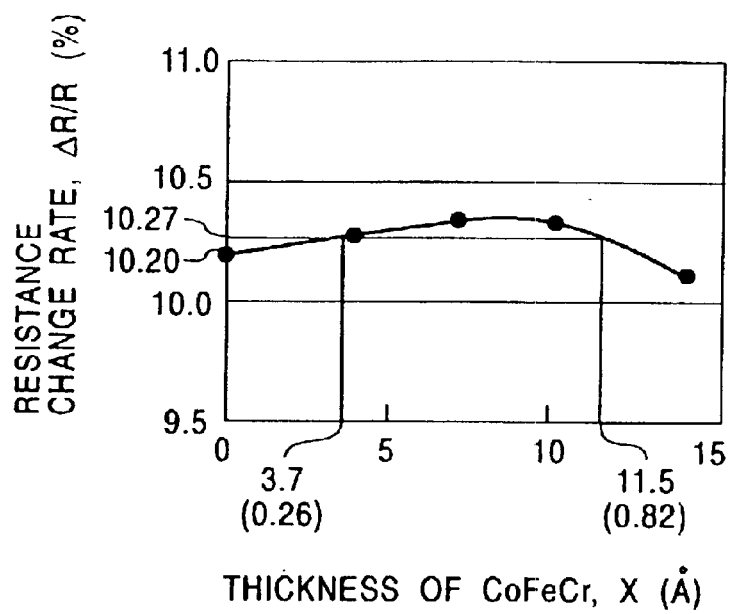
FIG. 23 is a graph showing the relationship between a film thickness of a CoFeCr alloy and a resistance change rate ($\Delta R/R$) resulting when a first magnetic layer is formed of a two-layered structure of the CoFeCr alloy and a CoFe alloy.

Then, samples were measured for the relationship between a film thickness X or a film thickness ratio of the CoFeCr alloy and a resistance change rate ($\Delta R/R$) (the term "film thickness ratio" means a ratio of the film thickness of the CoFeCr alloy to the total film thickness of the first magnetic layer and is indicated by a numerical value put in ( ) located under a value of the film thickness along the horizontal axis of a graph of FIG. 23). Experimental results are shown in FIG. 23.

As seen from FIG. 23, the resistance change rate is gradually increased as the film thickness of the CoFeCr alloy increases. However, when the film thickness of the CoFeCr alloy exceeds 10 Å, the resistance change rate starts to decline.

Therefore, the film thickness of the CoFeCr alloy is preferably selected so as to fall in the range in which the resistance change rate is larger than at least that (10.20%) obtained when the first magnetic layer is formed of the CoFe alloy alone (i.e., when the film thickness of the CoFeCr alloy is 0 Å).

Accordingly, in the present invention, the film thickness of the CoFeCr alloy is set to be larger than 0 Å but not larger than 11.5 Å (the film thickness ratio is set to be larger than 0 but not larger than 0.82). As a result, the resistance change rate of not smaller than 10.2% can be obtained.

More preferably, the film thickness of the CoFeCr alloy is set to be not smaller than 3.7 Å but not larger than 11.5 Å (the film thickness ratio is set to be not smaller than 0.26 but not larger than 0.82). As a result, the resistance change rate of not smaller than 10.27% can be obtained.

Then, the relationship between a film thickness of the CoFeCr alloy and a sheet resistance change ($\Delta Rs$) was examined. It was thought that the greater a value of the sheet resistance change, the greater is the resistance change rate ($\Delta R/R$).

Figure 24:
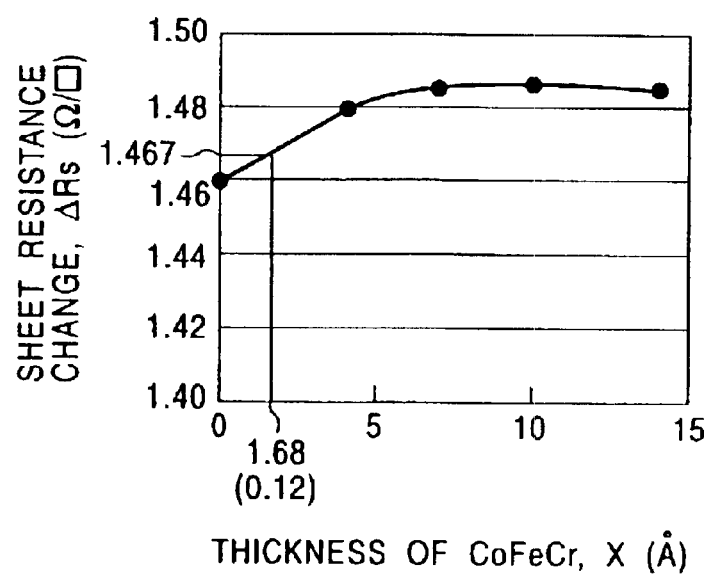
FIG. 24 is a graph showing the relationship between a film thickness of a CoFeCr alloy and a sheet resistance change ($\Delta Rs$) resulting when a first magnetic layer is formed of a two-layered structure of the CoFeCr alloy and a CoFe alloy.

Experimental results plotted in FIG. 24 show that as the film thickness of the CoFeCr alloy increases, the sheet resistance change is also increased, and when the film thickness of the CoFeCr alloy exceeds about 7 Å, the sheet resistance change becomes substantially constant.

As seen from those experimental results, when the film thickness of the CoFeCr alloy is in the range of larger than 0 Å but smaller than 14 Å (the film thickness ratio is in the range of larger than 0 but smaller than 1), the sheet resistance change can be increased from that obtained when the first magnetic layer is formed of the CoFe alloy alone (i.e., when the film thickness of the CoFeCr alloy is 0 Å), and a value of the sheet resistance change not smaller than 1.459 $\Omega/\square$ can be obtained.

Also, when the film thickness of the CoFeCr alloy is in the range of not smaller than 1.68 Å but smaller than 14 Å (the film thickness ratio is in the range of not smaller than 0.16 but smaller than 1), a value of the sheet resistance change not smaller than 1.467 $\Omega/\square$ can be obtained.

Further, when the film thickness of the CoFeCr alloy is in the range of not smaller than 7.0 Å but smaller than 14 Å (the film thickness ratio is in the range of not smaller than 0.5 but smaller than 1), a value of the sheet resistance change not smaller than 1.485 $\Omega/\square$ can be obtained.

Although it was thought, as mentioned above, that the greater a value of the sheet resistance change, the greater is the resistance change rate, it was confirmed in practice, as shown in FIG. 23, that even at the film thickness of not smaller than 10 Å at which the sheet resistance change has a high value, the resistance change rate tends to decline. Such a tendency is presumably resulted under the effect of a reduction of the unidirectional exchange bias magnetic field (Hex*) described below.

Figure 25:
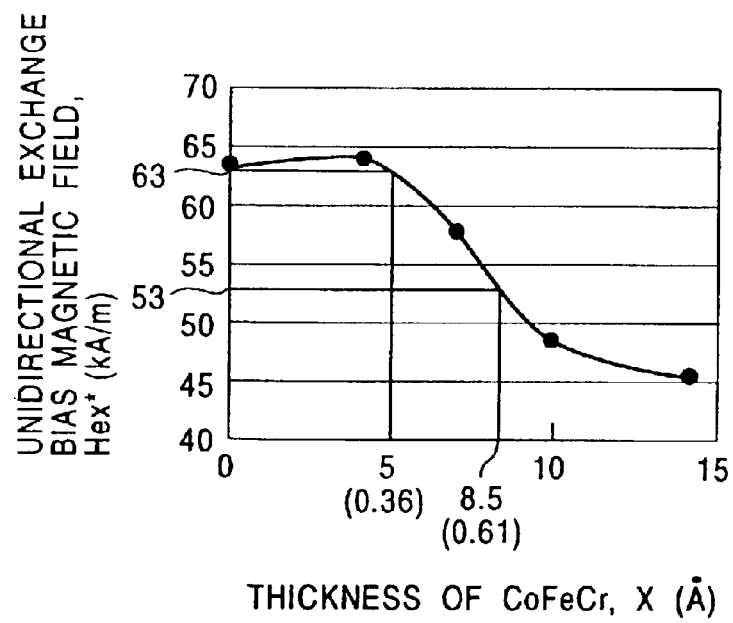
FIG. 25 is a graph showing the relationship between a film thickness of a CoFeCr alloy and a unidirectional exchange bias magnetic field (Hex*) resulting when a first magnetic layer is formed of a two-layered structure of the CoFeCr alloy and a CoFe alloy.
Figure 26:
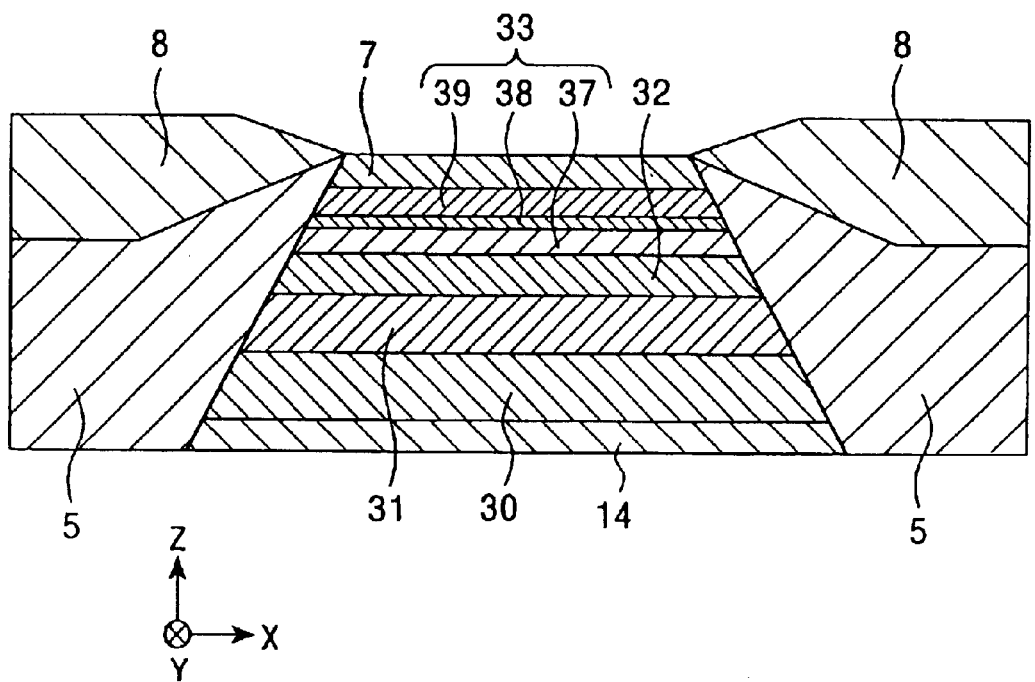
FIG. 26 is a partial sectional view of a conventional magnetic sensor, looking from a side facing a recording medium.
Figure 27:
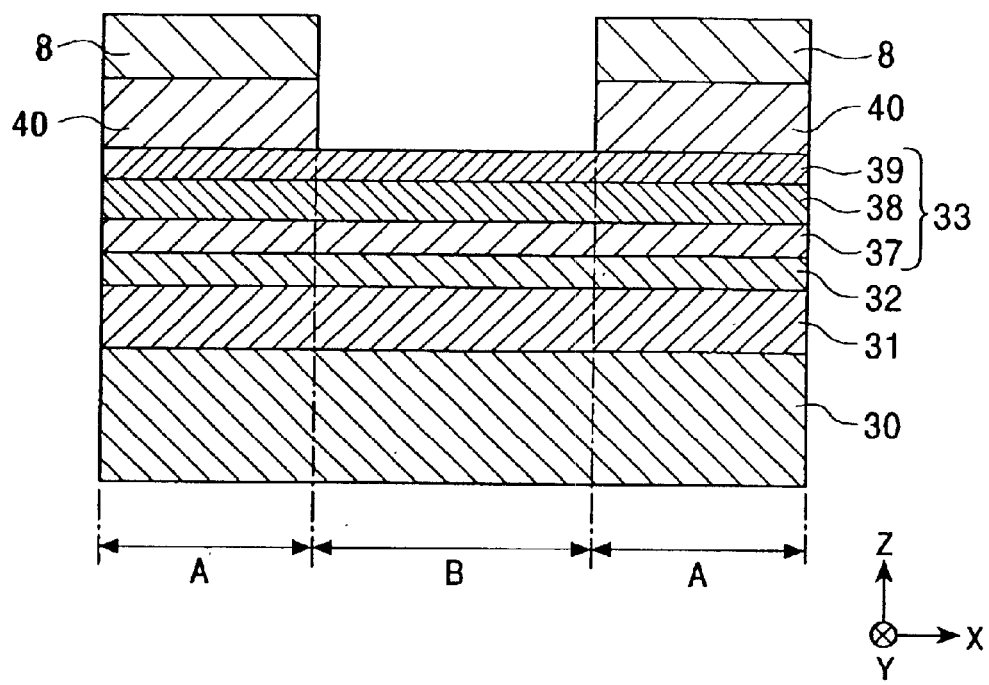
FIG. 27 is a partial sectional view of another conventional magnetic sensor having a different structure, looking from a side facing a recording medium.
Figure 28:
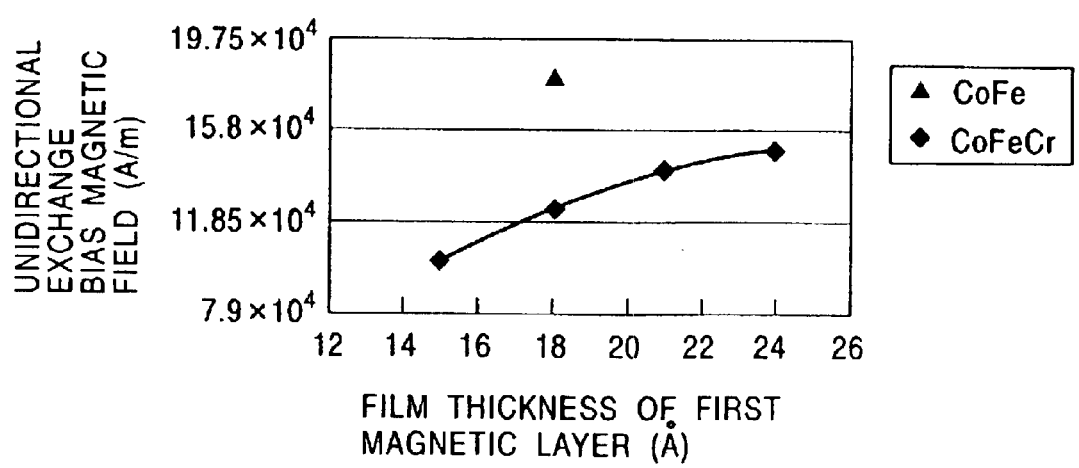
FIG. 28 is a graph showing the relationship between a film thickness of a first magnetic layer and a unidirectional exchange bias magnetic field (Hex*) resulting when the first magnetic layer of a multilayered ferri-structure is formed of a single layer of CoFe or CoFeCr.

FIG. 25 is a graph showing the relationship between the film thickness of the CoFeCr alloy and the unidirectional exchange bias magnetic field (Hex*).

As shown in FIG. 25, when the film thickness of the CoFeCr alloy is about 4 Å, the unidirectional exchange bias magnetic field (Hex*) has a maximum value. However, when the film thickness of the CoFeCr alloy is increased from 4 Å, the unidirectional exchange bias magnetic field (Hex*) declines.

The reason is presumably in that when the film thickness of the CoFeCr alloy exceeds a certain value, the coupling magnetic field based on the RKKY interaction generated between the CoFeCr alloy of the first magnetic layer and the second magnetic layer is reduced.

As seen from the experimental results of FIG. 25, the film thickness of the CoFeCr alloy is preferably larger than 0 Å but not larger than 5 Å (the film thickness ratio is preferably larger than 0 but not larger than 0.36). As a result, a value of the unidirectional exchange bias magnetic field (Hex*) larger than 63 kA/m can be obtained.

As with FIG. 23, a numerical value put in ( ) located under an absolute value of the film thickness of the CoFeCr alloy in FIG. 25 means a film thickness ratio, i.e., a ratio of the film thickness of the CoFeCr alloy to the total film thickness of the first magnetic layer.

As shown in FIG. 25, when the film thickness of the CoFeCr alloy exceeds 5 Å, a reduction of the unidirectional exchange bias magnetic field (Hex*) appears significantly. It is thought that such a reduction of Hex* makes unstable the magnetization of the free magnetic layer and hence lowers the resistance change rate as shown in FIG. 23.

From the experimental results described above, in the present invention, a preferable range of the film thickness is set as follows.

In the present invention, the film thickness ratio of the magnetic layer made of the CoFeCr alloy to the first magnetic layer (i.e., the film thickness of the CoFeCr alloy/the film thickness of the first magnetic layer) is preferably larger than 0 but not larger than 0.61. With this feature, the resistance change rate can be increased from that obtained with the related art, and the unidirectional exchange bias magnetic field (Hex*) can also be increased to 53 kA/m or greater.

Alternatively, in the present invention, the film thickness ratio of (film thickness of the magnetic layer formed of the CoFeCr alloy/film thickness of the first magnetic layer) is preferably larger than 0 but not larger than 0.36. With this feature, the unidirectional exchange bias magnetic field (Hex*) can be increased from that (about 63 kA/m) obtained with the related art. Further, the resistance change rate (ΔR/R) can also be increased from that obtained with the related art.

Alternatively, in the present invention, the film thickness ratio of (film thickness of the magnetic layer formed of the CoFeCr alloy/film thickness of the first magnetic layer) is preferably not smaller than 0.26 but not larger than 0.82. With this feature, the resistance change rate of not smaller than 10.27% can be obtained and the sheet resistance change (ΔRs) can be increased from that obtained with the related art.

Alternatively, in the present invention, the film thickness ratio of (film thickness of the magnetic layer formed of the CoFeCr alloy/film thickness of the first magnetic layer) is preferably larger than not smaller than 0.12 but not larger than 0.61. With this feature, the resistance change rate (ΔR/R) can be increased from that obtained with the related art, the sheet resistance change (ΔRs) can be increased to 1.467 Ω/□ or greater, and the unidirectional exchange bias magnetic field (Hex*) can be increased to 53 kA/m or greater.

Alternatively, in the present invention, the film thickness ratio of (film thickness of the magnetic layer formed of the CoFeCr alloy/film thickness of the first magnetic layer) is preferably not smaller than 0.26 but not larger than 0.61. With this feature, the resistance change rate of not smaller than 10.27% can be obtained and the unidirectional exchange bias magnetic field (Hex*) can be increased to 53 kA/m or greater.

Alternatively, in the present invention, the film thickness ratio of (film thickness of the magnetic layer formed of the CoFeCr alloy/film thickness of the first magnetic layer) is preferably not smaller than 0.26 but not larger than 0.36. With this feature, the resistance change rate of not smaller than 10.27% can be obtained and the unidirectional exchange bias magnetic field (Hex*) can be increased from that (about 63 kA/m) obtained with the related art.

Although Cr is selected as the element X in the above experiments, substantially the same results as the above-described experimental results are also obtained in the case selecting, as the element X, any of elements of the IVA to VIA groups, i.e., Ti, V, Zr, Nb, Mo, Hf, Ta and W, which have chemical properties close to those of Cr.

Further, substantially the same results as the above-described experimental results are also obtained when the CoFeNiX alloy containing the element X is used instead.

In the magnetic sensor according to the present invention, as described above in detail, the free magnetic layer is of a multilayered ferri-structure comprising a second magnetic layer formed in contact with the interface between the free magnetic layer and the nonmagnetic material layer, and the first magnetic layer formed in an opposing relation to the second magnetic layer with the nonmagnetic intermediate layer interposed therebetween. The first magnetic layer includes an area which contains an element X (X represents at least one element selected from among Cr, Ti, V, Zr, Nb, Mo, Hf, Ta and W) and which is present in position toward a side of the nonmagnetic intermediate layer from the side near the opposite surface of the first magnetic layer away from the interface between the first magnetic layer and the nonmagnetic intermediate layer, and an area which is partly located in a region from the interface between the first magnetic layer and the nonmagnetic intermediate layer toward the opposite surface of the first magnetic layer and which does not contain the element X.

Stated otherwise, in the present invention, the first magnetic layer of the free magnetic layer having the multilayered ferri-structure includes the area containing the element X on the side nearer to the opposite surface of the first magnetic layer away from the interface between the first magnetic layer and the nonmagnetic intermediate layer, and the area not containing the element X on the side nearer to the nonmagnetic intermediate layer.

The magnetic area containing the element X has a higher specific resistance than the magnetic area not containing the element X.

Thus, according to the present invention, since the area containing the element X and having a high specific resistance is present in the first magnetic layer, the loss of the sensing current shunted to the first magnetic layer can be reduced in comparison with the case forming the first magnetic layer of only a magnetic material not containing the element X.

Further, according to the present invention, the element X is contained not over the entire area of the first magnetic layer and the area not containing the element X is present on the side nearer to the interface between the first magnetic layer and the nonmagnetic intermediate layer. The presence of the area not containing the element X increases the coupling magnetic field based on the RKKY interaction generated between the first magnetic layer and the second magnetic layer.

Consequently, according to the present invention, the resistance change rate (ΔR/R) of the magnetic sensor can be increased in comparison with that obtained with the related art. In addition, it is possible to increase the coupling magnetic field based on the RKKY interaction generated between the first magnetic layer and the second magnetic layer both constituting the first magnetic layer, to satisfactorily control magnetization of the free magnetic layer, and to manufacture a magnetic sensor having superior reproduction characteristics.

What is claimed is:

1. A magnetic sensor including a laminate comprising an antiferromagnetic layer, a pinned magnetic layer formed in contact with said antiferromagnetic layer, and a free magnetic layer formed in an opposing relation to said pinned magnetic layer with a nonmagnetic material layer interposed between said free magnetic layer and said pinned magnetic layer, said free magnetic layer being of a multilayered ferri-structure comprising a second magnetic layer formed in contact with an interface between said free magnetic layer and said nonmagnetic material layer, and a first magnetic layer formed in an opposing relation to said second magnetic layer with a nonmagnetic intermediate layer interposed therebetween, said first magnetic layer including an area which contains an element X wherein X represents at least one element selected from among Cr, Ti, V, Zr, Nb, Mo, Hf, Ta and W and which is present in position toward a side of said nonmagnetic intermediate layer from a side near a surface of said first magnetic layer away from an interface between said first magnetic layer and said nonmagnetic intermediate layer, and an area which is partly located in a region from the interface between said first magnetic layer and said nonmagnetic intermediate layer toward the surface of said first magnetic layer away from the interface and which does not contain the element X.

2. A magnetic sensor according to claim 1, wherein said first magnetic layer is formed primarily of a CoFe alloy, said area containing the element X is formed of a CoFeX alloy, and said area not containing the element X is formed of a CoFe alloy.

3. A magnetic sensor according to claim 1, wherein said first magnetic layer is formed primarily of a CoFeNi alloy, said area containing the element X is formed of a CoFeNiX alloy, and said area not containing the element X is formed of a CoFeNi alloy.

4. A magnetic sensor including a laminate comprising an antiferromagnetic layer, a pinned magnetic layer formed in contact with said antiferromagnetic layer, and a free magnetic layer formed in an opposing relation to said pinned magnetic layer with a nonmagnetic material layer interposed between said free magnetic layer and said pinned magnetic layer, said free magnetic layer being of a multilayered ferristructure comprising a second magnetic layer formed in contact with an interface between said free magnetic layer and said nonmagnetic material layer, and a first magnetic layer formed in an opposing relation to said second magnetic layer with a nonmagnetic intermediate layer interposed therebetween, said first magnetic layer containing an element X wherein X represents at least one element selected from among Cr, Ti, V, Zr, Nb, Mo, Hf, Ta and W, a content of the element X being larger on a side near an a surface of said first magnetic layer away from an interface between said first magnetic layer and said nonmagnetic intermediate layer than on a side near the interface between said first magnetic layer and said nonmagnetic intermediate layer.

5. A magnetic sensor according to claim 4, wherein said first magnetic layer is formed of a magnetic material made of a CoFe alloy and containing the element X.

6. A magnetic sensor according to claim 4, wherein said first magnetic layer is formed of a magnetic material made of a CoFeNi alloy and containing the element X.

7. A magnetic sensor according to claim 4, wherein the content of the element X on the side near the surface of said first magnetic layer away from the interface between said first magnetic layer and said nonmagnetic intermediate layer is not smaller than 3 at % but not larger than 15at %.

8. A magnetic sensor according to claim 1, wherein said first magnetic layer includes an area in which a content of the element X gradually decreases toward the interface between said first magnetic layer and said nonmagnetic intermediate layer from the side near the surface of said first magnetic layer away from the interface between said first magnetic layer and said nonmagnetic intermediate layer.

9. A magnetic sensor including a laminate comprising an antiferromagnetic layer, a pinned magnetic layer formed in contact with said antiferromagnetic layer, and a free magnetic layer formed in an opposing relation to said pinned magnetic layer with a nonmagnetic material layer interposed between said free magnetic layer and said pinned magnetic layer, said free magnetic layer being of a multilayered ferristructure comprising a second magnetic layer formed in contact with an interface between said free magnetic layer and said nonmagnetic material layer, and a first magnetic layer formed in an opposing relation to said second magnetic layer with a nonmagnetic intermediate layer interposed therebetween, said first magnetic layer being made up of at least two magnetic layers, one of said two magnetic layers, which is positioned on a side near a surface of said first magnetic layer away from an interface between said first magnetic layer and said nonmagnetic intermediate layer, being formed of a magnetic material containing an element X wherein X represents at least one element selected from among Cr, Ti, V, Zr, Nb, Mo, Hf, Ta and W, the other of said two magnetic layers, which is positioned on a side contacting the interface between said first magnetic layer and said nonmagnetic intermediate layer, being formed of a magnetic material not containing the element X.

10. A magnetic sensor according to claim 9, wherein, of said two magnetic layers, the one positioned on the side near the surface of said first magnetic layer away from the interface between said first magnetic layer and said nonmagnetic intermediate layer is formed of a CoFeX alloy, and the other positioned on the side contacting the interface between said first magnetic layer and said nonmagnetic intermediate layer is formed of a CoFe alloy.

11. A magnetic sensor according to claim 9, wherein, of said two magnetic layers, the one positioned on the side near the surface of said first magnetic layer away from the interface between said first magnetic layer and said nonmagnetic intermediate layer is formed of a CoFeNiX alloy, and the other positioned on the side contacting the interface between said first magnetic layer and said nonmagnetic intermediate layer is formed of a CoFeNi alloy.

12. A magnetic sensor according to claim 2, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.61.

13. A magnetic sensor according to claim 2, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.36.

14. A magnetic sensor according to claim 2, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.82.

15. A magnetic sensor according to claim 2, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.12 but not larger than 0.61.

16. A magnetic sensor according to claim 2, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.61.

17. A magnetic sensor according to claim 2, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.36.

18. A magnetic sensor according to claim 1, wherein a composition ratio of the element X is not smaller than 3 at % but not larger than 15 at %.

19. A magnetic sensor according to claim 2, wherein the CoFe and CoFeX alloys contain $Co_Y Fe_{100-Y}$ and an atomic percentage Y of $Co_Y$ and $Fe_{100-Y}$ is not smaller than 85% but not larger than 96%.

20. A magnetic sensor according to claim 3, wherein a composition ratio of Ni is not smaller than 0.5 at % but not larger than 5 at %.

21. A magnetic sensor according to claim 1, wherein second antiferromagnetic layers are disposed on the side near the surface of said first magnetic layer away from the interface between said first magnetic layer and said nonmagnetic intermediate layer with a predetermined spacing left between said second antiferromagnetic layers in a track-width direction.

22. A magnetic sensor according to claim 1, wherein bias layers are disposed on both sides of said free magnetic layer in a track-width direction.

23. A magnetic sensor according to claim 21, wherein an electrode layer is disposed on a side near a surface of each of said second antiferromagnetic layers away from an interface between said second antiferromagnetic layer and said first magnetic layer, and an electrical current flows in a direction parallel to a film surface of each layer of said laminate.

24. A magnetic sensor according to claim 22, wherein electrode layers are disposed on said bias layers and an electrical current flows in a direction parallel to a film surface of each layer of said laminate.

25. A magnetic sensor according to claim 1, wherein electrode layers are disposed on and under said magnetic sensor, and an electrical current flows in a direction perpendicular to a film surface of each layer of said laminate.

26. A magnetic sensor according to claim 25, wherein said upper electrode layer disposed on said laminate is an upper shield layer formed of a magnetic material.

27. A magnetic sensor according to claim 25, wherein said free magnetic layer is formed on an upper side of said antiferromagnetic layer and second antiferromagnetic layers are disposed on said first magnetic layer constituting said free magnetic layer with a predetermined spacing left between said second antiferromagnetic layers in a track-width direction;
first insulating layers are disposed on said second antiferromagnetic layers and second insulating layers are disposed on inner end surfaces of both said second antiferromagnetic layers and said first insulating layers; and
said upper electrode layer is formed to cover said first insulating layers and said second insulating layers and to fill the spacing left between said second antiferromagnetic layers.

28. A magnetic sensor according to claim 27, wherein said first insulating layers and said second insulating layers are formed separately from each other.

29. A magnetic sensor according to claim 25, wherein said lower electrode layer disposed under said laminate is a lower shield layer formed of a magnetic material.

30. A magnetic sensor according to claim 25, wherein said free magnetic layer is formed on an upper side of said antiferromagnetic layer and second antiferromagnetic layers are disposed on said first magnetic layer constituting said free magnetic layer with a predetermined spacing left between said second antiferromagnetic layers in a track-width direction; and
a projection projecting in a multilayered direction of said laminate is formed at a center of said lower electrode layer in the track-width direction, said projection having an upper surface contacting a lower surface of said laminate, and insulating layers are disposed between both end portions of said lower electrode layer in the track-width direction and said laminate.

31. A magnetic sensor according to claim 30, wherein the upper surface of said projection and upper surfaces of said insulating layers disposed on both the end portions of said lower electrode layer are flush with each other.

32. A magnetic sensor according to claim 1, wherein said nonmagnetic material layer is formed of a nonmagnetic electrically conductive material.

33. A magnetic sensor according to claim 25, wherein said nonmagnetic material layer is formed of an insulating material.

34. A magnetic sensor according to claim 3, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.61.

35. A magnetic sensor according to claim 3, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.36.

36. A magnetic sensor according to claim 3, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.82.

37. A magnetic sensor according to claim 3, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.12 but not larger than 0.61.

38. A magnetic sensor according to claim 3, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.61.

39. A magnetic sensor according to claim 3, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.36.

40. A magnetic sensor according to claim 3, wherein a composition ratio of the element X is not smaller than 3 at % but not larger than 15 at %.

41. A magnetic sensor according to claim 3, wherein the CoFe and CoFeX alloys contain $Co_Y Fe_{100-Y}$ and an atomic percentage Y of $Co_Y$ and $Fe_{100-Y}$ is not smaller than 85% but not larger than 96%.

42. A magnetic sensor according to claim 6, wherein a composition ratio of Ni is not smaller than 0.5 at % but not larger than 5 at %.

43. A magnetic sensor according to claim 10, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.61.

44. A magnetic sensor according to claim 10, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.36.

45. A magnetic sensor according to claim 10, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.82.

46. A magnetic sensor according to claim 10, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.12 but not larger than 0.61.

47. A magnetic sensor according to claim 10, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.61.

48. A magnetic sensor according to claim 10, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.36.

49. A magnetic sensor according to claim 10, wherein a composition ratio of the element X is not smaller than 3 at % but not larger than 15 at %.

50. A magnetic sensor according to claim 10, wherein the CoFe and CoFeX alloys contain $Co_Y Fe_{100-Y}$ and an atomic percentage Y of $Co_Y$ and $Fe_{100-Y}$ is not smaller than 85% but not larger than 96%.

51. A magnetic sensor according to claim 12, wherein a composition ratio of Ni is not smaller than 0.5 at % but not larger than 5 at %.

52. A magnetic sensor according to claim 11, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.61.

53. A magnetic sensor according to claim 11, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is larger than 0 but not larger than 0.36.

54. A magnetic sensor according to claim 11, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.82.

55. A magnetic sensor according to claim 11, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.12 but not larger than 0.61.

56. A magnetic sensor according to claim 11, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.61.

57. A magnetic sensor according to claim 11, wherein when said area containing the element X is formed of a CoFeX alloy or a CoFeNiX alloy and said area not containing the element X is formed of a CoFe alloy or a CoFeNi alloy, a film thickness ratio of (film thickness of the CoFeX alloy/film thickness of said first magnetic layer) or of (film thickness of the CoFeNiX alloy/film thickness of said first magnetic layer) is not smaller than 0.26 but not larger than 0.36.

58. A magnetic sensor according to claim 11, wherein a composition ratio of the element X is not smaller than 3 at % but not larger than 15 at %.

59. A magnetic sensor according to claim 11, wherein the CoFe and CoFeX alloys contain $Co_Y Fe_{100-Y}$ and an atomic percentage Y of $Co_Y$ and $Fe_{100-Y}$ is not smaller than 85% but not larger than 96%.

60. A magnetic sensor according to claim 11, wherein a composition ratio of Ni is not smaller than 0.5 at % but not larger than 5 at %.

61. A magnetic sensor according to claim 5, wherein the CoFe and CoFeX alloys contain $Co_Y Fe_{100-Y}$ and an atomic percentage Y of $Co_Y$ and $Fe_{100-Y}$ is not smaller than 85% but not larger than 96%.

62. A magnetic sensor according to claim 6, wherein the CoFe and CoFeX alloys contain $Co_Y Fe_{100-Y}$ and an atomic percentage Y of $Co_Y$ and $Fe_{100-Y}$ is not smaller than 85% but not larger than 96%.

* * * * *

UNITED STATES PATENT AND TRADEMARK OFFICE
CERTIFICATE OF CORRECTION

PATENT NO. : 6,831,817 B2
DATED : December 14, 2004
INVENTOR(S) : Naoya Hasegawa et al.

It is certified that error appears in the above-identified patent and that said Letters Patent is hereby corrected as shown below:

Column 59,
Line 43, after "but not larger than" delete "15at %" and substitute
-- 15 at % -- in its place.

Signed and Sealed this

Thirty-first Day of May, 2005

JON W. DUDAS
*Director of the United States Patent and Trademark Office*